(12) United States Patent
van Raay

(10) Patent No.: US 10,530,316 B2
(45) Date of Patent: Jan. 7, 2020

(54) MATRIX POWER AMPLIFIER

(71) Applicant: Fraunhofer-Gesellschaft Zur Förderung Der Angewandten Forschung E.V., Munich (DE)

(72) Inventor: Friedbert van Raay, Freiburg (DE)

(73) Assignee: Fraunhofer-Gesellschaft Zur Förderung Der Angewandten Forschung E.V., Munich (DE)

( * ) Notice: Subject to any disclaimer, the term of this patent is extended or adjusted under 35 U.S.C. 154(b) by 0 days.

(21) Appl. No.: 16/428,918

(22) Filed: May 31, 2019

(65) Prior Publication Data

US 2019/0288651 A1  Sep. 19, 2019

Related U.S. Application Data

(63) Continuation of application No. 15/809,502, filed on Nov. 10, 2017, now Pat. No. 10,355,652, which is a
(Continued)

(51) Int. Cl.
*H03F 1/06* (2006.01)
*H03F 3/21* (2006.01)
(Continued)

(52) U.S. Cl.
CPC .............. *H03F 3/211* (2013.01); *H03F 1/523* (2013.01); *H03F 1/56* (2013.01); *H03F 1/565* (2013.01); *H03F 3/195* (2013.01); *H03F 3/245* (2013.01); *H03F 3/423* (2013.01); *H03F 3/45183* (2013.01); *H03F 3/45475* (2013.01); *H03F 3/604* (2013.01); *H03F 3/607* (2013.01); *H01Q 23/00* (2013.01); *H03F 2200/06* (2013.01); *H03F 2200/108* (2013.01); *H03F 2200/135* (2013.01); *H03F 2200/181* (2013.01); *H03F 2200/222* (2013.01); *H03F 2200/255* (2013.01);
(Continued)

(58) Field of Classification Search
CPC .................................. H03F 1/06; H03F 1/0288
USPC ............................................. 330/295, 124 R
See application file for complete search history.

(56) References Cited

U.S. PATENT DOCUMENTS 4,079,336 A   3/1978   Gross
4,498,106 A   2/1985   Sato
(Continued)

FOREIGN PATENT DOCUMENTS

DE   69318253   11/1998
FR   2727003   5/1996
(Continued)

OTHER PUBLICATIONS

Russian office action in Russian Application No. 2018131251, dated Jul. 10, 2019, 14 pages.
(Continued)

*Primary Examiner* — Henry Choe
(74) *Attorney, Agent, or Firm* — Fish & Richardson P.C.

(57) ABSTRACT

A power amplifier includes a two-dimensional matrix of N×M active cells formed by stacking main terminals of multiple active cells in series. The stacks are coupled in parallel to form the two-dimensional matrix. The power amplifier includes a driver structure to coordinate the driving of the active cells so that the effective output power of the two-dimensional matrix is approximately N×M the output power of each of the active cells.

28 Claims, 30 Drawing Sheets

Related U.S. Application Data continuation of application No. PCT/EP2016/052386, filed on Feb. 4, 2016.

(51) Int. Cl.
  *H03F 1/56* (2006.01)
  *H03F 3/195* (2006.01)
  *H03F 3/24* (2006.01)
  *H03F 3/42* (2006.01)
  *H03F 3/45* (2006.01)
  *H03F 3/60* (2006.01)
  *H03F 1/52* (2006.01)
  *H01Q 23/00* (2006.01)

(52) U.S. Cl.
  CPC .. *H03F 2200/297* (2013.01); *H03F 2200/301* (2013.01); *H03F 2200/315* (2013.01); *H03F 2200/318* (2013.01); *H03F 2200/387* (2013.01); *H03F 2200/42* (2013.01); *H03F 2200/423* (2013.01); *H03F 2200/451* (2013.01); *H03F 2200/48* (2013.01); *H03F 2200/498* (2013.01); *H03F 2200/75* (2013.01); *H03F 2203/45138* (2013.01); *H03F 2203/45148* (2013.01); *H03F 2203/45151* (2013.01); *H03F 2203/45156* (2013.01); *H03F 2203/45166* (2013.01); *H03F 2203/45202* (2013.01); *H03F 2203/45208* (2013.01); *H03F 2203/45224* (2013.01); *H03F 2203/45258* (2013.01); *H03F 2203/45338* (2013.01); *H03F 2203/45458* (2013.01); *H03F 2203/45488* (2013.01); *H03F 2203/45496* (2013.01); *H03F 2203/45528* (2013.01); *H03F 2203/45544* (2013.01); *H03F 2203/45594* (2013.01); *H03F 2203/45631* (2013.01); *H03F 2203/45696* (2013.01); *H03F 2203/45702* (2013.01)

(56) References Cited

U.S. PATENT DOCUMENTS

| | | | |
|---|---|---|---|
| 4,752,746 A | 6/1988 | Niclas | |
| 5,021,743 A | 6/1991 | Chu et al. | |
| 5,386,130 A | 1/1995 | Gamand et al. | |
| 5,485,118 A | 1/1996 | Chick | |
| 5,550,770 A | 8/1996 | Kuroda | |
| 5,867,061 A | 2/1999 | Rabjohn et al. | |
| 6,137,367 A | 10/2000 | Ezzedine et al. | |
| 6,472,941 B2* | 10/2002 | Shigematsu | H03F 1/086 330/286 |
| 6,724,252 B2 | 4/2004 | Ngo et al. | |
| 6,864,750 B2 | 3/2005 | Shigematsu | |
| 7,511,575 B2 | 3/2009 | Gotou | |
| 7,551,036 B2 | 6/2009 | Berroth et al. | |
| 7,589,593 B2* | 9/2009 | Lai | H03F 1/223 330/295 |
| 7,956,840 B2 | 6/2011 | Ishii | |
| 8,102,213 B2* | 1/2012 | Tasic | H03F 1/223 330/283 |
| 8,242,847 B1* | 8/2012 | Leong | H03F 1/223 330/149 |
| 8,558,619 B2 | 10/2013 | Mohammadi et al. | |
| 8,823,455 B2 | 9/2014 | Kobayashi | |
| 9,035,697 B2* | 5/2015 | Youssef | H03F 3/68 330/311 |
| 9,054,676 B2 | 6/2015 | Vickes | |
| 2008/0265997 A1 | 10/2008 | Berroth et al. | |
| 2009/0018969 A1 | 1/2009 | Ayres et al. | |
| 2013/0049867 A1 | 2/2013 | Pinarello et al. | |
| 2013/0307626 A1 | 11/2013 | Mohammadi et al. | |
| 2014/0266460 A1 | 9/2014 | Nobbe et al. | |
| 2015/0097746 A1 | 4/2015 | Wilson et al. | |
| 2017/0026961 A1 | 1/2017 | Hahn, III et al. | |

FOREIGN PATENT DOCUMENTS

| | | |
|---|---|---|
| JP | S54-075978 | 6/1979 |
| JP | H03-188705 | 8/1991 |
| JP | H07-131264 | 5/1995 |
| JP | 2002-314353 | 10/2002 |
| JP | 2003-516690 | 5/2003 |
| JP | 2014-220770 | 11/2014 |
| JP | 2015-170957 | 9/2015 |
| RU | 2275698 | 1/2006 |
| RU | 125001 | 2/2013 |
| WO | WO 2017/133776 | 8/2017 |

OTHER PUBLICATIONS

[No Author], "CGHV1F006S 6 W, DC—18 GHz, 40V, GaN HEMT," CREE, 2013, 20 pages.

[No Author], "CGHV1F025S 25 W, DC—15 GHz, 40V, GaN HEMT," CREE, 2014, 9 pages.

[No Author], "CGHV1J070D 70 W, 18.0 GHz, GaN HEMT Die," CREE, 2011-2012, 9 pages.

[No Author], "CMPA0060025D 25 W, 20 MHz—6.0 GHz, GaN MMIC, Power Amplifier," CREE, 2009-2010, 7 pages.

Agah et al., "Multi-Drive Stacked-FET Power Amplifiers at 90 GHz in 45-nm SOI CMOS", IEEE Journal of Solid-State Circuits, May 2014, 49: 10 pages.

Amado-Rey et al., "Analysis and Development of Submillimeter-Wave Stacked-FET Power Amplifier MMICs in 35-nm mHEMT Technology," IEEE Transactions on Terahertz Science and Technology, May 2018, 8: 357-364.

Asbeck et al., "CMOS Mm-Wave Power Amplifiers for 5G," 41 pages.

Babchenko et al., "Schottky contact metallization stability on AlGaN/GaN heterostructure during the diamond deposition process," The 11th International conference on Advanced Semiconductor Devices and Microsystems, Smolenice, Slovenia, Nov. 2016, 157-160.

Berrached et al., "Wideband High Efficiency High Pwer GaN Amplifiers Using MIC and Quasi-MMIC Technologies," Proceeding of the 8th European Microwave Integrated Circuits Conference, Oct. 2013, Nuremberg, Germany, 424-427.

Bhat and Krishnaswamy, "Recent Advances in the Design of Efficient-yet-Linear Watt-class mmWave CMOS Pas," 2014 IEEE International Microwave and RF Conference, Bangalore, India, 2014, 53-56.

Bhat et al., "Large-Scale Power Combining and Mixed-Signal Linearizing Architectures for Watt-Class mmWave CMOS Power Amplifiers," IEEE Transactions on Microwave Theory and Techniques, Feb. 2015, 703-718.

Bhat et al., "Large-Scale Power-Combining and Linearization in Watt-Class mmWave CMOS Power Amplifiers" 2013 IEEE Radio Frequency Integrated Circuits Symposium, 2013, Seattle, WA, 283-286.

Bhat et al., "Recent Advances in the Design of Efficient-yet-Linear Watt-class mmWave CMOS Pas," 2014 IEEE International Microwave and RF Conference (IMaRC), 2014, 53-56.

Carrubba et al., "Realization of a 30-W highly efficient and linear reconfigurable dual-band power amplifier using the continuous mode Approach," International Journal of Microwave and Wireless Technologies, 2013, 1-14.

Chakrabarti and Krishnaswamy, "Design Considerations for Stacked Class-E-like mmWave High-Speed Power DACs in CMOS", IEEE, 2013, 4 pages.

Chakrabarti and Krishnaswamy, "High-Power High-Efficiency Class-E-Like Stacked mmWave PAs in SOI and Bulk CMOS: Theory and Implementation," IEEE Transactions on Microwave Theory and Techniques, Aug. 2014, 62: 1686-1703.

Chakrabarti et al., "Dual-Output Stacked Class-EE Power Amplifiers in 45nm SOI CMOS for Q-band Applications," 2012 IEEE Compound Semiconductor Integrated Circuit Symposium, 2012, La Jolla, CA, 4 pages.

Chen et al., "A Broadband Stacked Power Amplifier in 45-nm CMOS SOI Technology," IEEE Journal of Solid-State Circuits, Nov. 2013, 48: 2775-2784.

(56) References Cited

OTHER PUBLICATIONS

Chou et al., "A 60-GHz 20.6-dBm Symmetric Radial-Combining Wideband Power Amplifier with 20.3% Peak PAE and 20-dB Gain in 90-nm CMOS," 2016 IEEE MTT-S International Microwave Symposium, 2016, San Francisco, CA, 3 pages.

Dabag et al., "Analysis and Design of Stacked-FET Millimeter-Wave Power Amplifiers," IEEE Transactions on Microwave Theory and Techniques, Apr. 2013, 61: 1543-1556.

Figur et al., "RF MEMS Variable Matching Networks for Multi-Band and Multi-Mode GaN Power Amplifiers," Proceedings of the 8th European Microwave Integrated Circuits Conference, Oct. 2013, Nuremberg, Germany, 324-327.

Figur et al., "RF-MEMS multi-mode-matching networks for GaN power transistors," International Journal of Microwave and Wireless Technologies, 2014, 6: 447-458.

Figur et al., "RF-MEMS variable matching networks and switches for multi-band and multi-mode GaN power amplifiers," International Journal of Microwave and Wireless Technologies, 2014, 6: 265-276.

Fraysse et al., "A 20W Ka-band Radial Solid-State Power Amplifier with 20% Associated Power-Added Efficiency," Proceeding of the 43rd European Microwave Conference, Oct. 2013, Nuremberg, Germany, 688-691.

Gao et al., "A 1-17 GHz Stacked Distributed Power Amplifier with 19-21 dBm Saturated Output Power in 45nm CMOS SOI Technology," 2018 IEEE/MTT-S International Microwave Symposium, 2018, Philadelphia, PA, 3 pages.

Griffith et al., "A 23.2dBm at 210GHz to 21.0dBm at 235GHz 16-way PA-cell combined InP HBT SSPA MMIC," 2014 CSIC Conf. Digest, 2014, 4 pages.

Griffith et al., "A 23.2dBm at 210GHz to 21.0dBm at 235GHz 16-way PA-cell combined InP HBT SSPA MMIC," 2014 IEEE Compound Semiconductor Integrated Circuit Symposium, 2014, La Jolla, CA, 4 pages.

Helmi and Mohammadi, "A Highly Efficient mm-Wave CMOS SOI Power Amplifier," 2016 IEEE MTT-S International Microwave Symposium, San Francisco, CA, 2016, 3 pages.

Helmi et al., "A Stacked Cascode CMOS SOI Power Amplifier for mm-Wave Applications," 2014 IEEE MTT-S International Microwave Symposium, 2014, Tampa, FL, 3 pages.

International Preliminary Report on Patentability in International Application No. PCT/EP2016/052386, dated Aug. 16, 2018, 15 pages.

International Search Report and Written Opinion in International Application No. PCT/EP2016/052386, dated Nov. 2, 2016, 20 pages.

Kappeler et al., "An AlGaN/GaN Push-Pull HEMT Amplifier with 400 MHz Bandwidth and 100 W Peak Output Power," IEEE InternationalElectron Devices Meeting, Washington, DC, 2005, 2 pages.

Ko and Kwon, "High-Gain Direct-Coupled Matrix Distributed Amplifier Using Active Feedback Topology", 2004 CSIC Conf. Digest, 2004, 309-312.

Ko and Kwon, "High-Gain Direct-Coupled Matrix Distributed Amplifier Using Active Feedback Topology," IEEE CSIC Digest, 2004, 309-312.

Kompa and van Raay, "Error-Corrected Large-Signal Waveform Measurement System Combining Network Analyzer and Sampling 0scilloscope Capabilities," IEEE Transactions on Microwave Theory and Techniques, Apr. 1990, 38: 358-365.

Kompa et al., "Precisely Calibrated Coaxial-t 0-Micros trip Transitions Yield Improved Performance in GaAs FET Characterization," IEEE Transactions on Microwave Theory and Techniques, Jan. 1990, 38: 62-68.

Kühn et al., "Design and realization of GaN RF-devices and circuits from 1 to 30 GHz," International Journal of Microwave and Wireless Technologies, 2010, 2: 115-120.

Kühn et al., "Device and Design Optimization for AlGaN/GaN X-Band-Power-Amplifiers with High Efficiency," Infrared Milli Terahz Waves, 2010, 31: 367-379.

Kühn et al., "Harmonic Termination of AlGaN/GaN/(Al)GaNSingle- and Double-Heterojunction HEMTs," German Microwave Conference, Berlin, Germany, 2010, 122-125.

Lei et al., "Design and Analysis of Stacked Power Amplifier in Series-Input and Series-Output Configuration," IEEE Transactions on Microwave Theory and Techniques, IEEE Service Center, Piscataway, NJ, Dec. 2007, 55: 2802-2812.

Maroldt et al., "QFN-Packaged Highly-Linear Cascode GaN LNA MMIC from 0.5 to 3 GHz," Proceedings of the 43rd European Microwave Conference, Oct. 2013, Nuremberg, Germany, 1399-1402.

McRory et al., "Transformer Coupled Stacked FET Power Amplifiers", IEEE Journal of Solid-State Circuits, Feb. 1999, 34: 157-161.

Merkle et al., "A n-State Time-Domain Measurement Test-Bench for Characterization of Intermodulation Distortion on Device Level," IEEE MTT-S International Microwave Symposium Digest,, 2003, 1643-1646.

Mornonval et al., "A 20W Mulit-Mode MMIC Power Amplifier for Base Station Application," Proceeding of the 8th European Microwave Integrated Circuits Conference, Oct. 2013, 161-164.

Mußer et al., "Individual Source Vias for GaN HEMT Power Bars," Proceedings of the 8th European Microwave Integrated Circuits Conference, Oct. 2013, Nuremberg, Germany, 184-187.

Mußer et al., Analysis of GaN HEMTs for Broadband High-Power Amplifier Design, Proceedings of the 6th European Microwave Integrated Circuits Conference, Manchester, UK, Oct. 2011, 128-131.

Prcis et al., "Bandwith versus Efficiency Performance using Power Combining in GaN HEMT Power Amplifiers," Proceeding of the 43rd European Microwave Conference, Nuremberg, Germany, Oct. 2013, 696-699.

Quay et al., "AlGaN/GaN HEMTs on Sic operating at 40 GHz," Digest. International Electron Devices Meeting, San Francisco, CA, 2002, 673-676.

Quay et al., "Efficient AlGaN/GaN HEMT Power Amplifiers," Proceedings of the 3rd European Microwave Integrated Circuits Conference, Amsterdam, Netherlands, Oct. 2008, 87-90.

Reed et al., "A 180mW InP HBT Power Amplifier MMIC at 214 GHz," 2013 IEEE Compound Semiconductor Integrated Circuit Symposium, Monterey, CA, Oct. 2013, 22 pages.

Sarkas et al., "A 45nm SOI CMOS Class-D mm-Wave PA with >10Vpp Differential Swing," 2012 IEEE International Solid-State Circuits Conference, San Francisco, CA, 2012, 88-89.

Schmale et al., Dispersive table-based large-signal FET model validated in analysis of MMIC frequency doubler, 26th EuMC, Prague, Czech Republic, Sep. 1996, 260-263.

Schmid et al., "Ultra-Wideband GaN MMIC Chip Set and High Power Amplifier Module for Multi-Function Defense AESA Applications," IEEE Transactions on Microwave Theory and Techniques, Aug. 2013, 61: 3043-3051.

Schuberth et al., "Load Pull Characterization of GaN/AlGaN HEMTs," 2006 International Workshop on Integrated Nonlinear Microwave and Millimeter-Wave Circuits, Aveiro, Portugal, 2006, 180-182.

Schuh et al., "X-band T/R-module front-end based on GaN MMICs," International Journal of Microwave and Wireless Technologies, 2009, 1: 387-394.

Seelmann-Eggebert et al., "A Systematic State—Space Approach to Large-Signal Transistor Modeling," IEEE Transactions on Microwave Theory and Techniques, Feb. 2007, 55: 195-206.

Van Heijningen, "Design and Analysis of a 34 dBm Ka-Band GaN High Power Amplifier MMIC," Proceedings of the 1st European Microwave Integrated Circuits Conference, Manchester, UK, Sep. 2006, 75-78.

Van Raay and Kompa, "A 2-40 GHx PHEMT MMIC Active Balun Frequency Doubler," 29th European Microwave Conference, Munich, Germany, 1999, 349-352.

Van Raay and Kompa, "A 40GHz large-signal double-reflectometer waveform measurement system designed for load-pull applications," 26th EuMC, Prague, Czech Republic, Sep. 1996, 5 pages.

Van Raay and Kompa, "A New Active Balun Reflectometer Concept for Dc to Microwave VNA Applications," 28th European Microwave Conference, Amsterdam, Netherlands, 1998, 108-113.

(56) References Cited

OTHER PUBLICATIONS

Van Raay and Kompa, "A New On-Wafer Large-Signal Waveform Measurement System with 40 GHz Harmonic Bandwidth," 1992 IEEE MTT-S Microwave Symposium Digest, 1992, 1435-1438.
Van Raay and Kompa, "Design and Stability Test of a 2-40 GHz Frequency Doubler With Active Balun," 2000 IEEE MTT-S International Microwave Symposium Digest, 2000, 1573-1576.
Van Raay and Kompa, "Waveform Measurements—The Load-Pull Aspect," 55th ARFTG Conference Digest, 2000, 8 pages.
Van Raay et al., "A Coplanar X-Band AlGaN/GaN Power Amplifier MMIC on s.i. SiC Substrate," IEEE Microwave and Wireless Components Letters, Jul. 2015, 15: 460-432.
Van Raay et al., "A Microstrip X-Band AlGaN/GaN Power Amplifier MMIC on s.i. SiC Substrate," European Gallium Arsenide and Other Semiconductor Application Symposium, Paris, France, 2005, 4 pages.
Van Raay et al., "Automatic Extraction of Analytical Large-Signal FET Models with Parameter Estimation by Function Decomposition," Proceedings of the 9th European Microwave Integrated Circuits Conference, Rome, Italy, Oct. 2014, 202-205.
Van Raay et al., "Balanced Microstrip AlGaN/GaN HEMT Power Amplifier MMIC for X-Band Applications," Proceedings of the 3rd European Microwave Integrated Circuits Conference, Amsterdam, The Netherlands, Oct. 2008, 95-98.
Van Raay et al., "Broadband Low-Noise GaN HEMT TWAs Using an Active Distributed Drain Bias Circuit," Proceedings of the 10th European Microwave Integrated Circuits Conference, Paris, France, Sep. 2015, 156-159.
Van Raay et al., "Design of Highly-Efficient GaN X-Band-Power-Amplifier MMICs," 2009 IEEE MTT-S International Microwave Symposium Digest, 2009, 661-664.
Van Raay et al., "Dual-Gate HEMT Parameter Extraction Based on 2.5D Multiport Simulation of Passive Structures," Proceedings of the 11th European Microwave Integrated Circuits Conference, Oct. 2016, London, UK, 241-244.
Van Raay et al., "HEMT Large-Signal Integral Transform Model Including Trapping and Impact Ionization," Proceedings of the 12th European Microwave Integrated Circuits Conference, Nuremberg, Germany, Oct. 2017, 200-203.
Van Raay et al., "High Power/High Bandwidth GaN MMICs and Hybrid Amplifiers: Design and Characterization," European Gallium Arsenide and Other Semiconductor Application Symposium, Paris, France , 2005, 4 pages.
Van Raay et al., "Individual Source Vias for GaN HEMT Power Bars," Proceedings of the 8th European Microwave Integrated Circuits Conference, Oct. 2013, Nuremberg, Germany, 184-187.
Van Raay et al., "Integral Transform and State Modeling of 0.1 μm AlGaN/GaN HEMTs for Pulsed-RF and CW Operation," Proceedings of the 8th European Microwave Integrated Circuits Conference, Oct. 2013, Nuremberg, Germany, 288-291.
Van Raay et al., "Large Signal Modeling of AlGaN/GaN HEMTs with Psa>t 4 W/mm at 30 GHz suitable for Broadband Power Applications," IEEE MTT-S International Microwave Symposium Digest, 2003, 451-454.
Van Raay et al., "Low-Frequency Dispersion and State Dependency in Modern Microwave III-V HEMTs," GeMiC 2018, Freiburg, Germany, 2018, 168-171.
Van Raay et al., "New Low-Frequency Dispersion Model for AlGaN/GaN HEMTs Using Integral Transform and State Description," IEEE Transactions on Microwave Theory and Techniques, Jan. 2013, 61: 154-167.
Van Raay et al., "X-Band High-Power Microstrip AlGaN/GaN HEMT Amplifier MMICs," 2006 IEEE MTT-S International Microwave Symposium Digest, 2006, 1368-1371.
Venere, "High-efficiency power amplifier could bring 5G cell phones," May 2016, retrieved from the Internet: http://phys.org/news/2016-05-high-efficiency-power-amplifier-5g-cell.html#jCp. 2 pages.
Waltereit et al., "GaN-based high-frequency devices and circuits: A Fraunhofer perspective," Phys. Status Solidi A, 2012, 209: 491-496.
Wasige et al., "12 GHz Coplanar Quasi-Monolithic Oscillator," 1999 IEEE MTT-S International Microwave Symposium Digest, 1999, 227-228.
Wasige et al., "A new silicon micro-test-fixture facilitates the re-usability of accurately characterized low-power FET devices," 26th EuMC, Prague, Czech Republic, Sep. 1996, 521-523.
Wasige et al., "Air Bridge Based Planar Hybrid Technology for Microwave and Millimeterwave Applications," 1997 IEEE MTT-S International Microwave Symposium Digest , 1997, 375-378.
Wasige et al., "Air Bridge Based Planar Hybrid Technology for Microwave and Millimeterwave Applications," 1997 IEEE MTT-S International Microwave Symposium Digest, 1997, 925-928.
Wasige et al., "GaAs FET Characterization in a Quasi-Monolithic Si Environment," 1999 IEEE MTT-S International Microwave Symposium Digest, 1999, 1889-1892.
Weber et al., "A 92 GHz GaN HEMT Voltage-Controlled Oscillator MMIC," 2014 IEEE MTT-S International Microwave Symposium, Tampa, FL, 2014, 4 pages.
Werthof et al., "Direct Nonlinear FET Parameter Extraction Using Large-Signal Waveform Measurements," IEEE Microwave and Guided Wave Letters, May 1993, 3: 130-132.
Werthof et al., "Direct Nonlinear Power Mesfet Parameter Extraction and Consistent Modeling," 1993 IEEE MTT-S International Microwave Symposium Digest, 1993, 645-648.
Wiegner et al., "AlGaN/GaN-based power amplifiers for mobile radio applications: a review from the system supplier's perspective," International Journal of Microwave and Wireless Technologies, 2010, 2: 95-104.
Wiegner et al., "Multistage Broadband Amplifiers Based on GaN HEMT Technology for 3G/4G Base Station Applications with Extremely High Bandwidth," 2005 European Microwave Conference, Paris, France, 2005, 4 pages.
Zhu and Chen, "Low-pass impedance transformation networks," IEE Proc.-Circuits Devices Syst, Oct. 1997, 144: 284-288.
CL Office Action in Chilean Application No. 201802076, dated Oct. 22, 2019, 8 pages (with English machine translation).
JP Office Action in Japanese Application No. 2018-540132, dated Nov. 12, 2019, 25 pages.

\* cited by examiner

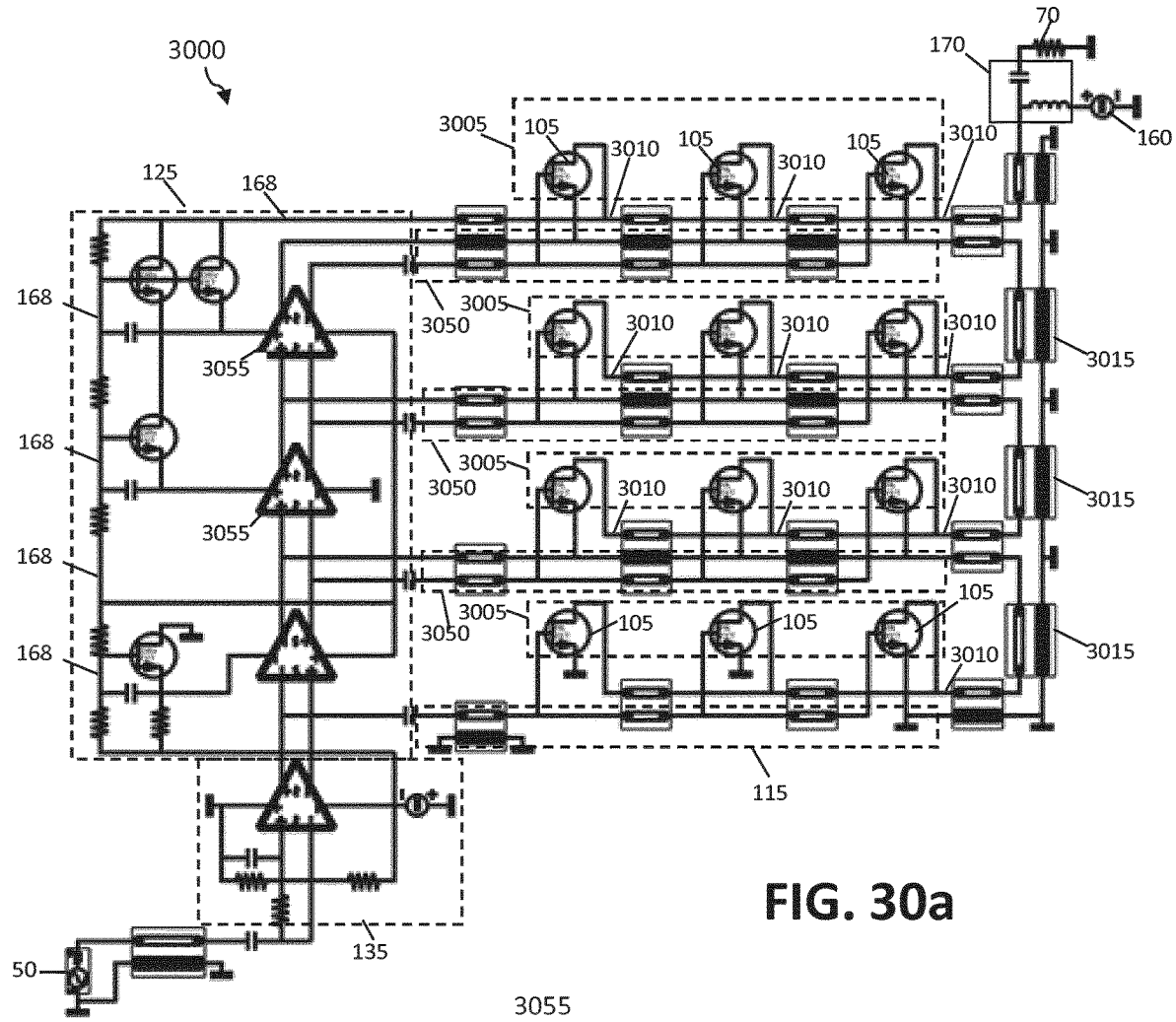
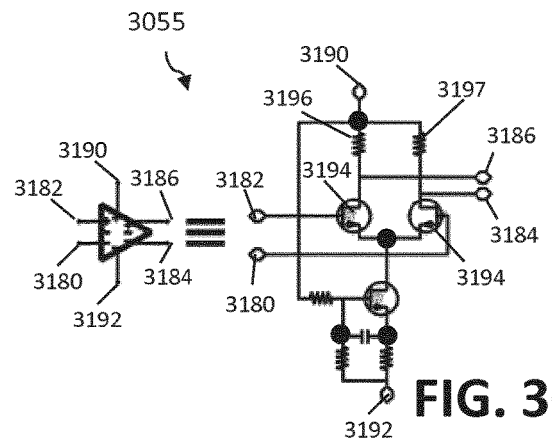
FIG. 30a
FIG. 30b

MATRIX POWER AMPLIFIER

CROSS-REFERENCE TO RELATED APPLICATIONS

This application is a Continuation of U.S. application Ser. No. 15/809,502, filed Nov. 10, 2017, which is a Continuation under 35 U.S.C. § 111(a) of International Application No. PCT/EP2016/052386, filed Feb. 4, 2016. The disclosure of the foregoing applications are hereby incorporated by reference in their entirety.

BACKGROUND

This invention relates to power amplifiers, for example, the power amplifiers that include at least a two-dimensional matrix of transistors and can be tuned to match the impedance of an antenna or other load.

Transistors are devices that can amplify a control signal that is input into a control terminal. Transistors can be made from a variety of different materials, can have a variety of different geometries, and can operate according to a variety of different physical mechanisms. Example materials include silicon, gallium arsenide, gallium nitride, and silicon carbide. These and other materials can be used to form devices such as bipolar transistors and field effect transistors that include either insulated control terminals (e.g., IGBTs, MOSFETs, HEMT's or HFETs) or that include control terminals made from PN junctions (e.g., BJTs or JFETs).

Regardless of the materials and device structures, individual transistors all have fundamental limits on their safe operational ranges. For example, if an excessively large voltage is applied across the main terminals, then dielectric breakdown may occur and the transistor may be damaged or destroyed. As another example, if an excessively large current flows between the main terminals, then the transistor may also be damaged or destroyed.

Although the operational ranges of individual transistors may be suitable for some applications, they may be insufficient to meet the requirements of others. For example, some applications may require voltages in excess of the breakdown voltage or currents in excess of the peak currents of even well-designed transistors. Examples of such applications include driving antennas for the transmission of, e.g., radar signals and communication signals (e.g., for satellite communication and terrestrial broadcasts in both military and civilian contexts).

In such applications, individual transistors can be grouped in order to handle large voltages and/or currents as a group. For example, individual transistors can be stacked (or "series-stacked") so that almost all of the current that flows through the main terminals of the first transistor in the stack also flows through the main terminals of subsequent transistor(s) in the stack. Each of the transistors in the stack supports some portion of the voltage that drives this current. The total voltage supported across the stack of transistors can be in excess of the breakdown voltage of the individual transistors.

As another example, individual transistors can be paralleled so that essentially the same voltage is coupled across the main terminals of multiple transistors. When multiple transistors are conductive, the net current flow through the group can exceed the peak current of the individual constituent transistors.

In idealized small-signal models, power transfer from a signal source to a load can be improved by matching the output impedance of the source (also known as "the source impedance") to the impedance of the load. In such models, the maximum possible power is transferred when the impedance of the load is exactly equal to the complex conjugate of the source impedance over an infinite range of frequencies.

However, in real-world, large-signal applications, the "source impedance" is not properly defined or, strictly speaking, does not exist due to lack of linearity or the missing superposition law. Nevertheless, theory and practice show that a sufficiently large portion of the power is transferred (i.e., the power-added efficiency (PAE) is sufficiently high) for certain values of the load impedance. The term "optimum load impedance" is used herein to characterize the circumstances where a sufficiently large portion of the power is transferred over a range of operational frequencies of interest.

SUMMARY

Power amplifiers that include at least a two-dimensional matrix of active cells are described. The active cells are generally individual transistors. The two-dimensional matrix of transistors is formed by stacks of multiple active cells that are coupled in parallel, hence forming a "two-dimensional matrix." Each stack in the matrix can support a relatively large voltage while conducting a given current. Each stack can thus be considered a source that has its own—relatively large—optimum load impedance. However, since the stacks are coupled in parallel, the two-dimensional matrix has a net impedance that is a fraction of the impedance of the constituent stacks. Thus, the impedance of the matrix as a whole can be tailored to match the impedance of a load and transfer a relatively large portion of the power over a range of operational frequencies of interest.

In more detail, the impedance of an input port ("$Z_{in\_port}$") and an output port ("$Z_{out\_port}$")—and the impedance of the corresponding power distribution and collection rails—of a matrix power amplifier is largely independent of the number of active cells in the amplifier. Instead, $Z_{in\_port}$ and $Z_{out\_port}$ are only dependent upon the ratio of the number of rows N and the number of columns M, as well as the input and output impedance of the individual active cells (i.e., "$Z_{cell\_in}$" and "$Z_{cell\_out}$" respectively). In particular, $$Z_{in\_port} = \frac{N}{M} * Z_{cell\_in} \qquad \text{Equation 1}$$

and $$Z_{out\_port} = \frac{N}{M} * Z_{cell\_out} \qquad \text{Equation 2}$$

In general, $Z_{cell\_in}$ and $Z_{cell\_out}$ are tailorable over a relatively limited range (e.g., by tailoring the active cell device geometry and other properties). However, the ratio of the number of rows to the number of columns (N/M) in a matrix power amplifier is much easier to adjust. Thus, by controlling all of these parameters, matrix power amplifiers of arbitrary input and output port impedances can be achieved.

The bandwidth of a matrix power amplifier is limited only by the bandwidth of the individual cells and the matching of the complex-valued input/output port impedances $Z_{in\_port}$ and $Z_{out\_port}$ to the (real-valued) system impedance $Z_0$. Since the ratio N/M is not constrained to any particular number of active cells (e.g., a 10×10 matrix of 100 active cells has the same N/M ratio as a 4×4 matrix of 16 active cells), the achievable output power is not limited by the number of active cells. Rather, the achievable output power is limited by the real-world considerations described above (including, e.g., residual magnitude and phase errors, finite losses of the power matching networks within the matrix power amplifier). Absent such non-idealities, the theoretical output power would increase in proportion to the matrix size N*M.

The matrix power amplifiers described herein can use active or passive input driver structures that individually and synchronously drive the active cells of the two-dimensional matrix power amplifier. In an ideal two-dimensional matrix, each of the active cells would receive a separate but identical drive signal at its respective control terminal. Further, no current would be lost in driving the control terminals. Although such ideal behavior is impossible to achieve due to a variety of physical realities (e.g., slight mismatches in the physical characteristics of components, parasitic capacitances and inductances, etc.), the driving of the active cells in the power amplifiers described herein is sufficiently synchronous to provide a total power output that is approximately N*M times the effective output power of a single cell in the matrix, where N is the number of rows in the matrix and M is the number of columns.

In some implementations, the power amplifiers described herein can include an "active source follower return." In particular, an active source follower return can be implemented by a pair of matrix amplifiers that are driven by drive signals of opposite polarity. The two matrix amplifiers are assembled in a complementary or quasi-complementary topology to respectively "push up" and "pull down" the output. In some implementations, active source follower returns can be implemented as a (monolithic) microwave integrated circuit (MIC) device. In such cases, the active source follower return can output high voltage and current signals while retaining the other advantages of integrated circuit devices.

In some implementations, the control terminals of the active cells of the matrix power amplifiers are coupled together in rows, in columns, or in both rows and columns using transmission lines that are suited for transmitting microwave or millimeter-wave frequency drive signals and (nearly) synchronously driving the active cells. In general, the characteristic impedance of the transmission lines can be selected to be 50Ω. However, in some circumstances (e.g., large transistor cells), it may be advantageous to select a lower impedance value (e.g., 20Ω or even 10Ω) for input and output matching of the active cells within the matrix amplifier, especially if high absolute or relative bandwidths are required. As another example, the lengths of the transmission lines are not zero (i.e., the control terminals of the active cells are not directly coupled) but rather the lengths can be selected so that the distribution of drive signals to different control terminals is nearly identical and nearly synchronous driving of the active cells can be achieved. By having non-zero transmission line lengths, neighboring active cells can be physically separated from one another and the thermal coupling between active cells sufficiently reduced to allow even relatively large powers to be amplified.

The matrix power amplifiers described herein all amplify an RF signal output by an RF source. The RF signal can be coupled into the matrix power amplifiers in a variety of different ways. For example, in some implementations, the RF signal can be coupled:
  directly into the active cells in the bottom row of the matrix power amplifier (i.e., without an intervening active driver (but optionally with a passive impedance matching network) between the RF source and the active cells, and
  into other active cells of the matrix power amplifier by way of an intervening active driver at the base of a column driver.

Examples of such matrix power amplifiers are shown, e.g., in FIGS. 9, 10, 11. In these implementations, if one assumes that the power output from all the active cells in the bottom row (i.e., $P_{out,BC}$) is identical (as would be the case if those active cells and power distribution to those cells were identical), then the power output of the matrix power amplifier (i.e., $P_{out}$) is approximately equal to the product of the power output of the individual cells in the bottom row and the total number of active cells, or $$P_{out}=N*M*P_{out,BC} \quad \text{Equation 3.}$$

Further, the gain of each active cell (i.e., $G_{BC}$) is given by the power output of that active cell (i.e., $P_{out,BC}$) for a given power input into that active cell. Assuming that power is divided evenly between the active cells in the bottom row and the active driver at the base of a column driver, then the power input into each active cell in the bottom row is given by the total power input (i.e., $P_{in}$) divided by the sum of the number of columns (i.e., M)+1 to account for the active driver at the base of a column driver, or $$P_{in}=(M+1)*P_{out,BC}/G_{BC} \quad \text{Equation 4.}$$

Thus, the total power gain of the matrix amplifier (i.e., $G_{2D}$) is given by:

$$G_{2D}=P_{out}/P_{in}=N*M/(M+1)*G_{BC} \quad \text{Equation 5.}$$

As another example, in some implementations, the RF signal can be coupled:
  directly into the active cells in the bottom row of the matrix power amplifier (i.e., without an intervening active driver (but optionally with a passive impedance matching network) between the RF source and the active cells), and
  directly into other active cells of the matrix power amplifier (i.e., without an intervening active driver (but optionally with a passive impedance matching network) between the RF source and the active cells).

Examples of such matrix power amplifiers are shown, e.g., in FIGS. 4-8. In these implementations, the power output of the matrix power amplifier and the total power gain of the matrix amplifier is the same as given in Equations 3, 4, 5.

However, in these implementations, the effective power gain of the matrix amplifier and the maximum output power of the individual power active cells in the matrix decrease with increasing frequency because the input power needed for each cell cannot be transferred to the output.

As another example, in some implementations, the RF signal can be coupled:
  into all active cells—including those in the bottom row—of the matrix power amplifier by way of an intervening active driver.

An example of such a matrix power amplifier is shown, e.g., in FIG. 3. In such matrix power amplifiers, the power input into each active cell in the matrix power amplifier is given by the total power input (i.e., $P_{in}$) divided by the total number of active cells. In other words, the power input into each active cell is the total power input (i.e., $P_{in}$) divided by the matrix size N*M. Thus, assuming identical active cells, $$P_{in}=(N*M)*P_{out,BC}/G_{BC} \quad \text{Equation 6.}$$

Thus, the total power gain of the matrix amplifier (i.e., $G_{2D}$) is given by:

$$G_{2D}=P_{out}/P_{in}=G_{BC} \quad \text{Equation 7.}$$

Such matrix power amplifiers do not have any gain multiplication resulting from the matrix dimensions.

As yet another example, in some implementations, the RF signal can be coupled:

- into a single bottom driver cell of a column driver the matrix power amplifier. The active cells in the bottom row and the upper rows of the matrix power amplifier can be driven by a chain or stack of active baluns or differential amplifiers. Each active device can drive all the active cells in a corresponding row.

Examples of such a matrix power amplifier is shown, e.g., in FIG. 12. In such matrix power amplifiers, the entire power input into matrix power amplifier is provided to the bottom active cell. Thus, $$P_{in}=P_{out,BC}/G_{SBC} \quad \text{Equation 8}$$

and the total power gain of the matrix amplifier (i.e., $G_{2D}$) is given by:

$$G_{2D}=P_{out}/P_{in}=N*M*G_{SBC} \quad \text{Equation 9.}$$

This is the theoretical ideal case of an ideal 2D matrix power amplifier with an active driver column where only the bottom cell of this driver is driven by the RF input source.

In light thereof, various aspects of a matrix power amplifier can be described. In a first aspect, a power amplifier includes an amplifier input and an amplifier output, a plurality of N times M active cells, wherein N and M are both ≥2 and the active cells are wired as a M×N matrix, and at least one driver structure to drive the active cells. One of a), b), or c) applies, wherein when a) applies, the matrix columns each include N active cells coupled in series and driven as a stack, wherein the stacks are coupled in parallel, when b) applies, the matrix rows each include M active cells coupled to be driven in parallel, wherein at least two matrix rows are coupled in series, and when c) applies, the matrix columns each include N active cells coupled in series and driven as a stack. The stacks are coupled in parallel and the matrix rows each include M active cells coupled to be driven in parallel. At least two matrix rows are coupled in series. A control terminal of each active cell is coupled to the amplifier input via a signal path that includes the driver input structure, wherein the active cells are all controllable by an electrical signal input to the amplifier input.

The first and any other aspect can include one or more of the following features. The driver structure includes a plurality of active driving elements and the signal path that couples the control terminal of each active cell to the amplifier input includes the driving elements. The signal path that couples the control terminal of at least some of the active cells to the amplifier input includes others of the active cells. The control terminal of each active cell is coupled to the amplifier input to receive a substantially equal input power. Outputs of the active cells are coupled such that output voltages of the active cells along a column are added and output currents of the columns are added at the amplifier output. Outputs of the active cells are coupled such that output currents of the active cells along a row are added and output voltages of the rows are added at the amplifier output. The input signals to the control terminals of the transistors in the active cells in the bottommost row of active cells are unbalanced. Input signals to the control terminals of the transistors in the active cells in the upper rows of active cells are balanced. The power amplifier includes an active balun coupled to convert unbalanced signals into balanced input signals for the active cells in the upper rows. The balanced input signals of the active cells in the upper rows have a current and voltage so that output currents and voltages of the active cells in the upper rows match output currents and voltages of the active cells in the bottommost row. A difference between an output current of a first of the active cells and an output current of a second, immediately subsequent active cell in a same column is less than 10% of the output current of the first of the active cells. A difference between an output current of a bottommost of the active cells in a column and an output current of an uppermost active cell in the column is less than 10% of the output current of the bottommost of the active cells. Output power of each of the active cells is substantially equal. A output power of the power amplifier is substantially equal to N×M the output power of each of the active cells. The at least one driver structure includes bootstrap coupling circuitry to distribute a drive signal from a main terminal of one active cell to a control terminal of another active cell. The bootstrap coupling circuitry includes a voltage divider or a current divider to apply a part of an output voltage or current of a first active cell to a control terminal of a second active cell. The bootstrap coupling circuitry distributes the drive signal from the main terminal of the first active cell in a column to the control terminal of the second active cell in same column. The at least one driver structure includes an active differential driver amplifier. The at least one driver structure includes one or more passive baluns. The power amplifier c includes a) an input impedance matching network, b) an output impedance matching network, or c) both an input impedance matching network and an output impedance matching network. At least some of the active cells include a) an input impedance matching network, b) an output impedance matching network, or c) both an input impedance matching network and an output impedance matching network. For example, all of the active cells can include an input impedance matching network and/or all of the active cells can include an output impedance matching network. The power amplifier includes one or more distribution elements to distribute a signal from the amplifier input to control terminals of M bottommost transistors with a substantially same delay. The power amplifier includes one or more distribution elements to distribute drive signals to control terminals of the active cells in each row, in each column, or in both each row and each column with substantially equal delays. The power amplifier includes one or more collection elements to collect the output signals from the active cells in each row, in each column, or in both each row and each column with the output signals are in phase. The power amplifier includes distribution elements to distribute drive signals to control terminals of the active cells in each row, in each column, or in both each row and each column with different delays, and one or more collection elements to collect the output signals from the active cells in each row, in each column, or in both each row and each column with the output signals out of phase, wherein the collection elements include delays to counter the delays of the distribution elements so that power provided to the amplifier output from the active cells is in phase. The power amplifier is implemented in an integrated circuit, for example, in a monolithic microwave integrated circuit, in a hybrid microwave integrated circuit, or in a multi-chip module. The active cells each includes a charge-controlled semiconductor quadrupole transistor, for example, wherein the active cells each includes a field effect transistor or a bipolar transistor. The active cells each include a III-V semiconductor-based transistor, for example, a AlGaN/GaN-based transistor or GaAs-based transistor. The active cells each include a silicon-based transistor, for example, a SiGe heterojunction transistor. The plurality of active cells are part of a push-pull stage. The push-pull stage is a complementary or a quasi-complementary push-pull stage that includes a second plurality of active cells. The power amplifier includes a coupling between the amplifier output and a main terminal of a first transistor in an active cell in one of the plurality of active cells and a coupling between the amplifier output and a control terminal of the first transistor. The couplings together are to bias the first transistor into conduction in anti-phase with a signal on the amplifier input and thereby enforce an anti-phase operation of the second plurality of active cells relative to the first plurality of active cells. The coupling between the amplifier output and the control terminal of the first transistor includes a conduction path between a main terminal of a transistor in a driver element and the amplifier output and a conduction path between a control terminal of the transistor in the driver element and the control terminal of the first transistor. The coupling between the amplifier output and the control terminal of the first transistor consists of passive components. Each active cell includes a plurality of transistors that are paralleled. Each active cell includes a matrix of transistors. The power amplifier includes first interconnections between the transistors forming the matrix of transistors of each active cell and second interconnections between the active cells themselves. The first interconnections are integrated in a semiconductor device on a level different from the second interconnections. The power amplifier includes a bias tee that has a high frequency port coupled to a load on the amplifier output, a combined port coupled to stacks of the two-dimensional matrix, and a low frequency port coupled to a DC source.

In a second aspect, a device includes an antenna assembly having an input impedance and a power amplifier of the first aspect with or without any of the features thereof or of the third aspect, wherein N and M are configured so that an optimum load impedance of the power amplifier substantially matches the input impedance of the antenna assembly.

The second and any other aspect can include one or more of the following features. A reflection coefficient between −12 dB or less can be achieved over a bandwidth limited by the antenna assembly.

In a third aspect, a power amplifier includes a two-dimensional matrix of N×M active cells formed by stacking main terminals of multiple active cells in series, where the stacks are coupled in parallel to form the two-dimensional matrix. The power amplifier includes a driver structure to coordinate the driving of the active cells so that the effective output power of the two-dimensional matrix is approximately N×M the output power of each of the active cells.

The third and any other aspect can include one or more of the following features. The power amplifier includes a bias tee that has a high frequency port coupled to a load driven by the two-dimensional matrix, a combined port coupled to stacks of the two-dimensional matrix, and a low frequency port coupled to a DC source. The power amplifier includes a second two-dimensional matrix of active cells formed by stacking main terminals of multiple active cells in series, wherein the stacks are coupled in parallel to form the second two-dimensional matrix. The two-dimensional matrix and the second two-dimensional matrix are coupled to form a complementary or quasi-complementary stage. The power amplifier includes a second driver structure to coordinate the driving of the active cells of the second two-dimensional matrix in anti-phase with the driving of the active cells in the two-dimensional matrix. The power amplifier includes a control loop including an error amplifier to output an error signal representative of a difference between a desired DC output voltage and an actual output voltage. The second driver structure is coupled to regulate the actual DC output voltage in response to the error signal. The two-dimensional matrix and the second two-dimensional matrix are coupled to form the complementary stage. The power amplifier includes a second driver structure to coordinate the driving of the active cells of the second two-dimensional matrix in phase with the driving of the active cells in the two-dimensional matrix. The driver structure includes bootstrap coupling circuitry to distribute a drive signal from a main terminal of one active cell to a control terminal of another active cell in the same stack. The driver structure includes a plurality of unbalanced-to-balanced passive balun matrix drivers. The driver structure includes a row driver to distribute a drive signal to control terminals of a plurality of active cells in a plurality of stacks. The row driver includes a plurality of distribution lines to couple portions of a drive signal to the control terminals of a plurality of active cells with appropriate delays to coordinate current conduction by the active cells. Each of the active cells includes a plurality of transistors coupled in parallel. Each of the active cells includes a two-dimensional matrix of transistors. The power amplifier includes first interconnections between the transistors forming the two-dimensional matrix of each active cell and second interconnections between the active cells themselves. The first interconnections are integrated in a semiconductor device on a level different from the second interconnections. N need not be equal to M. At least some of the active cells include an input impedance matching network. At least some of the active cells include an output impedance matching network.

In a fourth aspect, a device includes an antenna assembly having an input impedance and a power amplifier of the third aspect with or without any of the features thereof or of the first aspect, wherein N and M are configured so that an optimum load impedance of the power amplifier substantially matches the input impedance of the antenna assembly.

The fourth and any other aspect can include one or more of the following features. A reflection coefficient of −12 dB or less is achieved over a bandwidth limited by the antenna assembly.

The details of one or more implementations are set forth in the accompanying drawings and the description below. Other features and advantages will be apparent from the description and drawings, and from the claims.

DESCRIPTION OF DRAWINGS

FIG. 30a is a schematic representation of a matrix power amplifier.

FIG. 30b is a schematic representation of an impedance-matching differential amplifier.

Like reference symbols in the various drawings indicate like elements.

DETAILED DESCRIPTION

Figure 1:
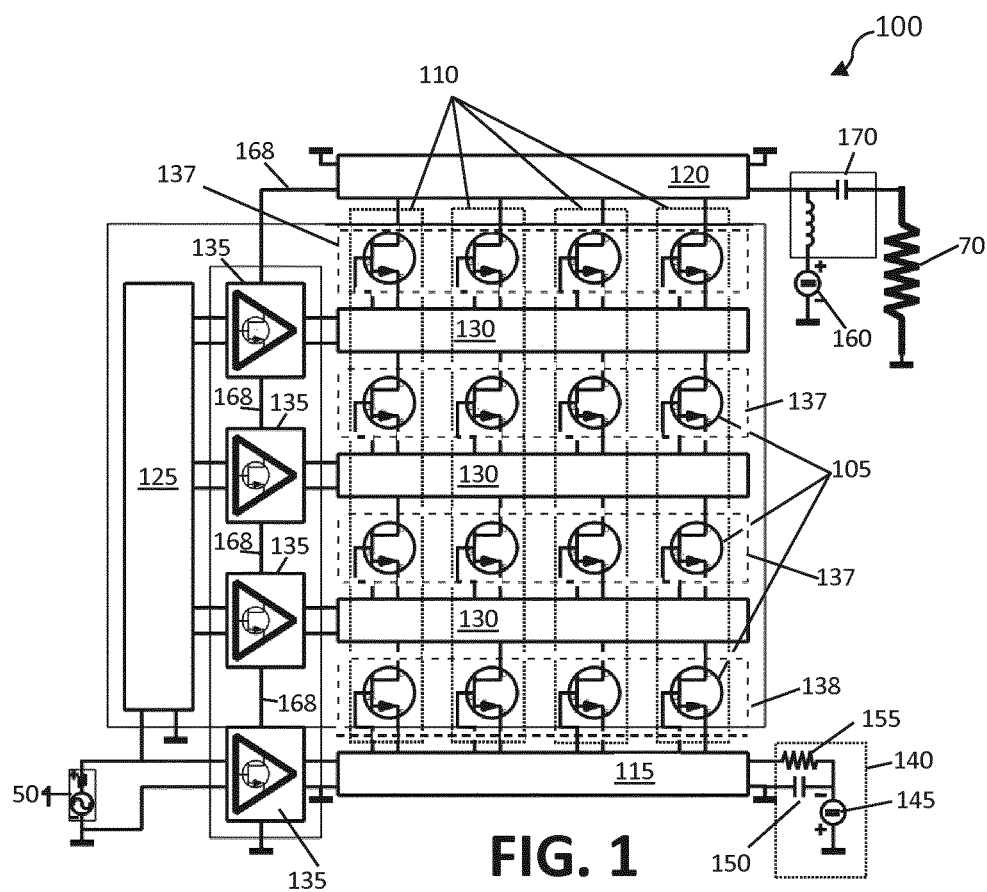
FIG. 1 is a schematic representation of a matrix power amplifier.

FIG. 1 is a schematic representation of a matrix power amplifier 100, e.g., for amplifying signals at microwave or millimeter-wave frequencies. Matrix power amplifier 100 includes a collection of active cells formed by individual transistors 105. Transistors 105 are coupled in multiple stacks 110. Stacks 110 are themselves coupled in parallel between an unbalanced distribution rail 115 and an unbalanced collection rail 120. Distribution rail 115 is coupled to distribute a signal from a signal source 50 to the bottommost transistors 105 in each of stacks 110. Collection rail 120 is coupled to collect the signals passing through stacks and direct them to a load 70. A matrix driver 125 can be a passive element that distributes drive signals that are generated by signal source 50 or an active cell that generates drive signals based on the output of signal source 50. In either case, the drive signals are distributed to the control terminals of the individual transistors 105 via a plurality of balanced row matching structures. In response to the drive signal, transistors 105 switch from being more conductive to being less conductive and back again to alternately form multiple higher- and lower-conductivity paths between rails 115, 120 and between signal source 50 and load 70. Since stacks 110 are coupled in parallel, matrix power amplifier 100 has an optimum load impedance that can be tailored to match the impedance of load 70 and hence transfer a relatively large portion of the maximum possible power thereto.

Matrix power amplifier 100 is a "row-matched" power amplifier in that a plurality of row drivers that are coupled to distribute the drive signal in a row-wise fashion to transistors 105 in different stacks 110. In the illustrated implementation, the transistors 105 of matrix power amplifier 100 can be considered to be found in four different "rows" 137 of the matrix. Although the transistors 105 in each row 137 are found in different stacks 110, the transistors 105 in each row 137 are coupled to a respective row matching structure that, in the illustrated implementation, includes a distribution line 130 and an impedance matching element 135. In the illustrated implementation, impedance matching element 135 is shown as an active driver amplifier. However, impedance matching element 135 can also be formed by a passive impedance matching network. Some portion of each drive signal is coupled to the control terminals on the transistors 105 in each row 137 by the distribution line 130 and impedance matching element 135. Distribution line 130 and impedance matching element 135 couple the portions of the drive signals to the control terminals with appropriate delays to coordinate current conduction by transistors 105 in each row 137, thus amplifying the drive signals. The drive signal coupled into the control terminal of each transistor 105 is referenced to the potential of the source/emitter main terminal. The drive signals are "ground-free" in the sense that any control current entering the control terminal of a given transistor 105 also leaves the transistor 105 by the source/emitter main terminal but does not contribute to the drain/collector current of the "preceding" transistor 105 in the same stack 110. For the sake of clarity, in the illustrated schematic representation, the transistor 105 that is directly below any given transistor 105 in the same stack 110 is the "preceding" transistor 105. It is to be understood that the orientation and disposition of components in the illustrated schematic representation is arbitrary and a "preceding" transistor will remain "preceding" notwithstanding a different physical disposition in a real-world device (e.g., above, to the left, or behind a "subsequent" transistor). Instead, "preceding" and "subsequent" transistors can be identified by their relative disposition in a conductive path between signal source 50 and load 70. In any case, instead of contributing to the drain/collector current of the preceding transistor 105, the current that leaves the transistor 105 by the source/emitter main terminal returns to impedance matching element 135 by way of distribution line 130 that is located directly below that transistor 105.

In the illustrated implementation, signal source 50 is an RF source that outputs a signal that achieves the desired current flow between the main terminals of the active cells in matrix power amplifier 100. For example, signal source 50 can output a signal that represents a desired communications transmission. In some implementations, signal source 50 can output a signal having a carrier or center frequency of between nearly DC (generally, a few 100 MHz so that different transistors are capacitive decoupled) and approx. ⅓ $f_T$, where $f_T$ is the unity gain transition frequency of transistors 105. For example, in some III-V field effect transistors, $f_T$ can be 30 GHz or so. Some portion of the signal output by input signal source 50 is coupled into rail 115 by an impedance matching element 135. In the illustrated implementation, impedance matching element 135 is shown as an active driver amplifier. Thus, in the illustrated implementation, signal source 50 does not directly output a drive signal that drives the control terminals of transistors 105. Rather, signal source 50 outputs a signal that is amplified by impedance matching element 135 to generate such a drive signal. In other implementations, impedance matching element 135 can be formed by a passive impedance matching network. In such implementations, signal source 50 can directly output a drive signal that drives the control terminals of transistors 105.

Distribution rail 115 is coupled to distribute portions of the communications signal and a DC signal to both the control terminals and the source/emitter main terminals of the transistors 105 in a first row 138. In some implementations, impedance matching element 135 can act as a balun and distribution rail 115 can be implemented as a two wire transmission line that is symmetric to earth. Distribution rail 115 terminates in an RF loading and gate biasing network 140. In the illustrated implementation, RF loading and gate biasing network 140 includes a DC source 145 that outputs a DC signal which controls the current flow through stacks 110 via the control terminals of transistors 105 in the first row 138. In particular, once current begins to flow through transistors 105 in the first row 138, current flow in subsequent row 137 follows. In the illustrated implementation, the potential output from DC source 145 is negative with respect to ground and pulls down the potential on collection rail 120 when stacks 110 are conductive. The potential output by DC source 145 is isolated from the grounded wire of the two wire transmission line of distribution rail 115 by a capacitance 150 and coupled to the other wire by an impedance 155. In the illustrated implementation, impedance 155 is a real impedance that provides a portion of the load that is matched by impedance matching element 135.

Collection rail 120 collects the power output from each stacks 110 and directs it toward load 70. Collection rail 120 can also be implemented as a two wire transmission line that is symmetric to earth. In either case on of the wires of collection rail 120 is coupled to the combined port of a high voltage bias tee 170. Load 70 is coupled to the high frequency port of the bias tee 170, and DC source 160 is coupled to the low frequency port. The ungrounded wires are thus biased by DC source 160 with a DC potential suitable for powering matrix power amplifier 100. In the illustrated implementation in which impedance matching elements 135 are implemented as active driver amplifiers, the DC potential output by DC source 160 is conducted by one or more power lines 168 to those active driver amplifiers.

In the illustrated implementation, power amplifier 100 includes a collection of individual transistors 105. Transistors 105 can be any of a number of different types of semiconductor devices, e.g., field effect transistors (FETs) or bipolar junction transistors (BJTs), with or without any individual matching or prematching. In some implementations, the active cells of the matrix of power amplifier 100 are not individual transistors but rather multiple transistors, e.g., assembled into amplifier modules.

Figure 2:
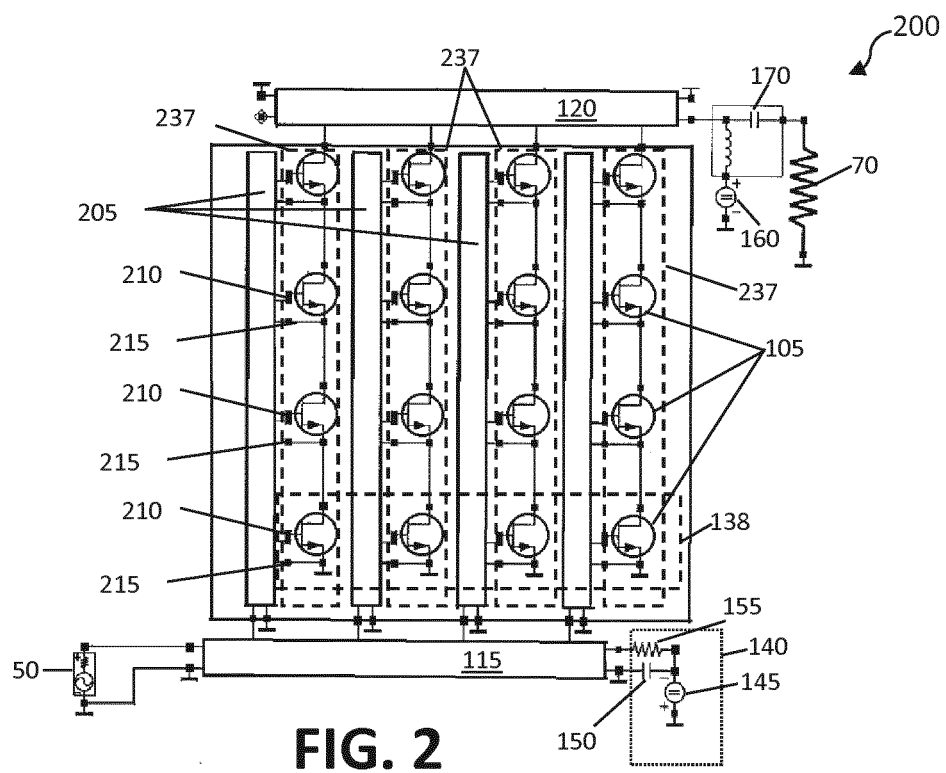
FIG. 2 is a schematic representation of a matrix power amplifier.

FIG. 2 is a schematic representation of a matrix power amplifier 200. Matrix power amplifier 200 also includes individual transistors 105 that are coupled in multiple stacks 110. Stacks 110 are themselves coupled in parallel between unbalanced distribution rail 115 and unbalanced collection rail 120. In contrast with power amplifier 100 (FIG. 1), distribution rail 115 is necessarily unbalanced since matrix power amplifier 200 does not include an impedance matching element 135 that can potentially act as a balun between signal source 50 and distribution rail 115.

Matrix power amplifier 200 is a "column-matched" power amplifier in that matrix power amplifier 200 includes a plurality of column drivers 205 that are coupled to distribute the drive signal in a column-wise fashion to transistors 105 respective of stacks 110. In the illustrated implementation, the transistors 105 of matrix power amplifier 200 can be considered to be found in four different "columns" 237 of the matrix. The transistors 105 in each column 237 are found in the same stack 110 and coupled to a single column driver 205. Column drivers 205 can be implemented in a variety of different ways, including (passive) bootstrapping column drivers and (active) column drivers that include, e.g., differential amplifiers, including those described below. Column drivers 205 can be active or passive elements.

Each column driver 205 includes a control terminal coupling 210 and a main terminal coupling 215. Control terminal couplings 210 couple column driver 205 to the control terminals of respective transistors 105. Main terminal couplings 215 couple column driver 205 to the source/emitter main terminals of respective transistors 105. The drive signal coupled into the control terminal of each transistor 105 is referenced to the potential of the source/emitter main terminal. Aside from first row 138 (discussed below), terminal couplings 210, 215 form a balanced coupling for driving transistors 105. In effect, the drive signals are ground-free and any control current entering the control terminal of a given transistor 105 also leaves the transistor 105 by the source/emitter main terminal but does not contribute to the drain/collector current of the preceding transistor 105 in the same stack 110.

In first row 138 of matrix power amplifier 200, the source/emitter main terminal of transistors 105 are all coupled to ground. As a consequence, main terminal couplings 215 to the source/emitter main terminals of transistors 105 in first row 138 are also coupled to ground and thus form an unbalanced coupling. As with matrix power amplifier 100 (FIG. 1), DC source 145 controls the current that is to flow through stacks 110 via the control terminals of transistors 105 in the first row 138.

Figure 3:
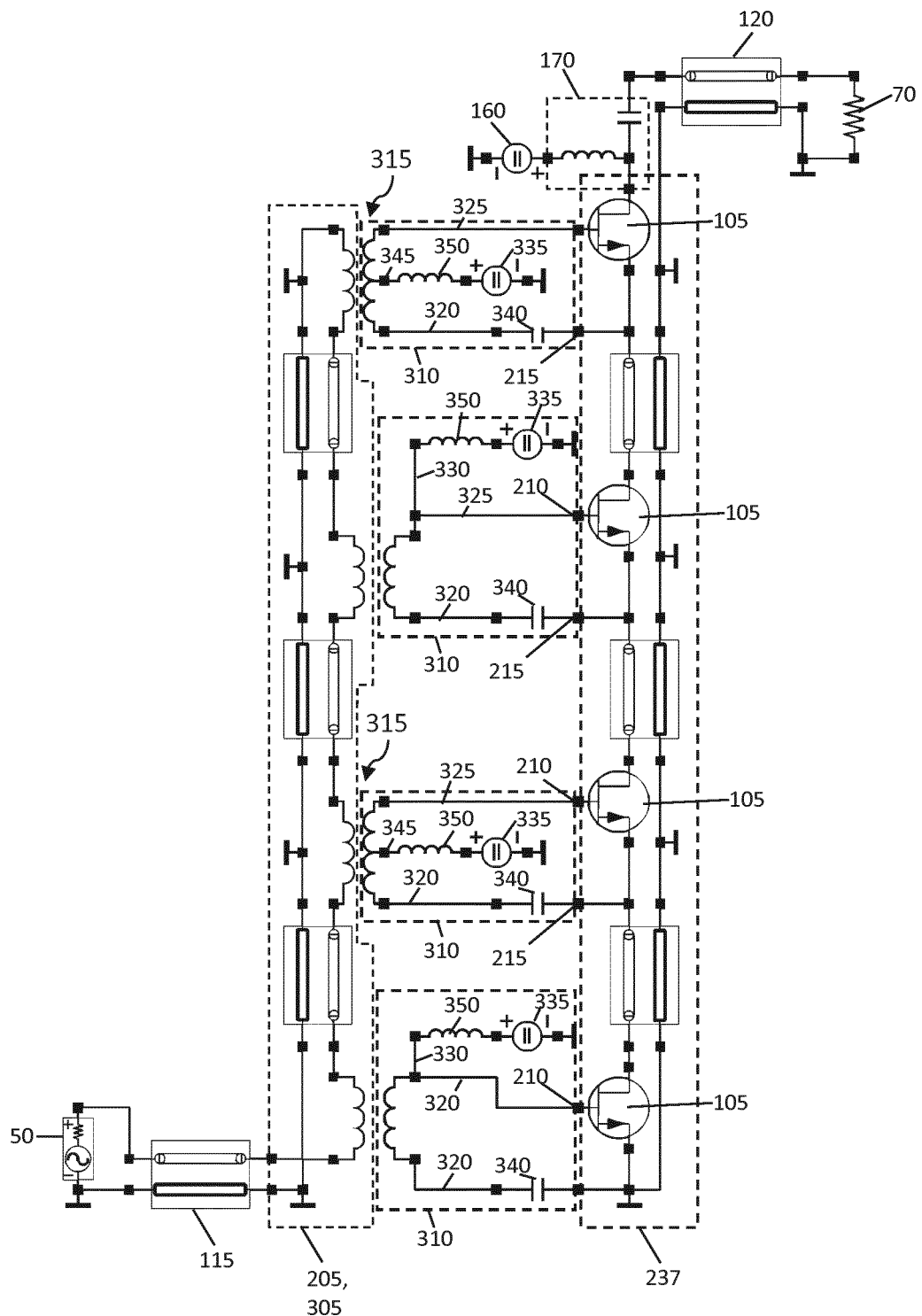
FIG. 3 is a schematic representation of a column-matched matrix power amplifier.

FIG. 3 is a schematic representation of a column-matched matrix power amplifier 300. For the sake of convenience, only a single stack 110 (and hence a single column) of matrix power amplifier 300 is illustrated. However, it is to be understood that matrix power amplifier 300 can include a number of rows and columns that is tailored to operational needs, including output impedance and amplification.

Matrix power amplifier 300 includes an unbalanced passive matrix driver 305 that distributes signals generated by signal source 50 to a collection of balanced distribution lines 310. Each distribution line 310 couples a respective portion of the drive signal to transistors 105 in different stacks 110. Once again, only a single stack 110 is illustrated in the schematic representation of matrix power amplifier 300 although an operational matrix power amplifier 300 will include multiple stacks 110.

Unbalanced passive matrix driver 305 is coupled to each balanced distribution lines 310 by a balun transformer 315. Balun transformers 315 not only convert the unbalanced signal on passive matrix driver 305 to a balanced signal on distribution lines 310, but balun transformers 315 also act as impedance matching elements to couple the drive signal to transistors 105 in different stacks 110.

Each balanced distribution line 310 includes a conductive path 320 that couples a first terminal of the balun transformer 315 winding to the source/emitter main terminals of transistors 105, a conductive path 325 couples the other, second terminal of the balun transformer 315 winding to the control terminals of transistors 105, and a conductive path 330 between either a center tap 345 of the respective balun transformer 315 or the second terminal of the respective balun transformer 315 to a DC source 335 relative to ground. Each DC source 335 biases a control terminal of a respective transistor 105. Each source/emitter conductive path 320 includes a capacitance 340 that isolates the remainder of distribution line 310 from the DC potential on the respective source/emitter of terminals of transistors 105. DC source conductive paths 330 each includes an inductance 350 that isolates the RF signal from DC sources 335.

Figure 4:
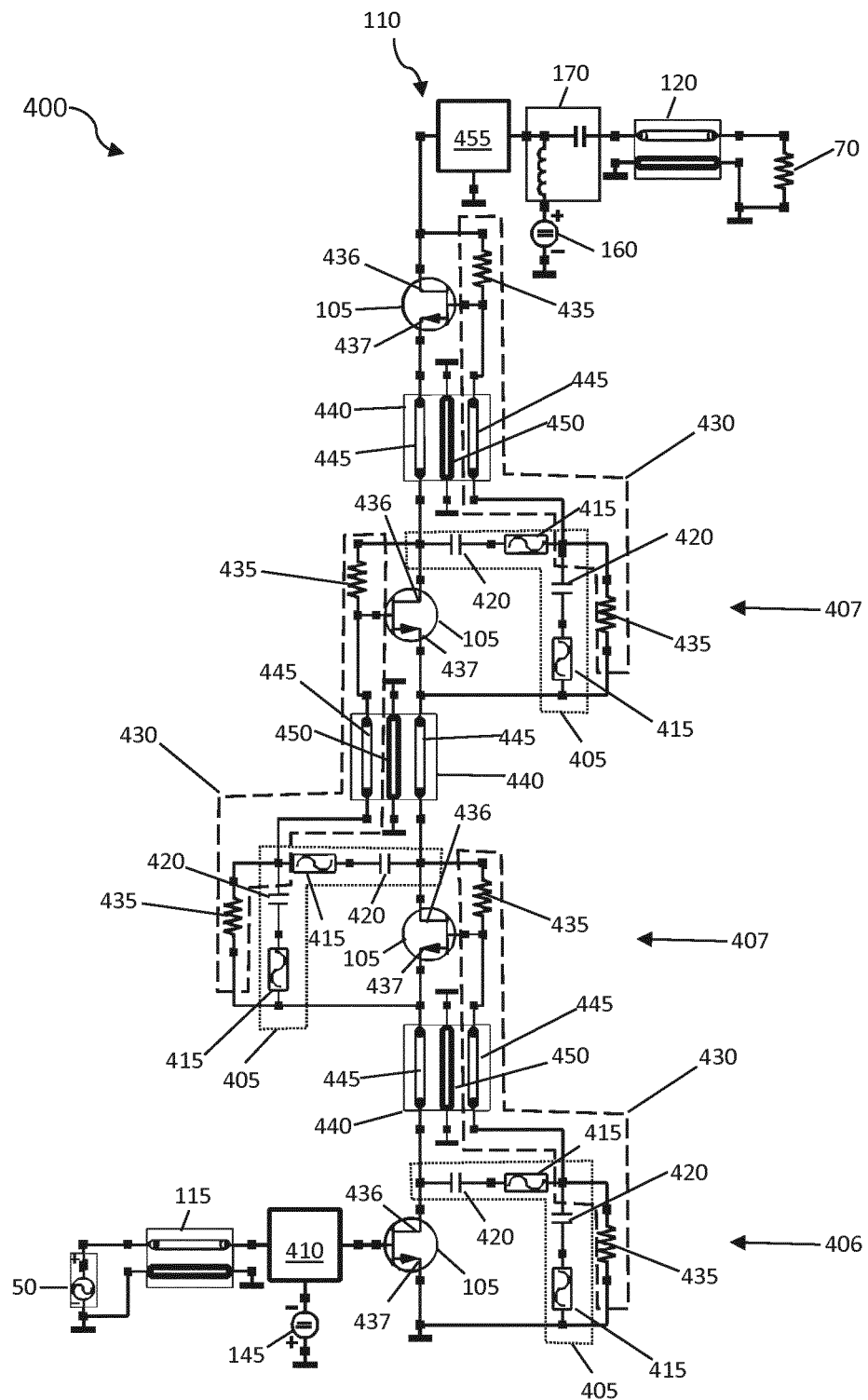
FIG. 4 is a schematic representation of a column-matched matrix power amplifier.

FIG. 4 is a schematic representation of a column-matched matrix power amplifier 400. For the sake of convenience, only a single stack 110 (and hence a single column) of matrix power amplifier 400 is illustrated. However, it is to be understood that matrix power amplifier 400 can include a number of rows and columns that is tailored to operational needs, including output impedance and amplification.

Matrix power amplifier 400 uses parallel bootstrapping driver circuits 405 to distribute signals generated by signal source 50 to transistors 105 in stack 110. The parallel bootstrapping driver circuits 405 transfer a portion of the output voltage, e.g., drain/collector voltage of each respective transistor 105 (e.g., a kth stage transistor 105) to drive the control terminal of a respective "subsequent" transistor 105 (e.g., a $(k+1)^{th}$ stage transistor 105) in the stack 110.

Each parallel bootstrapping driver circuit 405 includes impedance elements 415 and capacitances 420. Impedance elements 415 are arbitrary passive complex impedances and can include one or more inductors, capacitors, and/or passive resistive elements. Impedance elements 415 of driver circuit 405 form an AC voltage divider circuit that transfers a portion of the output voltage of each respective preceding transistor (e.g., kth stage) to the control terminal of a respective subsequent transistor 105 ((k+1)th stage) in the stack 110. For example, the impedance elements 415 of a kth stage driver circuit 405 form a voltage divider between the voltage at an upper main terminal 436 (e.g., drain/collector) of a kth stage transistor 105 and the voltage at a lower main terminal 437 (e.g., source/emitter) of the kth stage transistor 105. The output of the kth stage driver circuit 405 (e.g., a terminal between the impedance elements 415) is provided to the input terminal (e.g., gate) of the (k+1)th stage transistor 105.

"Upper" main terminals of transistors 105 are terminals that are disposed toward the output end of a stack 110 (i.e., nearest collection rail 120) in the conductive path between signal source 50 and load 70. In the illustrated schematic representations, all of the upper main terminals are drain/collector terminals, although this is not necessarily the case. "Lower" main terminals of transistors 105 are terminals that are disposed toward the input end of a stack 110 (i.e., nearest distribution rail 115). In the illustrated schematic representations, all of the lower main terminals are source/emitter terminals, although this is not necessarily the case.

Capacitances 420 isolate the drive signal for each subsequent transistor 105 from the DC potentials on the respective source/emitter and drain/collector terminals of the preceding transistor 105. The total output power of the stack 110 decreases as the frequency of the signals generated by signal source 50 increases because a part of the power generated by each transistor 105 in the stack is used to drive a respective subsequent transistor 105.

Distribution rail 115 and an impedance matching element 410 conduct a portion of the signal generated by signal source 50 to bottom row 406 transistors 105 in different stacks 110, but the upper row 407 of transistors 105 are driven with input signals from the voltage dividers or driver circuits 405. Similarly, output impedance matching elements 455 couple the output signal of each stack 110 to collection rail 120. Once again, only a single stack 110 is illustrated in the schematic representation of matrix power amplifier 400, although an operational matrix power amplifier 400 will include multiple stacks 110.

The control terminal of each kth stage transistor 105 (except for the first stage) is biased by a DC voltage divider circuit 430. The DC voltage divider circuits 430 each include resistances 435 that divide the voltage between an upper main terminal 436 (e.g., drain/collector) of that kth stage transistor 105 and the lower main terminal 437 of each "preceding" (e.g., (k−1)th stage) transistor 105. The first (lowest) stage transistor 105 is biased by DC source 145.

Distribution lines 440 couple both the bootstrapped drive signal and stack current between transistors 105 in the stack. The distribution lines 440 are three-line transmission lines including two signal lines 445 and one ground line 450. In each distribution line 440, one signal line 445 carries the bootstrapped drive signal and the other signal line 445 carries the stack current between the transistors 105.

Figure 5:
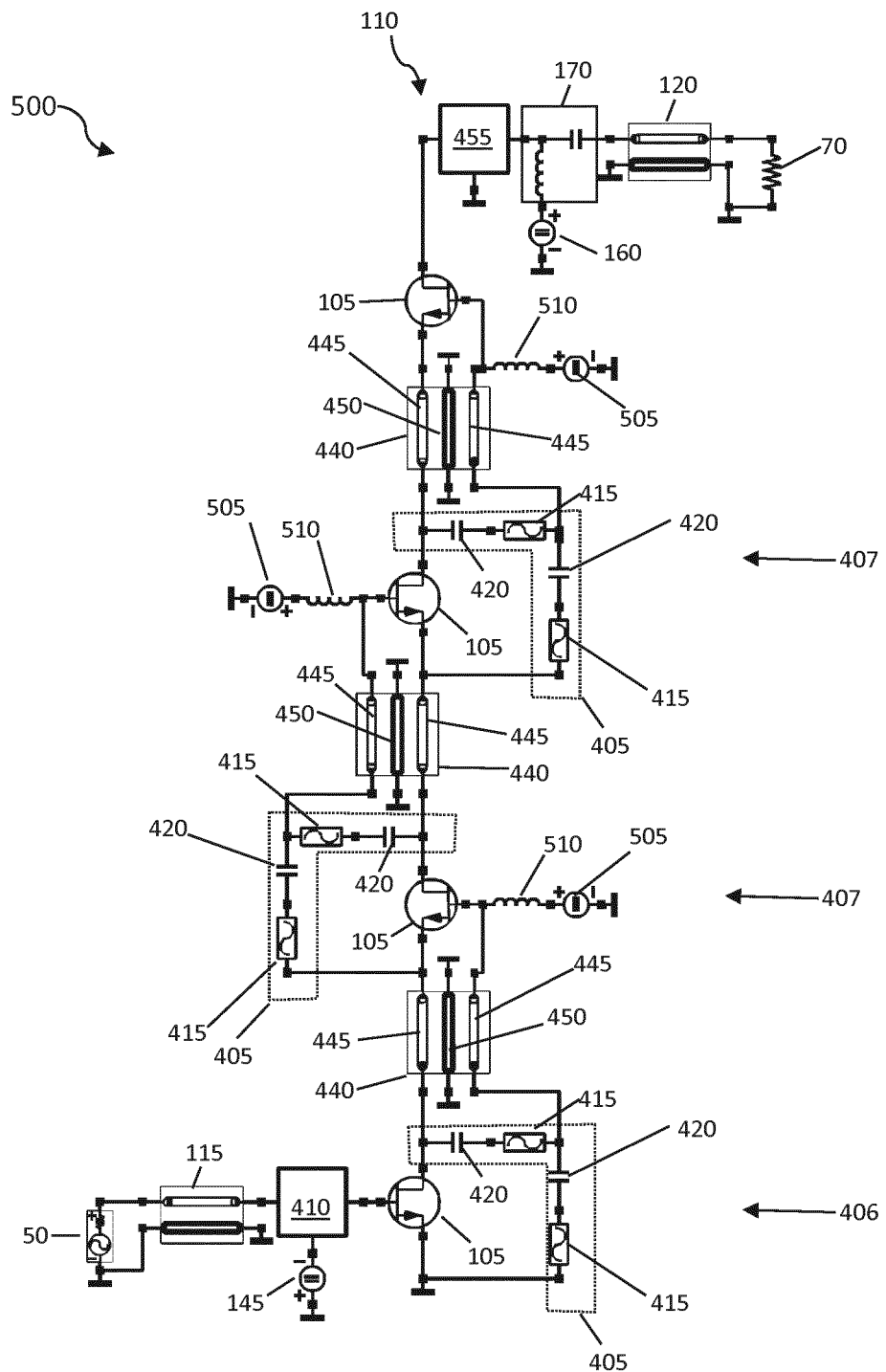
FIG. 5 is a schematic representation of a column-matched matrix power amplifier.

FIG. 5 is a schematic representation of a column-matched matrix power amplifier 500. For the sake of convenience, only a single stack 110 (and hence a single column) of matrix power amplifier 500 is illustrated. However, it is to be understood that matrix power amplifier 500 can include a number of rows and columns and be tailored to operational needs, including output impedance and amplification. Matrix power amplifier 500 is similar to matrix power amplifier 400 (FIG. 4), except that the control terminal of each transistor 105 is biased by a DC voltage source 505 instead of a DC voltage divider circuit 430. Furthermore, each DC source is isolated from RF signals by an inductance 510.

As with matrix amplifier 400, the distribution lines 440 of matrix amplifier 500 couple both the bootstrapped drive signal and stack current between transistors 105 in the stack. The distribution lines 440 are three-line transmission lines including two signal lines 445 and one ground line 450. In each distribution line 440, one signal line 445 carries the bootstrapped drive signal and the other signal line 445 carries the stack current between the transistors 105.

The bootstrapping driver circuits 405 of matrix amplifiers 400 and 500 are considered to be parallel boot-strapped because the bootstrapped drive signal is obtained through a voltage divider which is parallel connected to the transistor stack. In addition, the bootstrapped drive signal and stack current are each coupled between transistors 105 in the stack through different signal lines 445 in the distribution lines 440.

Figures 6, 7:
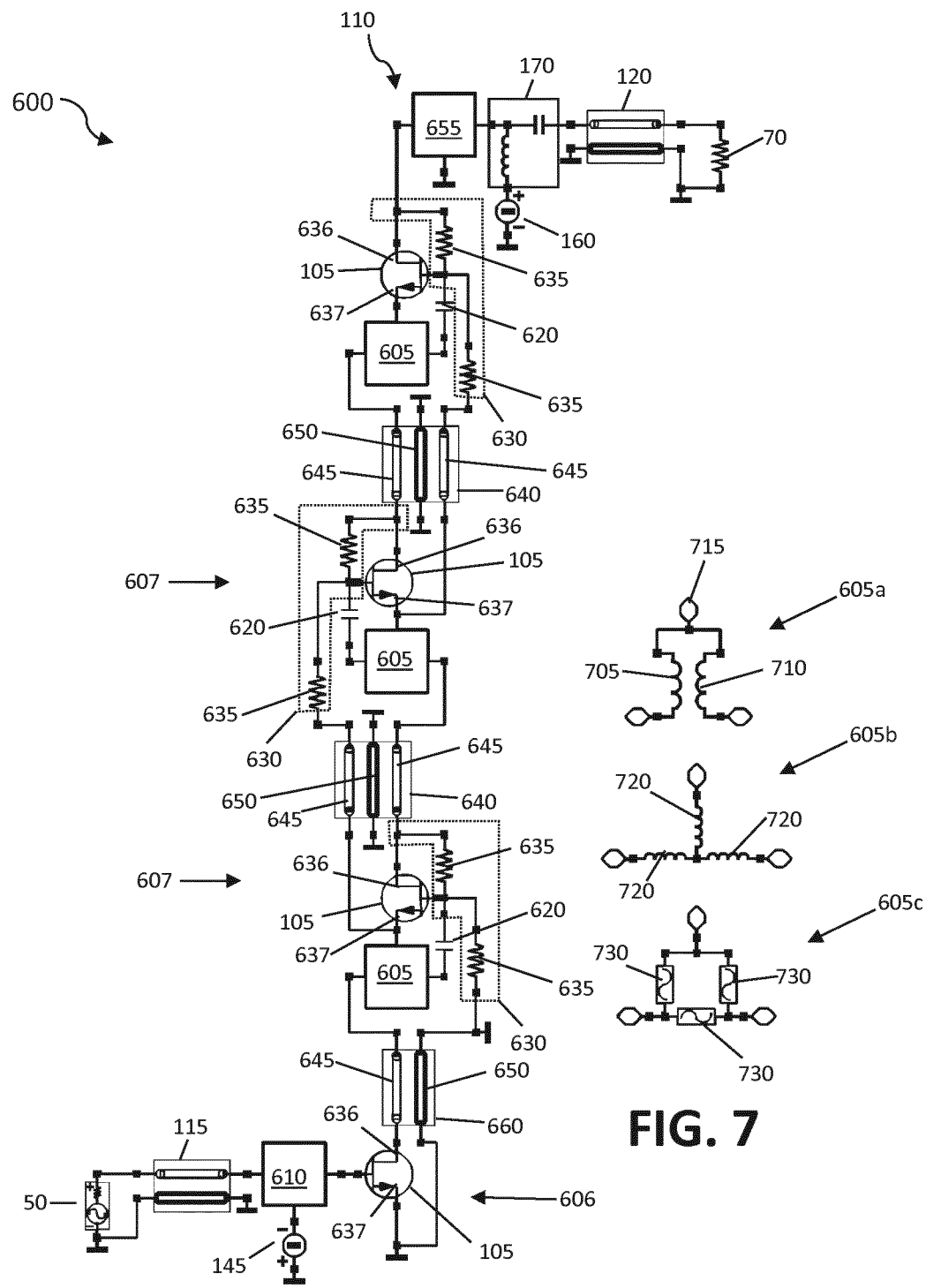
FIG. 6 is a schematic representation of a column-matched matrix power amplifier.
FIG. 7 shows schematic representation of three implementations of balun.

FIG. 6 is a schematic representation of a column-matched matrix power amplifier 600. For the sake of convenience, only a single stack 110 (and hence a single column) of matrix power amplifier 600 is illustrated. However, it is to be understood that matrix power amplifier 600 can include a number of rows and columns that is tailored to operational needs, including output impedance and amplification.

Matrix power amplifier 600 uses series bootstrapping to distribute signals generated by signal source 50 to transistors 105 in a stack 110. Baluns 605 transfer a portion of the output current (e.g., the drain/collector current) from each transistor 105 in the lower rows 606, 607 of the matrix power amplifier 600 to drive the control terminal of respective subsequent transistors 105 in the stack 110. Baluns 605 are three-terminal devices that both couple a portion of the output current from a transistor in one of the lower rows 606, 607 as a control terminal drive signal for a respective subsequent transistor 105 in the next higher row and convert the unbalanced output current to a balanced drive signal.

FIG. 7 shows schematic representation of three implementations of balun 605. The first implementation is a transformer 605a. The transformer 605a includes a primary coil 705 and a secondary coil 710 and a common terminal 715 coupled to both the primary coil 705 and the secondary coil 710. In some implementations, the nominal value of the transformation ratio of transformers 605a is selected to match the current gain of the transistors 105. When the transformer 605a is used as the balun 605 in the matrix power amplifier 600, a terminal of the primary coil 705 is coupled to an upper main terminal 636 (e.g., drain/collector) of a transistor 105, the common terminal 715 is coupled to a lower main terminal 637 (e.g., source/emitter) of a respective subsequent transistor 105, and a terminal of the secondary coil 710 is coupled to a control terminal of the respective subsequent transistor 105. Thus, the output signal secondary coil 710 supplies the input drive signal to the control terminal of the respective subsequent transistor 105.

The second implementation of balun 605 is a T-circuit 605b including three admittance elements 720 configured T (or wye) network. The third implementation of balun 605 is a pi-circuit 605c including three impedance elements 730 configured in a pi (or delta) network. Different implementations of balun 605 can be used in different real-world implementations of matrix power amplifiers. For example, the admittance elements 720 of T-circuit 605b may be advantageous in some microwave integrated circuit devices, whereas the impedance elements 730 of the pi-circuit 605c may be advantageous in others, depending on factors such as processing technology and the design of other components in the matrix power amplifier.

Referring again to FIG. 6, capacitances 620 are included in the conductive path between the baluns 605 and control terminals of the transistors 105. Capacitances 620 isolate the drive signal for each transistor 105 from DC potential on the respective source/emitter and drain/collector terminals of transistors 105. Furthermore, the total output power of the stack 110 decreases as the frequency of the signals generated by signal source 50 increases because a part of the power generated by each transistor 105 in the stack is used to drive a respective subsequent transistor 105.

Distribution rail 115 carries a respective portion of the signals generated by signal source 50 to bottom row 606 transistors 105 in different stacks 110. The impedance matching elements 610 couple the source signal on distribution rail 115 to the bottom row 606 transistors 105 in different stacks 110. Similarly, output impedance matching elements 655 couple the output signal of each stack 110 to collection rail 120. Once again, only a single stack 110 is illustrated in the schematic representation of matrix power amplifier 600 although an operational matrix power amplifier 600 will include multiple stacks 110.

The control terminal of each transistor 105 is biased by a DC voltage divider circuit 630. DC voltage divider circuits 630 each include resistances 635 that divide the voltage between an upper main terminal (e.g., drain/collector) 636 of a transistor 105 and a lower main terminal (e.g., source/emitter) 637 of a preceding transistor 105. Each of the DC voltage divider circuits 630 provides a floating bias to the control input of a respective transistor 105. The exception is the DC voltage divider circuit 630 connected to the lower main terminal of the transistor 105 in the bottom row 606, which is grounded.

Distribution lines 640 couple transistors 105 in the stack. The distribution lines 640 are unbalanced three-line transmission lines including two signal lines 645 and one ground line 650. Generally, the DC voltage divider circuits 630 are coupled to one of the signal lines 645 and respective transistor 105 upper and lower main terminals are coupled to the other signal line 645. The distribution line 660 coupling the transistor 105 in the bottom row 606 to the first subsequent row 607 is an unbalanced two-line transmission line. Distribution line 660 includes one signal line 645 and one ground line 650. The signal line 645 in distribution line 660 is coupled to the upper main terminal of transistor 105 in the bottom row 606 and the lower main terminal of transistor 105 in the subsequent (second) row. The DC voltage divider circuit 630 that is connected to the lower output of the transistor in the bottom row 606 is coupled to the ground line 650 in distribution line 660.

Figure 8:
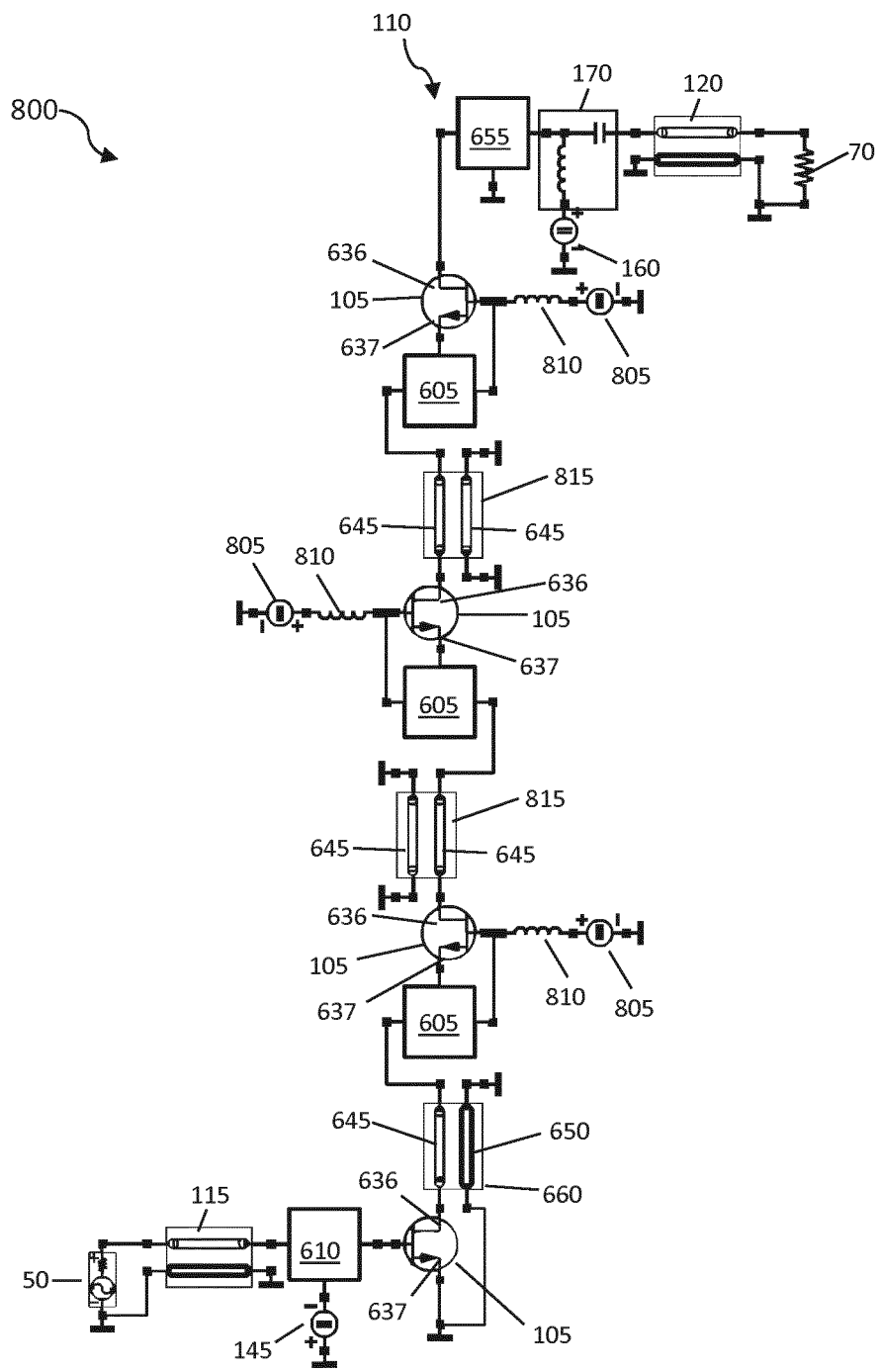
FIG. 8 is a schematic representation of a column-matched matrix power amplifier.

FIG. 8 is a schematic representation of a column-matched matrix power amplifier 800. For the sake of convenience, only a single stack 110 (and hence a single column) of matrix power amplifier 800 is illustrated. However, it is to be understood that matrix power amplifier 800 can include a number of rows and columns that is tailored to operational needs, including output impedance and amplification. Matrix power amplifier 800 is similar to matrix power amplifier 600 described above in reference to FIGS. 6 and 7, except that the control terminal of each transistor 105 is biased by a DC voltage source 805 instead of a DC voltage divider circuit 630. Furthermore, each DC source is isolated from RF signals by an inductance 810. In addition, the three-line distribution lines 660 of matrix power amplifier 600 can be replaced by balanced two-line distribution lines 815 which include two balanced signal lines 645 and no ground line.

Figure 9:
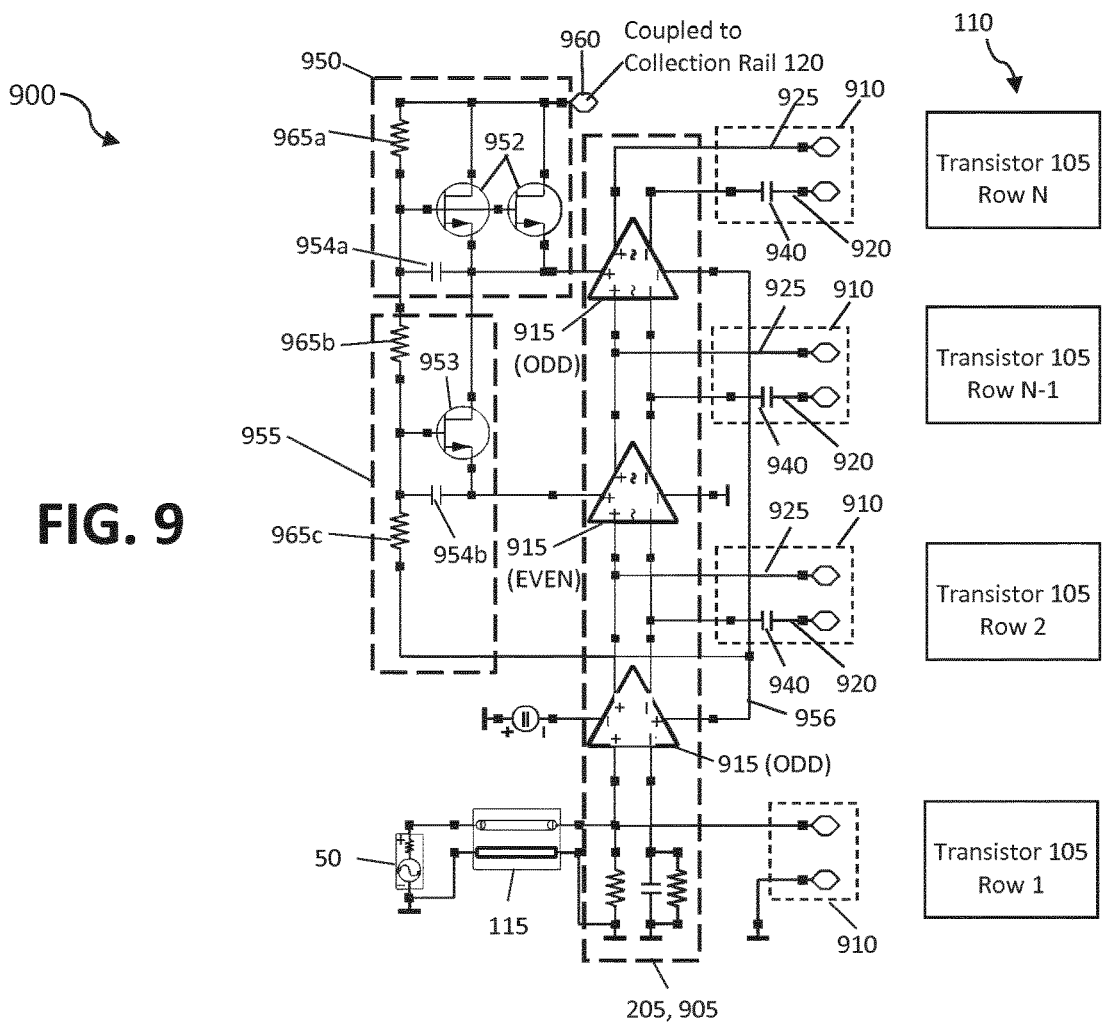
FIG. 9 is a schematic representation of a balanced active matrix driver for a row-matched matrix power amplifier.

FIG. 9 is a schematic representation of a balanced active matrix driver 905 for a row-matched matrix power amplifier 900. For the sake of convenience, only a single stack 110 (and hence a single column) of matrix power amplifier 900 is illustrated. However, it is to be understood that matrix power amplifier 900 can include a number of rows and columns that is tailored to operational needs, including output impedance and amplification.

The balanced active matrix driver 905 distributes signals generated by signal source 50 to a collection of balanced distribution lines 910. Each distribution line 910 couples a respective portion of the drive signal to transistors 105 in different stacks 110. Once again, only a single stack 110 is illustrated in the schematic representation of matrix power amplifier 900 although an operational matrix power amplifier 900 will include multiple stacks 110.

The balanced active matrix driver 905 includes a set of stacked impedance-matching differential amplifiers 915. The balanced active matrix driver 905 includes one less impedance-matching differential amplifiers 915 than transistors 105 in each stack 110. For instance, in the example shown, the active matrix driver 905 includes three impedance-matching differential amplifiers 915 to drive a stack 110 of four transistors 105. The first differential amplifier 915 and the transistor 105 in the bottom row (row 1) of the stack are simultaneously driven by the signal source 50. Each k-th differential amplifier 915 in the active matrix driver 905 then drives the (k+1)-th transistor 105 in stack 110.

Figure 10:
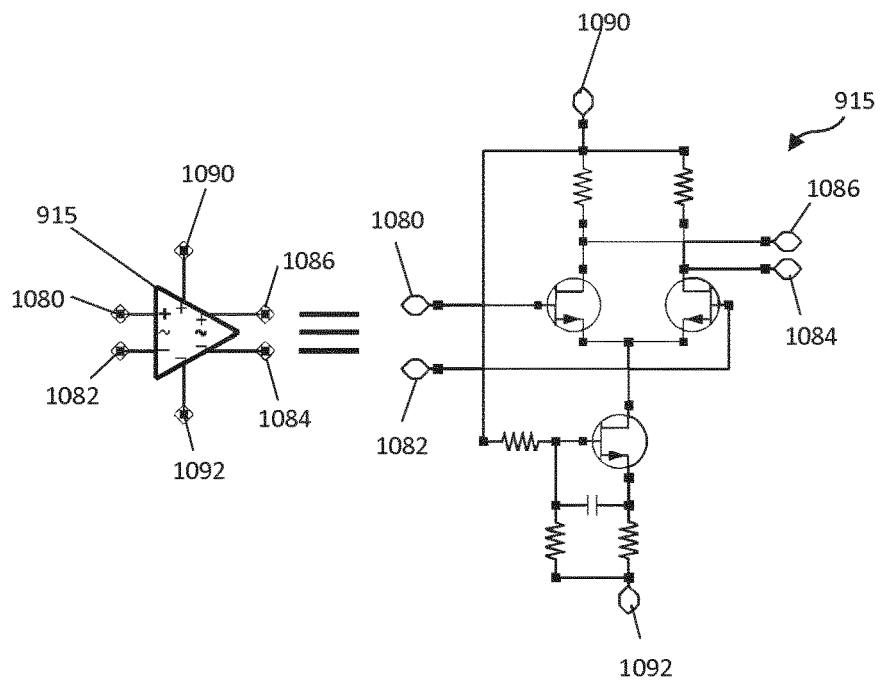
FIG. 10 is a schematic representation of an impedance-matching differential amplifier.

In more detail, FIG. 10 is a schematic representation of an impedance-matching differential amplifier 915 that can be used in balanced active matrix drivers. Differential amplifier 915 includes an inverting input terminal 1080, a non-inverting input terminal 1082, a high output terminal 1084, and a low output terminal 1086. Differential amplifier 915 outputs a signal on output terminals 1084, 1086 that represents the difference between the signal on input terminals 1080, 1082.

Referring again to FIG. 9, the differential amplifiers 915 are stacked with the output terminals 1084, 1086 of each differential amplifier 915 (k-th differential amplifier 915) coupled to the input terminals 1080, 1082 of the next subsequent differential amplifier 915 ((k+1)-th differential amplifier 915) in the active matrix driver 905. In some implementations, an impedance matching network (not shown) can be coupled between each of the differential amplifiers 915. In addition, the output terminals 1084, 1086 of each differential amplifier 915 are coupled to a balanced distribution line 910 that provides a drive signal to a respective transistor 105 in rows 2 through N of the stack 110.

Each balanced distribution line 910 includes a conductive path 920 that couples a first output terminal 1084, 1086 of the differential amplifier 915 to the source/emitter main terminal of a transistor 105 and a conductive path 325 that couples the other output terminal 1084, 1086 of the differential amplifier 915 to the control terminals of the transistor 105. Each source/emitter conductive path 920 includes a capacitance 940 that isolates the remainder of distribution line 910 from the DC potential on the respective source/emitter of terminals of transistors 105. More specifically, the non-inverting output terminal 1086 of the second through N-th differential amplifier 910 is coupled to the control terminal conductive path 925 and the inverting output terminal 1084 of the second through N-th differential amplifier 910 is coupled to the source/emitter conductive path 920. However, the connection of the output terminals 1084, 1086 of the first differential amplifier 915 with the distribution line 910 are swapped. That is, the inverting output terminal 1084 of the first differential amplifier 910 is coupled to the control terminal conductive path 925 and the non-inverting output terminal 1086 of the first differential amplifier 910 is coupled to the source/emitter conductive path 920.

Furthermore, in some implementations, the distribution lines 910 can include an impedance matching network (not shown) to match the impedance of the differential amplifier 915 output terminals 1084, 1086 to the input impedance of the transistors 105.

Differential amplifiers 915 are supplied by two separate DC paths; an ODD and an EVEN path. Odd numbered differential amplifiers 915 (1 through N) are supplied by the ODD path and even numbered differential amplifiers 915 (1 through N) are supplied by the EVEN path. Each DC path is supplied by a source follower circuit 950, 955 and coupled to the high supply 1090 terminal of the highest order (N or N−1) differential amplifier 915 in the respective ODD or EVEN path. More specifically, the high supply terminal 1090 of the N-th differential amplifier 915 is coupled to source follower circuit 950 (the ODD DC path). Whereas, the high supply terminal 1090 of the (N−1)-th differential amplifier 915 is coupled to source follower circuit 955 (the EVEN DC path).

Conductive path 956 couples the low supply terminal of the N-th differential amplifier 915 to the high supply terminal of the next lower order ODD differential amplifier 915 in the active matrix driver 905, specifically, the first differential amplifier 915, in the example shown. The low supply terminal of the first differential amplifier 915 is coupled to a negative DC source.

The low supply terminal of the (N−1)-th (here the second) differential amplifier 915 is coupled to ground in the example shown. However, in a larger active matrix driver 905 stack the low supply terminal of the (N−1)-th differential amplifier 915 can be coupled to the high supply terminal next lower order even differential amplifier 915 by a conductive path.

Source follower 950 includes a pair of matched transistors 952 that each are coupled between a high drain-side potential and a low source-side potential. The high drain-side potential (terminal 960) is coupled to the RF collection rail 120. The low source-side potential is coupled between impedances 965a and 965b of a voltage divider circuit. The voltage divider circuit is created by impedances 965a, 965b, and 965c also coupled to the terminal 960 and the RF collection rail 120. The impedances 965a, 965b, and 965c divide the RF output voltage from the collection rail 120 to bias the control terminals of transistors 952, which are coupled to the voltage divider circuit between impedances 965a and 965b. The source terminals of the transistors 952 are coupled to the voltage divider circuit between impedances 965a and 965b through a capacitance 954a and to the low supply terminal of the N-th differential amplifier 915. The capacitance 954a isolates the low supply terminal of the N-th differential amplifier 915 from the DC potential on the RF collection rail 120.

Source follower 955 includes a transistor 953 that is coupled between a high drain-side potential and a low source-side potential. The high drain-side potential is coupled to voltage divider circuit between impedances 965a and 965b and to the source terminals of transistors 952. The low source-side potential is coupled between impedances 965b and 965c of the voltage divider circuit. The source terminal of transistor 953 is coupled to the voltage divider circuit between impedances 965b and 965c through a capacitance 954b and to the low supply terminal of the (N−1)-th differential amplifier 915. The capacitance 954b isolates the low supply terminal of the (N−1)-th differential amplifier 915 from the DC potential on the RF collection rail 120.

The source followers 950, 955 are supplied by the RF output signal of the matrix power amplifier 900 through the RF collection rail 120. Thus, all of the high and low supply terminals of the differential amplifiers 915 are under floating AC potential, and can accommodate the full RF voltage output swing of the corresponding transistors 105 in the stack 110.

Figure 11:
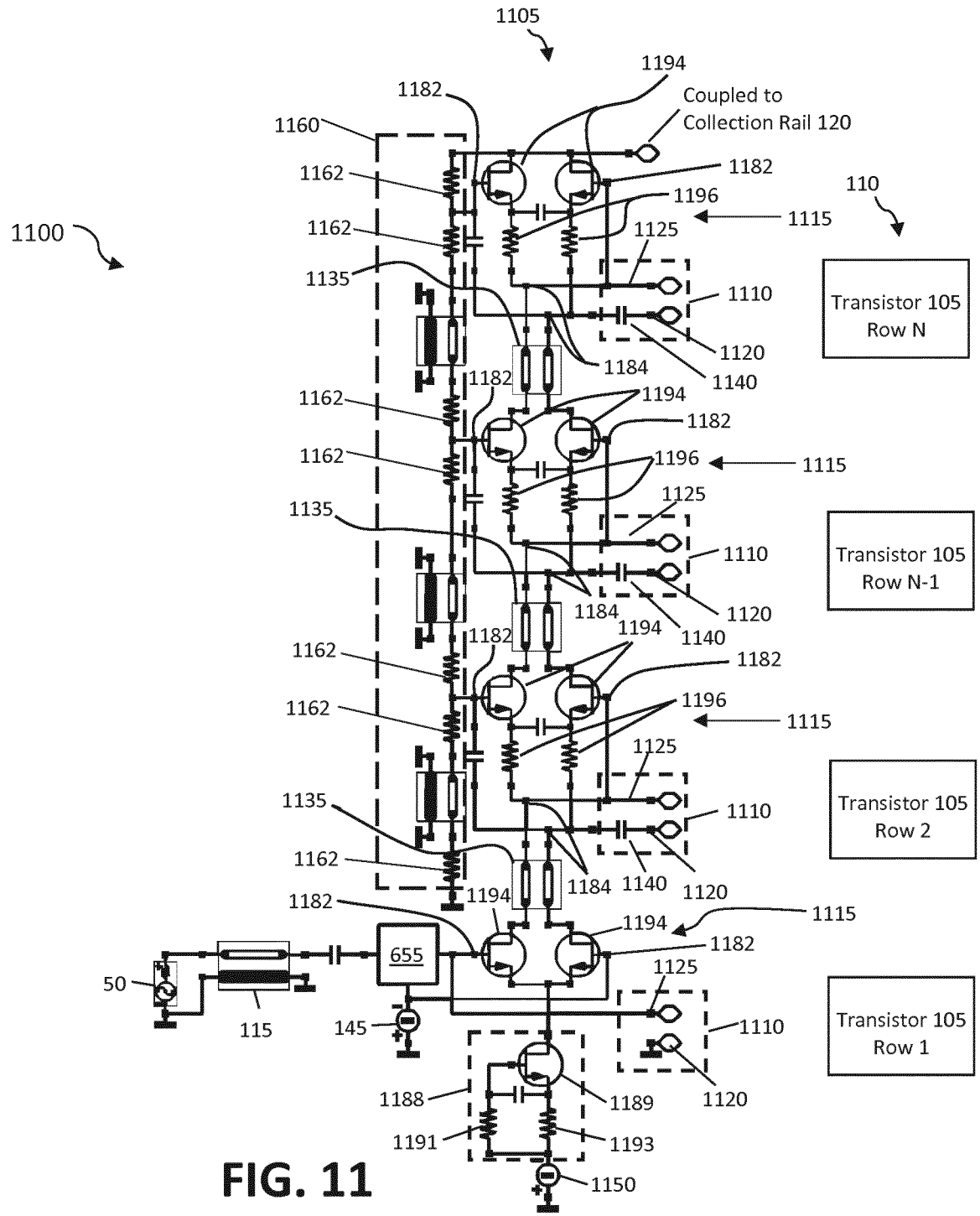
FIG. 11 is a schematic representation of a balanced active matrix driver for a row-matched matrix power amplifier.

FIG. 11 is a schematic representation of a balanced active matrix driver 905 for a row-matched matrix power amplifier 1100. For the sake of convenience, only a single transistor stack 110 of FIG. 1 (and hence a single transistor 105 column) of matrix power amplifier 1100 is illustrated. However, it is to be understood that matrix power amplifier 1100 can include a number of rows and columns that is tailored to operational needs, including output impedance and amplification.

The balanced active matrix driver 1105 distributes signals generated by signal source 50 to a collection of balanced distribution lines 1110. Each distribution line 1110 couples a respective portion of the drive signal to transistors 105 in different stacks 110. Once again, only a single transistor stack 110 is illustrated in the schematic representation of matrix power amplifier 1100 although an operational matrix power amplifier 1100 will include multiple stacks 110.

The balanced active matrix driver 1105 includes a set of stacked differential amplifiers 1115. The first differential amplifier 1115 and the transistor 105 in the bottom row (the first row) of the stack are simultaneously driven by the signal source 50. Each k-th differential amplifier 1115 in the active matrix driver 1105 then drives the (k+1)-th transistor 105 in stack 110.

Differential amplifiers 1115 each include a pair of matched transistors 1194 that each are coupled between a high drain-side potential and a low source-side potential. Only the first differential amplifier 1115 includes a current source 1188. Except for the N-th differential amplifier 1115, the high drain-side potential for each k-th differential amplifier 1115 is supplied by the low-source side potential of the (k+1)-th differential amplifier 1115. The high drain-side potential for the N-th differential amplifier 1115 is supplied by the RF collection rail 120. Similarly, except for the first differential amplifier 1115, the low source-side potential for each k-th differential amplifier 1115 is supplied by the high-source side potential of the (k−1)-th differential amplifier 1115. The low source-side potential for the first differential amplifier 1115 is supplied by the DC supply 1150. Thus, the differential amplifiers 1115 are stacked such that the DC current through the first differential amplifier 1115 is reused by each differential amplifier in the active matrix driver 1105.

The differential amplifiers 1115 in the active matrix driver 1105 are coupled together through balanced distribution lines 1135. In some implementations, an impedance matching network (not shown) also can be coupled between each of the differential amplifiers 1115. In addition, the output terminals 1184 of each differential amplifier 1115 (except those of the N-th differential amplifier 1115) are coupled to a balanced distribution line 1110 that provides a drive signal to a respective transistor 105 in rows two through N of the stack 110.

Each balanced distribution line 1110 includes a conductive path 1120 that couples a first output terminal 1184 of the differential amplifier 1115 to the source/emitter main terminal of a transistor 105 and a conductive path 1125 that couples the other output terminal 1184 of the differential amplifier 1115 to the control terminal of the transistor 105. Each source/emitter conductive path 1120 includes a capacitance 1140 that isolates the remainder of distribution line 1110 from the DC potential on the respective source/emitter of terminals of transistors 105. Furthermore, in some implementations, the distribution lines 1110 can include an impedance matching network (not shown) to match the impedance of the differential amplifier 1115 output terminals 1084, 1086 to the input impedance of the transistors 105.

In addition, the control terminals of the transistors 1194 (inputs terminals 1182 of the differential amplifiers 1115) are coupled output terminals 1184 of each preceding, (k−1)-th, differential amplifier 1115. The potential drop across each set of impedances 1196 is used to drive the input (control terminals of transistors 1194) of each differential amplifier 1115, except for the first differential amplifier 1115. The control terminal of the first of the transistors 1194 in the first differential amplifier 1115 is driven by the RF source 50 and the control terminal of the second of the transistors 1194 is biased with a DC potential from DC source 145. The control terminal of the first of the transistors 1194 in the first differential amplifier 1115 is coupled to the RF source 50 through an impedance matching network 1130.

As shown, the sources of transistors 1194 of the first differential amplifier 1115 are coupled together and share a common path to the current source 1188. The impedance between both output terminals 1184 and current source 1188 is thus nearly identical except for the relatively small differences in the impedance of transistors 1194. The first differential amplifier 1115 can thus act as a balun and convert the unbalanced RF source signal into a balanced output.

Furthermore, the control terminal of one of the transistors 1194 of each of the differential amplifiers 1115 two through N is biased by a portion of the RF output signal from RF collection rail 120. A voltage divider circuit 1160 created by the network of impedances 1162 divides the voltage of the RF output signal.

Current source 1188 provides the DC current for all of the differential amplifiers 1115 in the active matrix driver 1105. Current source 1188 includes a transistor 1189 that supplies the current through differential amplifiers 1115. The control terminal of transistor 1189 is biased by the DC source 1150 through impedance 1191. In addition, the source terminal of transistor 1189 is coupled to DC source 1150 through impedance 1193.

Figure 12:
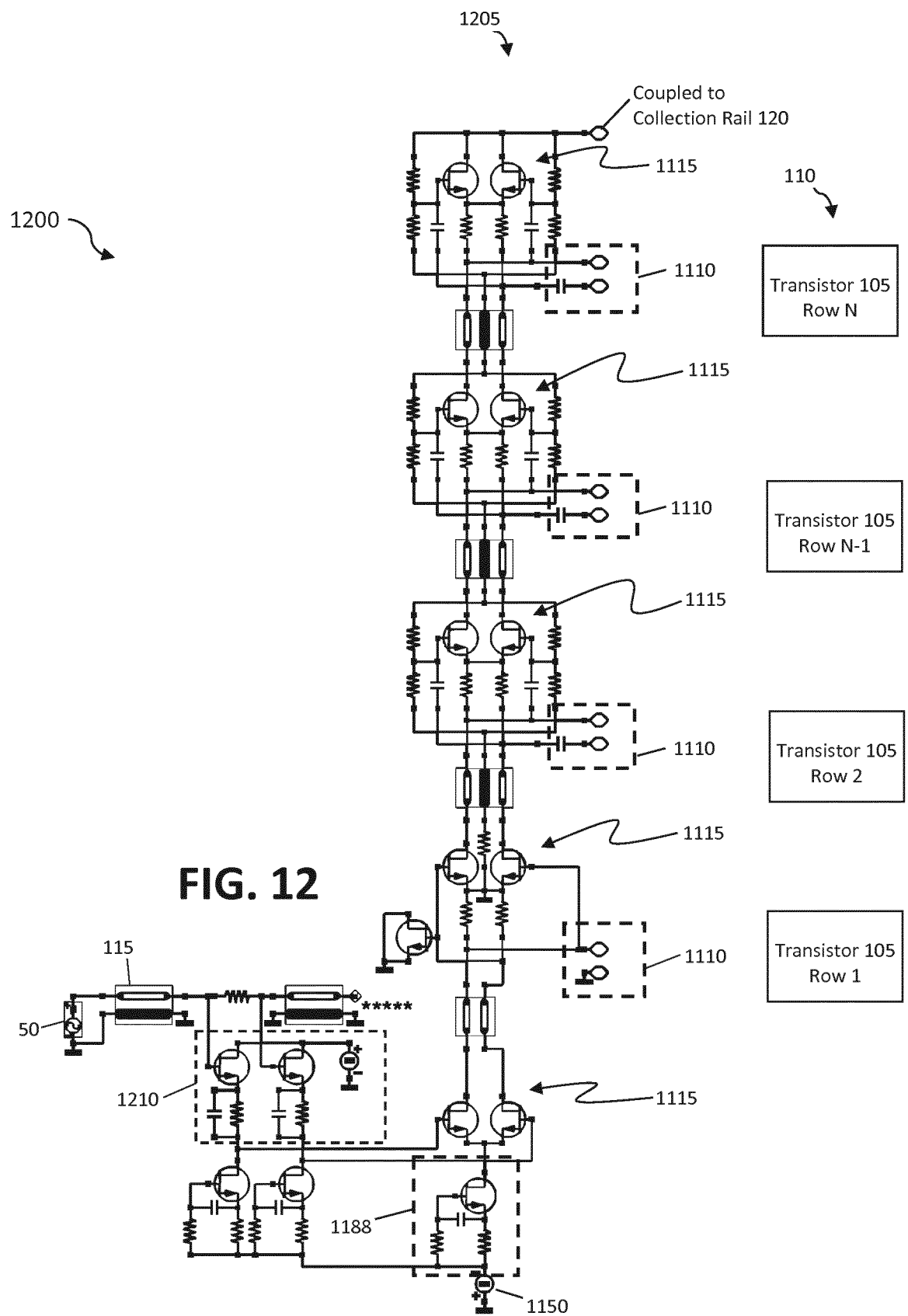
FIG. 12 is a schematic representation of a balanced active matrix driver for a row-matched matrix power amplifier.

FIG. 12 is a schematic representation of a balanced active matrix driver 1205 for a row-matched matrix power amplifier 1200. For the sake of convenience, only a single transistor stack 110 (and hence a single transistor 105 column) of matrix power amplifier 1200 is illustrated. However, it is to be understood that matrix power amplifier 1200 can include a number of rows and columns that is tailored to operational needs, including output impedance and amplification. Balanced active matrix driver 1205 is similar to balanced matrix driver 1105 described above in reference to FIG. 11, except that the first row transistor 105 is not driven directly by the RF signal from RF source 50. Instead, matrix driver 1205 includes an additional differential amplifier 1115. The RF source 50 only drives the first differential amplifier 1115 through a set of source follower circuits 1210. As shown, the source followers 1210 can be combined with a resistance that acts as a DC potential shifter to shift the zero DC level of the RF source to the negative gate voltage required by the FET pair in the bottom-most differential amplifier that operates at negative DC voltages below the gate voltage potential of the lowest row of the matrix amplifier. Alternatively, a diode chain can be used as such a DC potential shifter.

Figure 13:
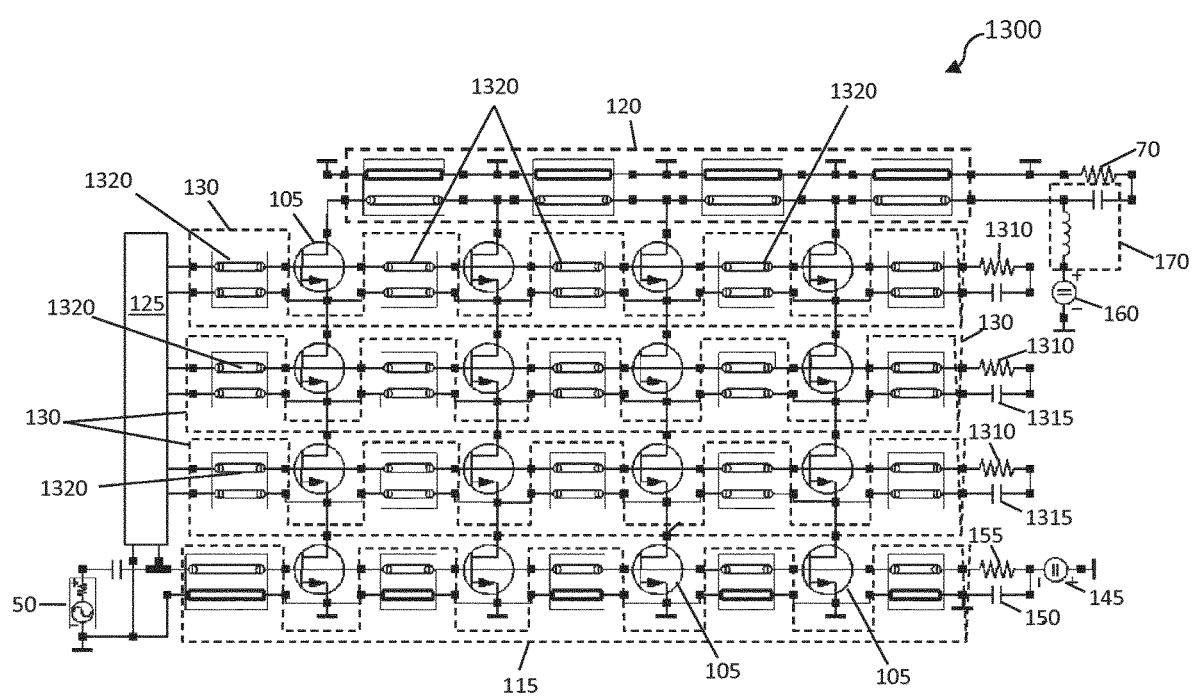
FIG. 13 is a schematic representation of a row-matched matrix power amplifier.

FIG. 13 is a schematic representation of a row-matched matrix power amplifier 1300. In the illustrated implementation, each row distribution line 130 is implemented as a balanced two conductor transmission-line that terminates in a real impedance 1310 and a capactive impedance 1315. The first conductor of the transmission-line is formed by a series of conductors 1320 that each couple to respective control terminals of transistors 105 of a row 137. The second conductor of the transmission-line is formed by a series of conductors 1325 that couple to the source/emitter main terminals of transistors 105 in the same row 137. Conductors 1320, 1325 are dimensioned to delay the arrival of drive signals at the control terminals of transistors 105 so that current conduction by transistors 105 in matrix power amplifier 1300 is coordinated. In particular, the current signals of the transistors 105 in each row 137 are collected in a column-wise manner in the common collection rail 120 with delays that match the corresponding delays on the row distribution lines 130. The values of impedances 1310, 1315 are configured to set the impedance of row distribution line 130 so that a drive signal is appropriately coupled thereto from matrix driver 125. As discussed previously, matrix driver 125 can be an active or passive driver that provides ground-free outputs for each row distribution line 130.

In power amplifier 1300, artificial LC or distributed transmission lines are used. This implementation can be used as feeders for the bottom input line and for driving the input of the upper rows. The input of the bottom row and the output of the top row can be the same as the input and output of the driver lines, respectively, of a Field-effect Transistor (FET) or Bipolar Junction Transistor (BJT) distributed amplifier or a non-uniform distributed power amplifier (NDPA) structure. Symmetric (e.g., ground-free) feeder networks are used for the input lines of the second and upper rows. The input rails of the upper rows are driven by a passive or active driver/feeder network that provides symmetric (e.g., ground-free) outputs for the individual rows.

Figure 14:
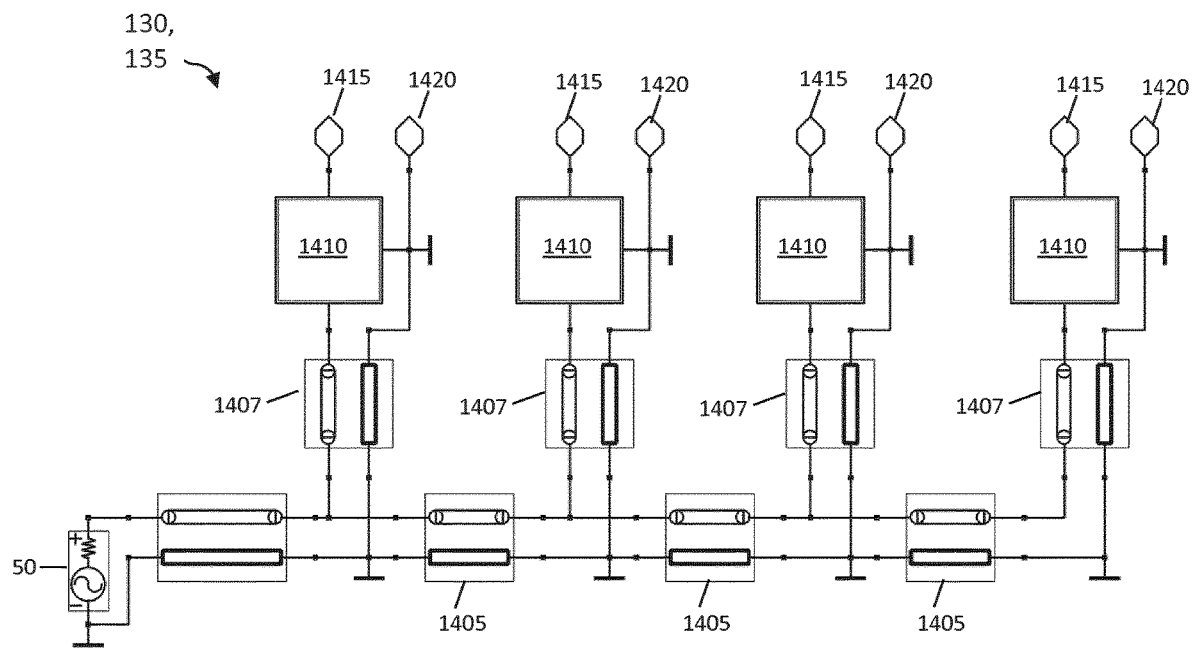
FIG. 14 is a schematic representation of a distribution line and an impedance matching element that can be coupled to distribute a signal from signal source to a row of transistors.

FIG. 14 is a schematic representation of a distribution line 130 and an impedance matching element 135 that can be coupled to distribute a signal from signal source 50 to a row of transistors 105. The illustrated implementation of distribution line 130 and impedance matching element 135 includes a collection of column-to-column conductors 1405, stack conductors 1407, and impedance matching elements 1410.

Each impedance matching element 1410 is associated with a respective stack 110 and includes a control terminal output 1415 and a main terminal output 1420. Control terminal outputs 1415 are to be coupled to a respective control terminal of a transistor 105 in the associated stack 110. Main terminal outputs 1420 are to be coupled to a respective main terminal of the same transistor 105 in the associated stack 110. Each impedance matching element 1410 can nominally match the input impedance of the transistors 105 to a reference impedance ZL of the source. In some implementations, this impedance can be raised, e.g. to 2*ZL. This can be done, e.g., using quarter-line transformers, line-capacitors, or discrete LC transformers.

Each stack conductor 1407 is associated with a respective stack 110. Column-to-column conductors 1405 are coupled between the stack conductors 1407 that are associated with adjacent stacks 100. Stack conductors 1407 and column-to-column conductors 1405 are dimensioned to delay the arrival of drive signals at the control terminals of the transistors 105 in each stack so that current conduction by transistors 105 in the matrix power amplifier is coordinated. In the illustrated implementation, stack conductors 1407 and column-to-column conductors 1405 are unbalanced conductors and—together with main terminal outputs 1420—are coupled to a reference potential. In the illustrated implementation, this reference potential is ground.

This combination of column-to-column conductors 1405, stack conductors 1407, and impedance matching elements 1410 can be referred to as a "cascaded line and prematch" topology. In particular, conductors 1405, 1407 are cascaded to distribute the drive signal to coordinate current conduction in the difference stacks 110. Impedance matching elements 1410 ensure that a sufficiently large portion of the drive signal is coupled into the transistors 105 in each stack 110. Such a distribution line 130 and an impedance matching element 135 can be particularly advantageous in microwave integrated circuit implementations, including planar monolithic implementations. In particular, due to the limited area available for distribution line 130 and an impedance matching element 135, the ability to implement a compact "cascaded line and prematch" topology using semiconductor fabrication techniques can be advantageous.

In some implementations, a corresponding "cascaded line and prematch" topology can be used to form either or both of distribution rail 115 and common collection rail 120. For example, the bottommost transistor 105 in each stack 110 can be coupled to a respective impedance matching element and the signal passing column-to-column conductors 1405 and stack conductors 1407 suitably delayed to coordinate current conduction through the stacks in response to the signal output from source 50. As another example, the uppermost transistor 105 in each stack 110 can be coupled to a respective impedance matching element and the current passing through these uppermost transistor 105 suitably delayed using stack conductors and column-to-column conductors for delivery to the load 70.

Figure 15:
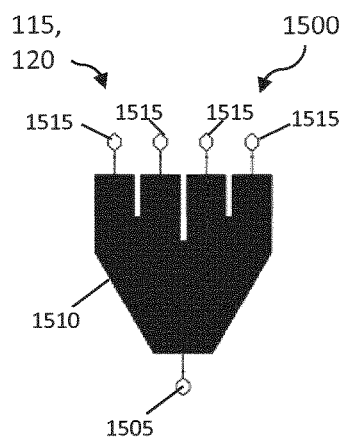
FIGS. 15 and 16 are schematic representations of passive dividers/combiners that can be used to implement all or a portion of a distribution rail and a common collection rail.
Figure 16:
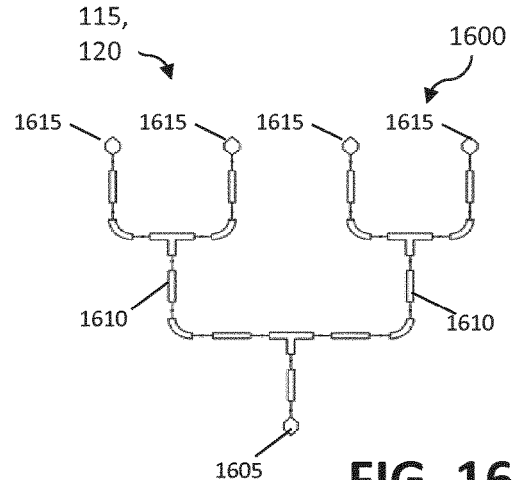

FIGS. 15 and 16 are schematic representations of passive dividers/combiners 1500, 1600 that can be used to implement all or a portion of distribution rail 115 and common collection rail 120. In the illustrated implementations, dividers/combiners 1500, 1600 each include a respective root terminal 1505, 1605, a trunk portion 1510, 1610, and a collection of branch terminals 1515, 1615.

When dividers/combiners 1500, 1600 are part of distribution rail 115, root terminals 1505, 1605 act as inputs to be coupled to receive a signal from source 50 and branch terminals 1515, 1615 act as outputs to distribute that signal to the drive terminals of the bottommost transistor 105 in each stack. When dividers/combiners 1500, 1600 are part of collection rail 120, root terminals 1505, 1605 act as outputs to load 70 and branch terminals 1515, 1615 act as inputs to receive the currents conducted through respective of stacks 110. Trunk portions 1510, 1610 couple the root terminals and branch terminals and provide symmetric passive M-to-1 or 1-to-M coupling.

In some implementations, dividers/combiners 1500, 1600 are used in conjunction with impedance matching elements. However, this is not necessarily the case. For example, dividers/combiners 1500, 1600 can be used in matrix power amplifiers that include "bootstrapping" row driver topologies (e.g., FIGS. 4-8) without impedance matching elements.

Figure 17:
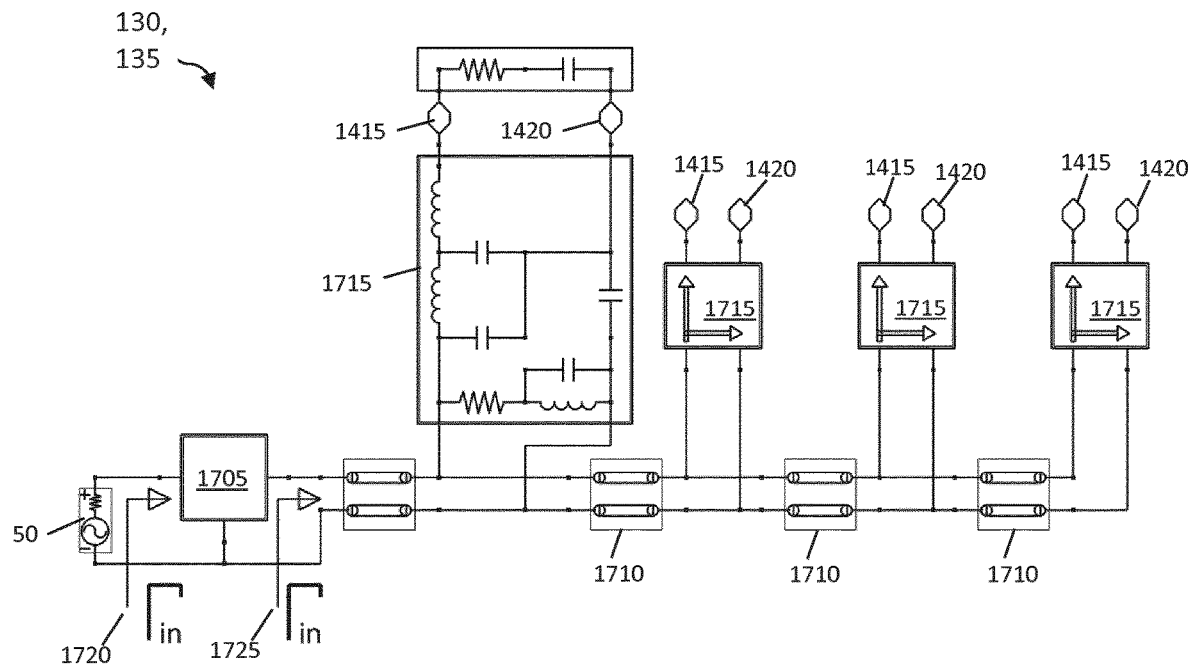
FIG. 17 is a schematic representation of a distribution line and impedance matching element that can be coupled to distribute a signal from signal source to a row of transistors.

FIG. 17 is a schematic representation of a distribution line 130 and impedance matching element 135 that can be coupled to distribute a signal from signal source 50 to a row of transistors 105. In general, the row of transistors 105 into which distribution line 130 and impedance matching element 135 distribute a signal will be one of the higher rows of a matrix rather than a bottom row. However, in some implementations, distribution line 130 and impedance matching element 135 may also be used to distribute a signal to a bottom row of a matrix amplifier. The illustrated implementation of distribution rail 115 includes a global input impedance matching element 1705, column-to-column conductors 1710, and local impedance matching elements 1715.

Global input impedance matching element 1705 is a device that matches the input impedance 1725 of a chain of transmission lines 1710 and impedance matching elements 1715 to the input impedance 1720 of matching element 1705 seen by source 50. In some implementations, global input impedance matching element 1705 can directly match a reference impedance "ZL" for high frequency input and can force match an impendence of a multiple of the reference impedance, i.e., "M*ZL", where "M" is the total number of cells in the row and the number of columns in the matrix, for low frequency input. In some implementations, global input impedance matching element 1705 can be implemented as a diplexer.

Each local impedance matching element 1715 is associated with a respective stack 110 and includes a control terminal output 1415 and a main terminal output 1420. Control terminal outputs 1415 are to be coupled to a respective control terminal of transistor 105 in the associated stack 110. Main terminal outputs 1420 are to be coupled to a respective main terminal of the same transistor 105 in the associated stack 110.

Column-to-column conductors 1710 and local impedance matching elements 1715 together define portions of the signal from source 50 that are input into each of the active cells 105. In some implementations, the conductors 1710 and impedance matching elements 1715 together define a characteristic impedance of "ZL" at the end of the row (to the right in the schematic representation of FIG. 17) and a characteristic impedance of "ZL/k" for every active cell 105, where "k" is the position of the bottommost active cell 105 in bottom row 138 of the matrix. Thus, the first active cell 105 in the bottom row will have a characteristic impedance of "ZL/M," where "M" is the total number of cells in the row and the number of columns in the matrix. In the implementation shown in FIG. 17, M is equal to 4. This implementation can be referred to as a "parallel line feed and match" topology.

As a result, at high frequencies, the input impedance at the beginning of the row is ZL/M. At low frequencies, the input impedance is ZL. In some implementations, an additional matching network for high frequencies can be used and the high-frequency input impedance can be raised, e.g., from ZL/M to ZL.

Figure 18:
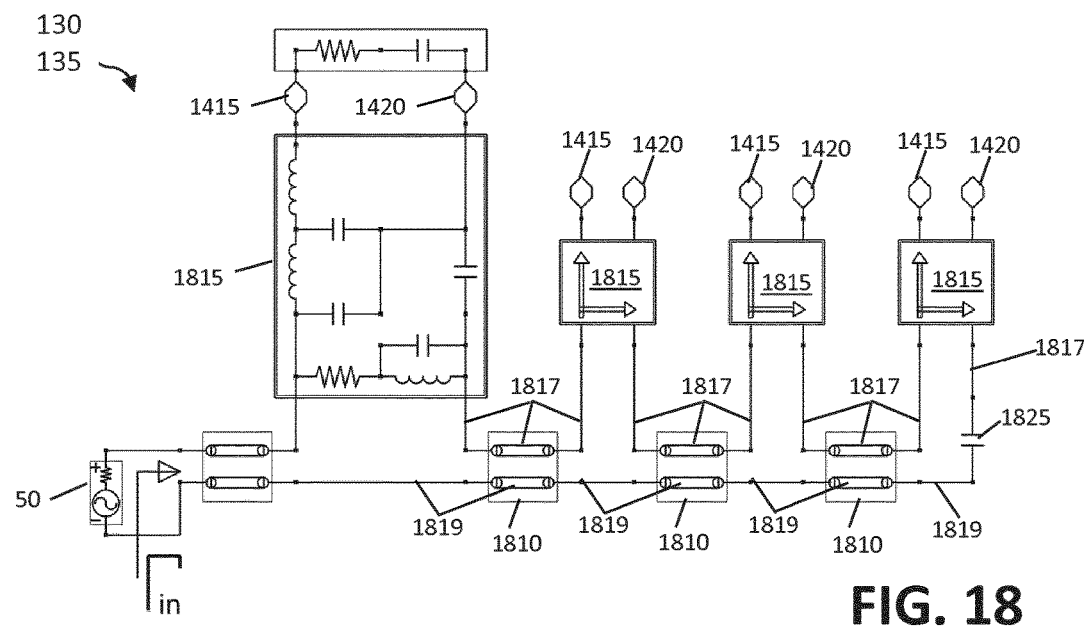
FIG. 18 is a schematic representation of a distribution line and impedance matching element that can be coupled to distribute a signal from signal source to a row of transistors.

FIG. 18 is a schematic representation of a distribution line 130 and impedance matching element 135 that can be coupled to distribute a signal from signal source 50 to a row of transistors 105. In the illustrated implementation, the row of transistors 105 into which distribution line 130 and impedance matching element 135 distribute a signal will be one of the higher rows of a matrix rather than a bottom row. The illustrated implementation of distribution rail 115 includes a collection of column-to-column conductors 1810 and impedance matching elements 1815.

Each impedance matching element 1815 is associated with a respective stack 110 and includes a control terminal output 1415 and a main terminal output 1420. Control terminal outputs 1415 are to be coupled to a respective control terminal of a transistor 105 in the associated stack 110. Main terminal outputs 1420 are to be coupled to a respective main terminal of the same transistor 105 in the associated stack 110.

Column-to-column conductors 1810 connect impedance matching elements 1815 (and hence the input paths of respectively associated transistors 105) in series. In particular, a conductive path 1817 passes through each of the impedance matching elements 1815 and the signals conducted along conductive path 1817 return to signal source 50 via a return line 1819. In the illustrated implementation, conductive path 1817 and return line 1819 are separated by a capacitance 1825 that blocks DC signals from returning to signal source 50. In other implementations, capacitor 1825 can be omitted and conductive path 1817 and return line 1819 are directly connected.

Each impedance matching element 1815 couples a portion of the signal on conductive path 1817 into a respective transistor 105 in the associated stack 110. The impedances presented by impedance matching elements 1815 depend on the position of impedance matching elements 1815 along conductive path 1817. In particular, the impedance matching element 1815 at the end of conductive path 1817 (to the right in the illustrated representation) presents a characteristic impedance of ZL/M, where M is the number of columns in the matrix. Other impedance matching elements 1815 present a characteristic impedance of "ZL/k," where "k" is the position of the impedance matching element 1815 along conductive path 1817. In the illustrated representation, "k" is equal to one for the leftmost impedance matching element 1815, "k" is equal to two for the impedance matching element 1815 that is second from the left, etc. Therefore, the impedance 1820 seen from the source 50 into the entire matching and distribution subcircuit 130, 135 is matched to ZL. As a result, for the $k^{th}$ transistor 105 in a row, the DC feed is provided through the series-connected "forced matching" impedances to the left of the $k^{th}$ transistor 105. Accordingly, this implementation can be referred to as a "series line feed and match" topology.

In some implementations, impedance matching elements 1815 are implemented as diplexers or other structures that directly match the impedance ZL/M at high frequencies or force a match at low frequencies.

Figure 19:
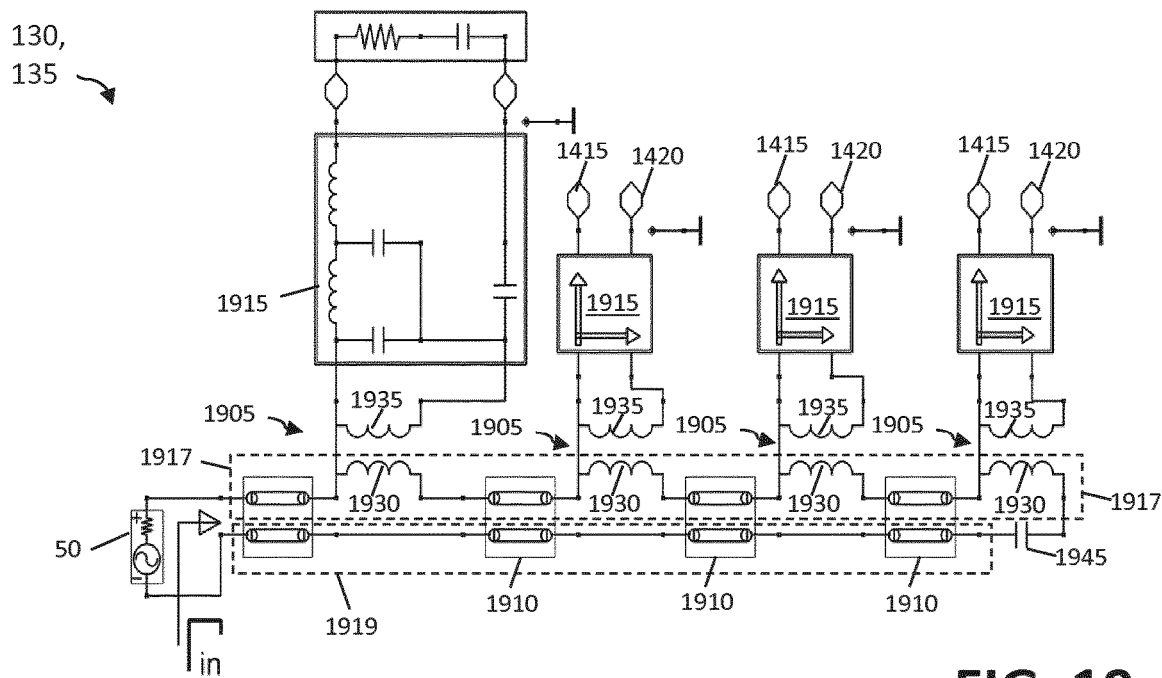
FIG. 19 is a schematic representation of a distribution line and impedance matching element that can be coupled to distribute a signal from signal source to a row transistors.

FIG. 19 is a schematic representation of a distribution line 130 and impedance matching element 135 that can be coupled to distribute a signal from signal source 50 to a row transistors 105. The illustrated implementation of distribution line 130 and impedance matching element 135 includes a collection of transformers 1905, column-to-column conductors 1910, and impedance matching elements 1915.

Each impedance matching element 1915 is associated with a respective stack 110 and includes a control terminal output 1415 and a main terminal output 1420. Control terminal outputs 1415 are to be coupled to a respective control terminal of a transistor 105 in the associated stack 110. Main terminal outputs 1420 are to be coupled to a respective main terminal of the same transistor 105 in the associated stack 110.

Transformers 1905 each include a first winding 1930 and a second winding 1935. First windings 1930 and one of the conductors of column-to-column conductors 1910 are coupled in series to form a conductive path 1917. The other of the conductors of column-to-column conductors 1910 are coupled together to form a return line 1919. In the illustrated implementation, conductive path 1917 and return line 1919 are separated by a capacitance 1945 that blocks DC signals from returning to signal source 50. In other implementations, capacitor 1825 can be omitted and conductive path 1917 and return line 1919 directly connected. Transformers 1905 enable a direct DC input feed for each active cell 105 of the row even without the forced-matching serial resistances in the input DC path (such as shown in FIG. 18).

In some implementations, the circuitry schematically represented in FIG. 19 can also include a DC decoupling resistance, such as impedance 155 (FIG. 1). In these cases, the circuitry can be used as a distribution rail 115 to distribute a signal from a signal source 50 to the bottommost transistors 105 in each of stacks 110. In some of these implementations, the source/emitter main terminals of the bottommost transistors 105 can be coupled to ground rather than to main terminal output 1420.

Figure 20:
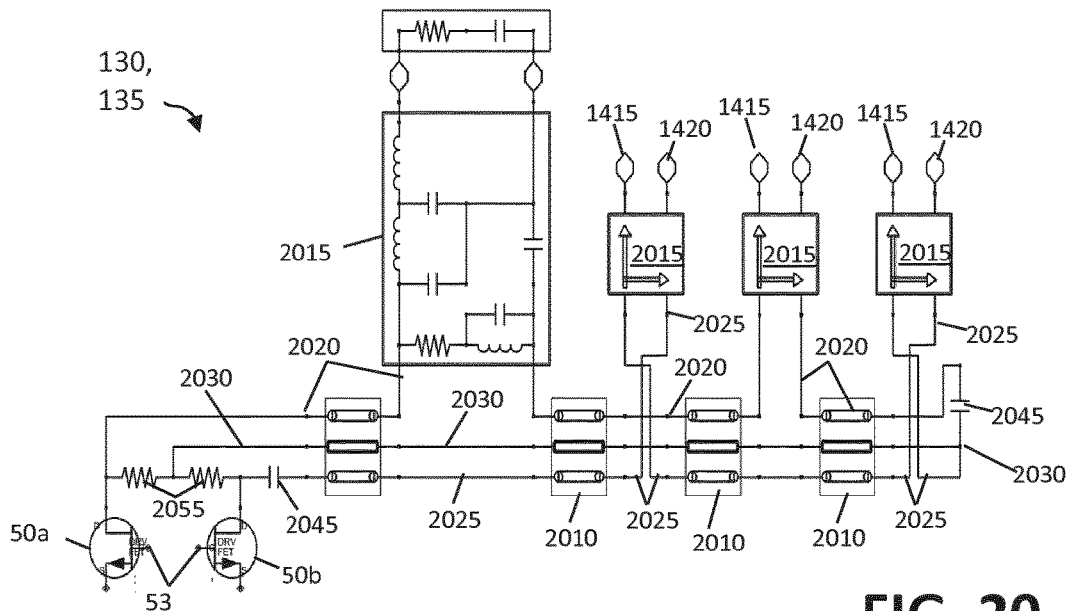
FIG. 20 is a schematic representation of a distribution line and impedance matching element that can be coupled to distribute signals from pair of signal sources to a row of transistors.

FIG. 20 is a schematic representation of a distribution line 130 and impedance matching element 135 that can be coupled to distribute signals from pair of signal sources 50a, 50b to a row of transistors 105. The illustrated implementation of distribution line 130 and impedance matching element 135 includes a collection of three-conductor column-to-column conductors 2010 and impedance matching elements 2015.

In the illustrated implementation, signal sources 50a, 50b are a matched pair field effect transistors. A balanced control signal is input into both control terminals 53 of signal sources 50a, 50b. A first main terminal of signal source 50a (i.e., the drain terminal in the illustrated implementation) is coupled to a first conductor 2020 of column-to-column conductors 2010. A first main terminal of signal source 50b (i.e., the drain terminal in the illustrated implementation) is coupled to a second conductor 2025 of column-to-column conductors 2010. The third conductor 2030 of column-to-column conductors 2010 is a common return line. One end of third conductor 2030 is coupled to each of the first main terminal of signal source 50a and the first main terminal of signal source 50b—as well as conductors 2020, 2025—by a respective resistance 2055. In the illustrated implementation, the other end of third conductor 2030 is coupled to each of conductors 2020, 2025 by a respective capacitance 2045 that blocks DC signals from returning to signal sources 50a, 50b.

In each conductor 2020, 2025, alternate one of impedance matching elements 2015 (and hence the respectively associated transistors 105) are coupled in series. In particular, conductor 2020 forms a conductive path that passes through every other impedance matching element 2015 (namely, the first and the third in the illustrated implementation). Conductor 2025 forms a conductive path that passes through every other impedance matching element 2015 (namely, the second and the fourth in the illustrated implementation). Conductor 2020 thus distributes the drive signal generated by signal source 50a to one half of the active elements 105 in the row, whereas conductor 2025 distributes the drive signal generated by signal source 50b to the other half of the active elements 105 in the row.

As with the "series line feed and match" topology of FIG. 18, each impedance matching element 2015 couples a portion of the signal on the respective of conductors 2020, 2025 into a respective transistor 105 in the associated stack 110. The impedances presented by impedance matching elements 2015 depend on the position of impedance matching elements 2015 along conductors 2020, 2025. In particular, the impedance matching element 2015 at the end of conductor 2020 (to the right in the illustrated representation) presents a characteristic impedance of ZL/M/2, where M is the total number of columns in the matrix. Other impedance matching elements 2015 present a characteristic impedance of "ZL/k," where "k" is the position of the impedance matching element 2015 along the respective of conductors 2020, 2025. In the illustrated representation, "k" is equal to one for both the leftmost and the second-leftmost impedance matching elements 2015 since those impedance matching elements 2015 are along different of conductors 2020, 2025. As a result, the DC feed is provided through a reduced number of series-connected "forced matching" impedances to the left of each transistor 105, hence reducing DC series feed resistance for each individual active cell. Accordingly, this implementation can be referred to as a "series line feed and match with full-symmetrical lines" topology.

Although the illustrated implementation of the "series line feed and match with full-symmetrical lines" topology is shown with two signal sources 50a, 50b and two conductor 2020, 2025, in other implementations, more than two signal sources and/or more than two conductors can be used to provide a drive signal to the active cells 105 in a single row.

Figure 21:
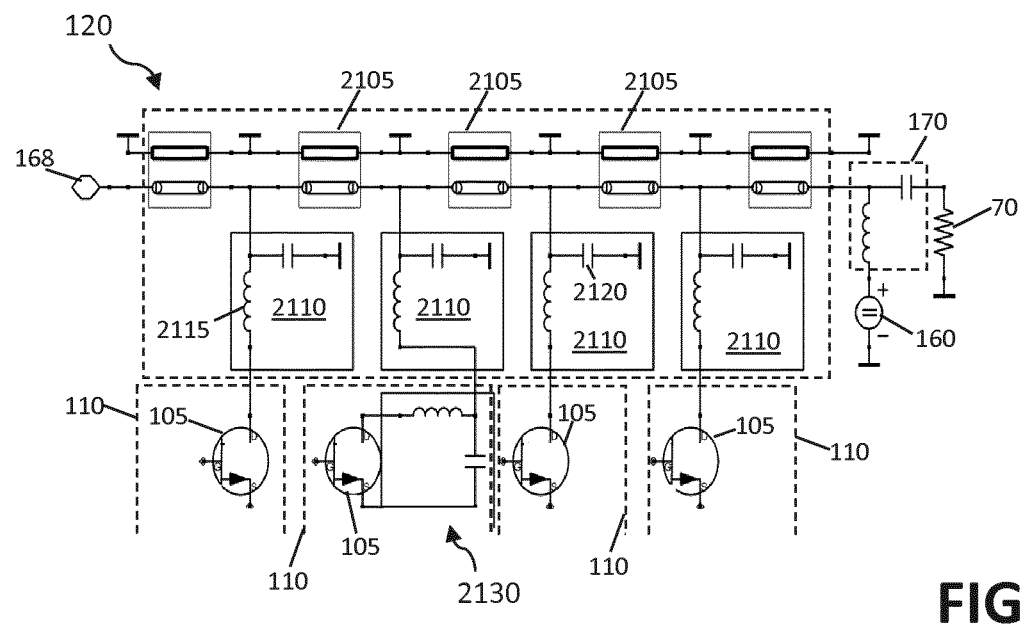
FIG. 21 is a schematic representation of an unbalanced collection rail that is coupled to collect the signals passing through M columns of a matrix power amplifier and direct them to a load.

FIG. 21 is a schematic representation of an unbalanced collection rail 120 that is coupled to collect the signals passing through M columns of a matrix power amplifier and direct them to a load 70. For the sake of convenience, only the uppermost row of transistors 105 of four stacks 110 is illustrated. The illustrated implementation of collection rail 120 includes a collection of column-to-column conductors 2105 and impedance matching elements 2110.

Each impedance matching element 2110 is associated with a respective stack 110 and, in the illustrated implementation, includes an inductance 2115 and a capacitance 2120. The magnitude of the components forming matching elements 2110 can be configured, e.g., to compensate for the effective output capacitance of each respective stack 110. In other implementations, impedance matching elements 2110 can be omitted and the output of each respective stack 110 can be coupled directly to respective of column-to-column conductors 2105.

In the illustrated unbalanced implementation of a collection rail 120, each column-to-column conductor 2105 includes a grounded wire and an ungrounded wire. The ungrounded wires are coupled in series and to the outputs of stacks 110. In the illustrated orientation, the leftmost column-to-column conductor 2105 has an impedance of N*ZL, where N is the number of rows in the matrix. Continuing from the left, the $k^{th}$ column-to-column conductor 2105 has an impedance of N*ZL/k, where N is the number of rows in the matrix, and the final N-th line has the impedance N*ZL/M, where M is the number of columns in the matrix. The line lengths of lines 2105 are dimensioned to match the delay between input or output signals of adjacent stacks 110. For example, when unbalanced collection rail 120 is used in a matrix amplifier in conjunction with a distribution line 130 and impedance matching element 135 such as shown in FIG. 18, the line lengths of lines 2105 are dimensioned to match the delays associated with respective portions of conductive path 1817. One terminus of the series-connected ungrounded wires is coupled to the combined port of high power bias tee 170. The high frequency port of bias tee 170 is coupled to load 70 and the low frequency port is coupled to DC source 160. The ungrounded wires are thus biased by DC source 160 which supplies the "matrix drain/collector voltage" (i.e., the number of rows N times the drain/collector voltage of the individual cells or N*VDD) to the individual cells of the top row via the series-connected ungrounded wires of collection rail 120. The load resistance value is RL=N/M*R_Cripps, and the reference impedance value ZL is equal to the load resistance value RL. "R_Cripps" is the optimum load resistance of the individual FET/BJT cell—either for power, or power-added efficiency, or some compromise therebetween.

In the illustrated implementation, the top active cell in one stack 110 includes an output prematch network 2130. Output prematch network 2130 is an optional component and, in general, will be deployed for either the top active cell in every stack 110 of the matrix amplifier or for every cell of the matrix amplifier. Each output prematch network 2130 is configured to match the output of a respective cell in the matrix to the impedance seen by that cell so that the power output is high and a high power added efficiency is achieved. In general, it is desirable that the power added efficiency is as high as possible. In the context of a collection rail 120, each output prematch network 2130 on the top active cell of the stack 110 is configured to match the impedance seen by that cell on collection rail 120. This implementation of collection rail 120 can be referred to as a "special" non-uniform distributed power amplifier (NDPA) topology. In particular, the illustrated implementation of collection rail 120 is "special" in that all active cells have approximately the same cell size, which contrasts with classical NDPA in which cell size varies to improve matching. In the special NDPA, nearly equal active cell sizes are possible because the characteristic impedances of the output lines are divided by the stacking factor N. Since the active cell sizes are nearly equal, implementation in planar integrated technology is facilitated.

Figure 22:
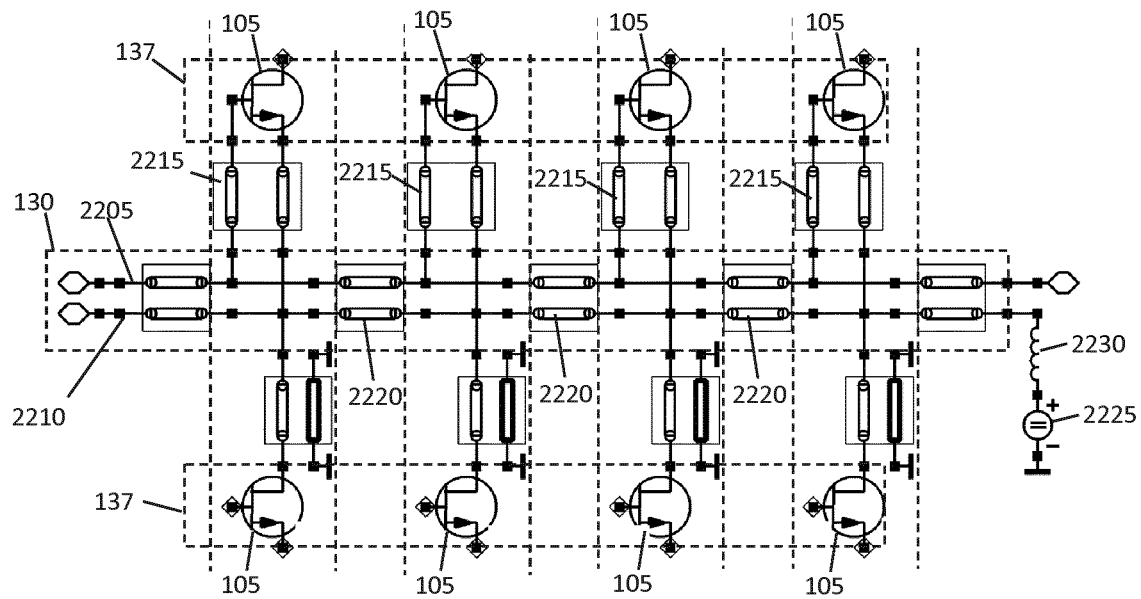
FIGS. 22 and 23 are schematic representations of a pair of rows within a matrix power amplifier.
Figure 23:
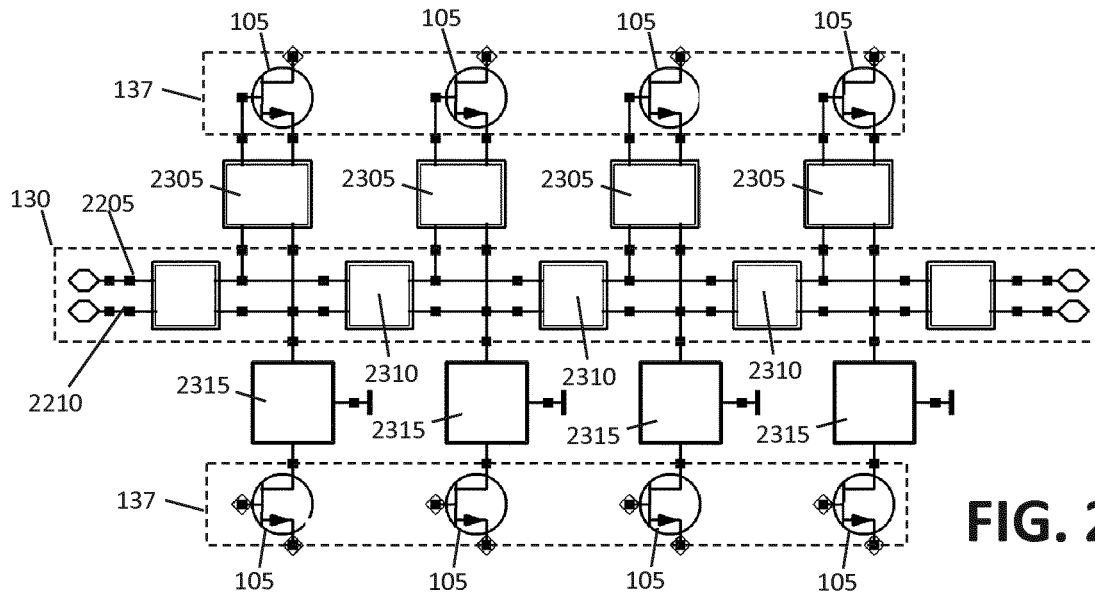

FIGS. 22 and 23 are schematic representations of a pair of rows 137 within a matrix power amplifier. Distribution lines 130 are coupled to the control terminals of the transistors 105 in each row 137. Although only a pair of rows 137 and a single distribution line 130 are illustrated, a complete matrix power amplifier can have several additional rows and distribution lines.

The illustrated distribution line 130 is implemented as a balanced two conductor transmission-line and includes a control signal line 2205 and a main signal line 2210. Control signal line 2205 is coupled to distribute some portion of a drive signal to each of the control terminals of the transistors 105 in a respective row 137. In the implementation illustrated in FIG. 22, the drive signal is coupled directly to the control terminals by a conductor 2215. In the implementation illustrated in FIG. 23, the drive signal is coupled via an impedance matching element 2305. The delays associated with portions of control signal line 2205 and either conductors 2215 or impedance matching element 2305 can be chosen to coordinate current conduction by transistors 105 in the respective row 137.

Main signal line 2210 is coupled to the main terminals of transistors 105 in both the same row 137 that receives drive signals from control signal line 2205 and the preceding row 137. In particular, main signal line 2210 is coupled to the source or emitter terminal of the transistors 105 in the same row 137 that receives drive signals from control signal line 2205 and the drain or collector of the transistors 105 in the preceding row 137. As a result, main signal line 2210 combines the outputs of the drain or collector terminals of the transistors 105 in one row 137 and divides the result amongst the source or emitter terminals of the transistors 105 in the next row 137.

In the implementation illustrated in FIG. 22, main signal line 2210 includes a group of stack-to-stack conductors 2220 that couple to the (as illustrated, vertical) conductors between the main terminals of transistors 105 in adjacent rows 137. In the implementation illustrated in FIG. 23, main signal line 2210 includes a group of impedance matching elements 2310 that couple to a position between an unbalanced impedance matching element 2315 that couples to the drain or collector of the transistors 105 in the preceding row 137 and impedance matching element 2305—which couples to the source or emitter terminal of the transistors 105 in the same row 137 that receives drive signals from control signal line 2205. In other implementations, the conductors between the main terminals of individual transistors 105 in adjacent rows 137 can be replaced by combiner/divider elements that combine the signals on the drain or collector terminals of the transistors 105 in one row 137 and then divides the resultant signal amongst the source or emitter terminals of the transistors 105 in the next row 137.

By combining the outputs of transistors 105 in one row 137 and then dividing the result amongst the transistors 105 in the next row 137, conduction within the matrix amplifier can be balanced. In particular, the resulting matrix amplifier has an orthogonal row and column interconnection scheme where the input control signal is fed via lines 2205 in row-direction and the output signals of the individual transistors 105 are collected or transferred via lines 2215 (or, alternatively in FIG. 23, via matching elements 2305 and 2315) from one row of active cells to the next.

In the implementation illustrated in FIG. 22, main signal line 2210 is bias by an optional DC source 2225 that is coupled to main signal line 2210 via an inductance 2230. DC source 2225 can bias main signal line 2210 to a potential that is a fraction of the potential supplied by DC source 160 to collection rail 120. In particular, DC source 2225 can bias the $k^{th}$ row 137 with a potential equal to k/N of that supplied by DC source 160, where N is the total number of rows. By coupling DC source 2225 to main signal line 2210, DC source 160 need not supply power to the entire matrix amplifier. Rather, the DC drain biasing can be split in a partly or fully row-wise manner, allowing the multiple smaller sources to supply that power.

Figure 24:
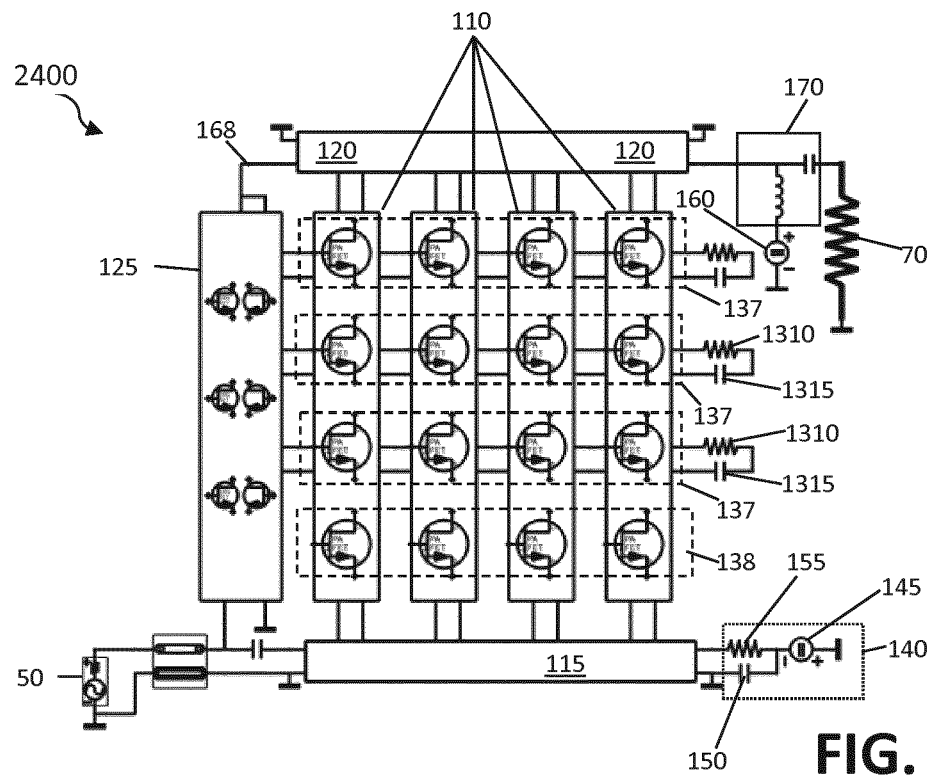
FIG. 24 is a schematic representation of a matrix power amplifier.

FIG. 24 is a schematic representation of a matrix power amplifier 2400. Matrix power amplifier 2400 includes a single active matrix driver 125 that drives multiple stacks 110. Stacks 110 are themselves coupled in parallel between unbalanced distribution rail 115 and unbalanced collection rail 120. Distribution rail 115 is coupled to distribute a signal from a signal source 50 to the bottommost transistors 105 in each of stacks 110. Collection rail 120 is coupled to collect the signals passing through stacks and direct them to a load 70. DC source 160 is coupled to bias all stacks 110.

Active matrix driver 125 drives each of rows 137 separately using a respective row distribution line 130. Row distribution line 130 terminates in a real impedance 1310 and a capacitive impedance 1315. The values of impedances 1310, 1315 are configured to match the impedance of row distribution line 130 so that a drive signal is appropriately coupled thereto from matrix driver 125. In particular, capacitor 1315 is used for DC separation between the input control voltage and the output terminal voltage, while the resistor 1310 is set to match the characteristic impedance of the lines 130.

Figure 25:
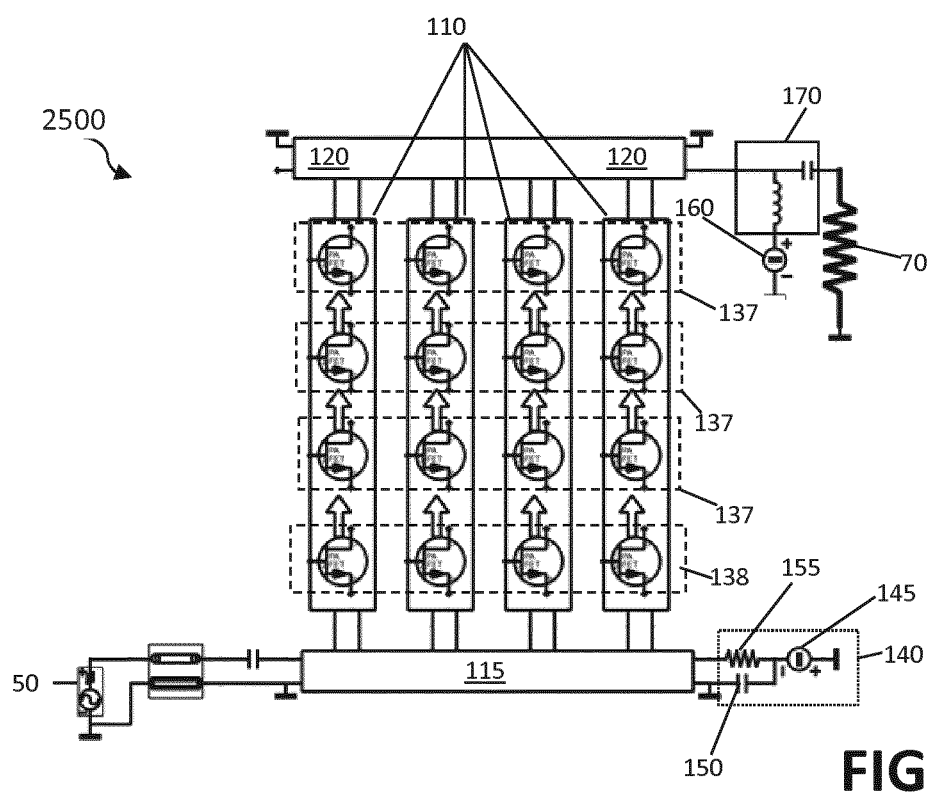
FIG. 25 is a schematic representation of a matrix power amplifier.

FIG. 25 is a schematic representation of a matrix power amplifier 2500. Matrix power amplifier 2500 does not include an active matrix driver 125. Rather, each stack 110 includes a parallel or serial "bootstrapping" driver such as illustrated, e.g., in FIGS. 4, 5, 6, and 8. In these implementations, distribution rail 115 is coupled to distribute the signal from signal source 50 to the transistors 105 in the bottommost row 138. The resultant potential on the drain or collector of the transistors 105 in row 138 is bootstrapped to bias the control terminals of transistors 105 in succeeding rows 137, leading to a wave of current control passing through the two-dimensional matrix of transistors 105 from the bottom to the top in the illustrated direction of the stacks 110. DC source 160 is coupled to bias all stacks 110.

Figure 26:
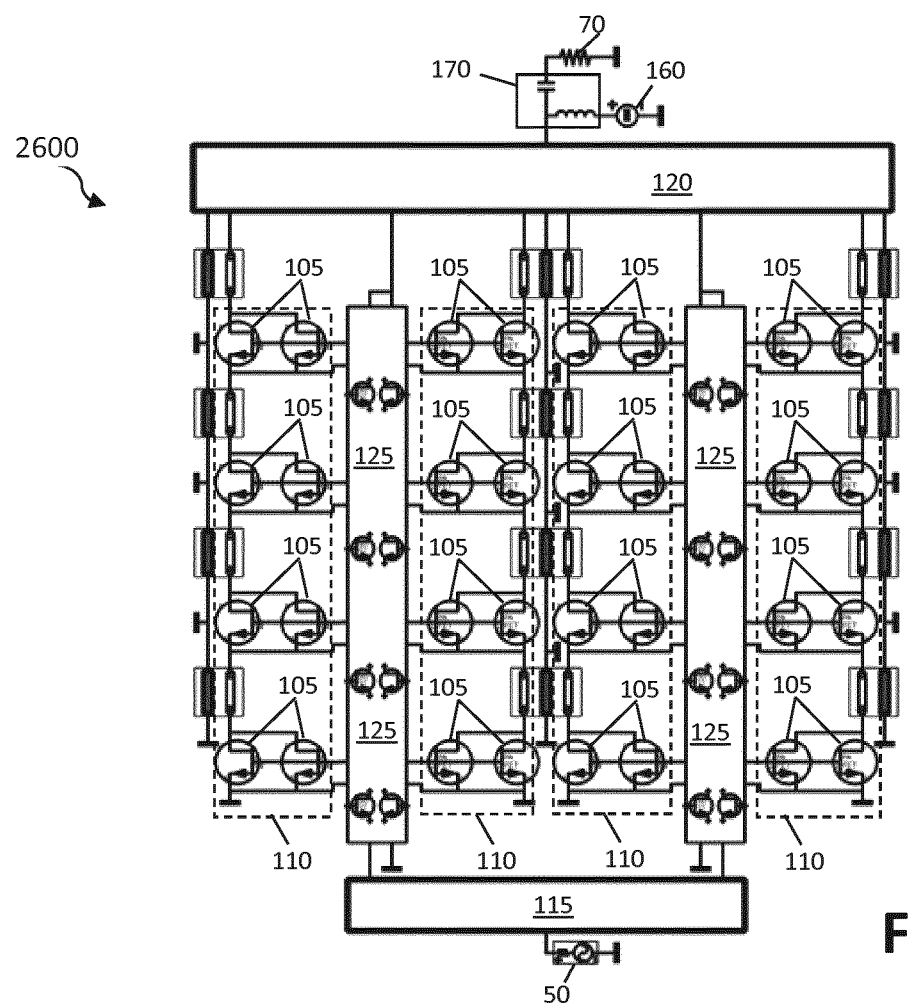
FIG. 26 is a schematic representation of a matrix power amplifier.

FIG. 26 is a schematic representation of a matrix power amplifier 2600. Matrix power amplifier 2600 includes a multiple active matrix drivers 125 that each drives multiple stacks 110. Each stack 110 is formed by a collection of active cells coupled in series between distribution rail 115 and collection rail 120. However, in the illustrated implementation, each active cell is formed by a pair of transistors 105 that are paralleled. In particular, the control terminals of both transistors in the pair are coupled together and receive a single control signal. Further, respective main terminals of both transistors are coupled, in effect doubling the current-carrying capacity of the active cells by doubling the active area of the active cells. Thus, in the illustrative schematic representation, each active matrix driver 125 drives a pair of stacks 110, one illustratively disposed to the left of the active matrix driver 125 and one illustratively disposed to the right of the active matrix driver 125.

In some implementations, the main terminals of active cells that are driven by different active matrix drivers 125 can be coupled together to combine the outputs of transistors 105 driven by different active matrix drivers 125. The resulting signal can then be divided amongst the transistors 105 in the next row. An example of such an approach is shown in FIGS. 22, 23, albeit in the context of one transistor 105 per active cell.

Figure 27:
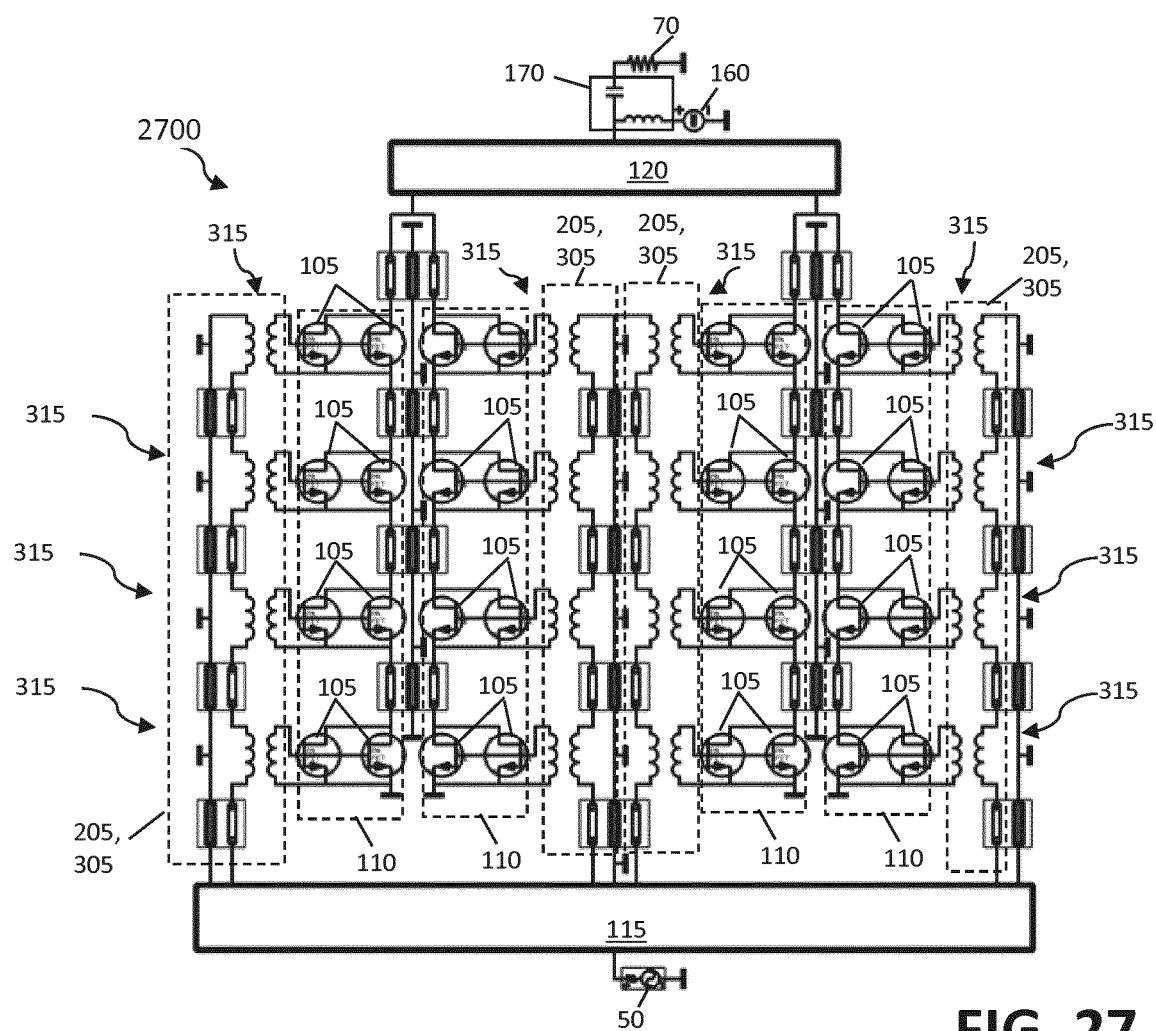
FIG. 27 is a schematic representation of a matrix power amplifier.

FIG. 27 is a schematic representation of a matrix power amplifier 2700. Matrix power amplifier 2700 includes multiple unbalanced passive matrix drivers 305. In the illustrated implementation, each unbalanced passive matrix driver 305 is coupled to an active cell that includes multiple transistors 105 by a balun transformer 315. Balun transformers 315 both convert the unbalanced signal on passive matrix drivers 305 to balanced signals and act as impedance matching elements to couple the drive signals to transistors 105 in different stacks 110.

In the illustrated implementation, the main terminals of active cells that are driven by different passive matrix drivers 305 are coupled together to combine the outputs of transistors 105 driven by different passive matrix drivers 305. The resulting signal is then divided amongst the transistors 105 in the next row.

In the illustrated implementation, two of the unbalanced passive matrix drivers 305 (i.e., the passive matrix drivers 305 disposed in the middle of the schematic representation) shared a single grounded return line. This is not necessarily the case. For example, in some implementations, each passive matrix drivers 305 can include an individual return line.

In the illustrated implementation, two of the unbalanced passive matrix drivers 305 (i.e., the passive matrix drivers 305 disposed to the left and to the right in the schematic representation) have individual grounded return line. This is not necessarily the case. For example, in some implementations, these two passive matrix drivers 305 can also share a single return line.

Figure 28:
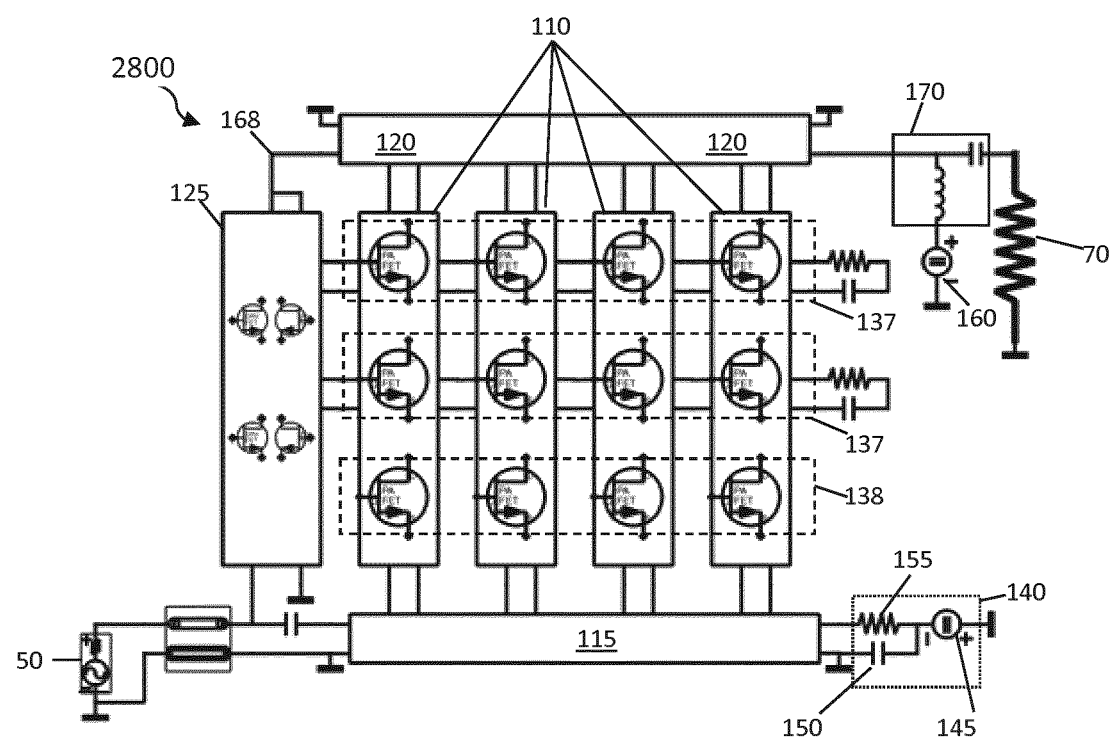
FIG. 28 is a schematic representation of a matrix power amplifier.
Figure 29:
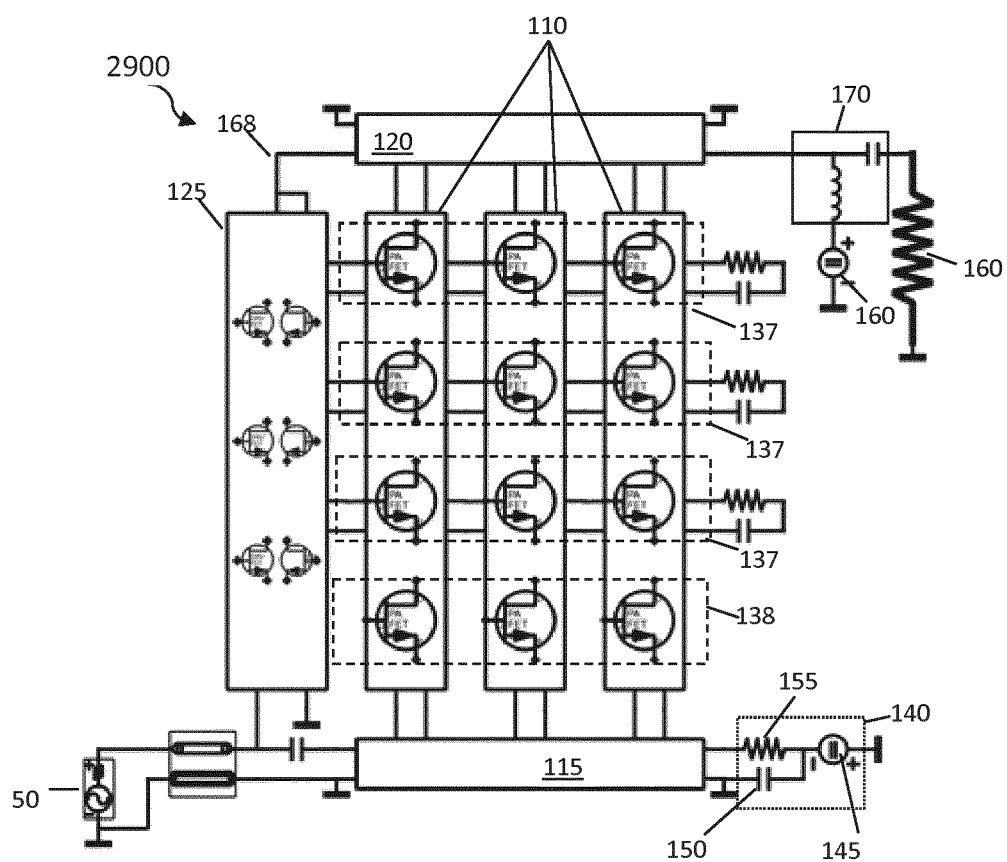
FIG. 29 is a schematic representation of a matrix power amplifier.

FIGS. 28, 29 are schematic representations of matrix power amplifiers 2800, 2900. Matrix power amplifiers 2800, 2900 are both examples of "non-square" matrix in that the number of columns M is not equal to the number of rows N in the matrix. In some implementations, this may facilitate matching the impedance of the active cells in the matrix to the impedance of an external system load (e.g., using the Cripps load-line method).

In some implementations, matrix power amplifiers 2800, 2900 may include an active matrix driver 125. In some such implementations, the size or other characteristics of such an active matrix driver 125 may differ from the size or other characteristics of the active cells in the matrix. In such implementations, the power of the signal output by signal source 50 will not be identically distributed to the active matrix driver 125 and each of the active cells in the bottom row 138 of the matrix. Equations 4, 5 above can be adjusted to account for this non-uniform distribution.

FIG. 30a is a schematic representation of a matrix power amplifier 3000. Matrix power amplifier 3000 includes a parallel—connected plurality of active cells 3005 each of which is formed by multiple transistors 105. In particular, in the illustrated implementation, each active cell 3005 includes three transistors 105. The control terminals and source/emitter main terminals of these transistors 105 are coupled to an active cell distribution line 3050 that couples portions of a drive signal to the control terminals with appropriate delays to coordinate current conduction by transistors 105. However, the drain/collector main terminals of transistors 105 in each active cell 3005 are coupled to a collection line 3010 that collects the currents conducted between the main terminals of each transistor 105 in an active cell 3005. Collection line 3010 conveys the currents collected from the drain/collector main terminals of the transistors 105 in one active cell 3005 through an unbalanced line 3015 to the source/emitter main terminals of the transistors 105 in the next active cell 3005 via the active cell distribution line 3050 of that next active cell 3005.

Active cell distribution lines 3050 receive the currents collected from the drain/collector main terminals of the transistors 105 in one active cell 3005 on one end (to the right in the illustrated orientation) and convey those currents to the source/emitter main terminals of the transistors 105 in the associated active cell 3005 as to a the non-inverting terminal of impedance-matching differential amplifier 3055 in a matrix driver 125. The lines that form each active cell distribution line 3050 are dimensioned so that the input capacitances of transistors 105 are hidden in the cell distribution line 3050 like in a distributed amplifier (TWA) and the output of baluns 3055 is matched to the active cells. Further, the output collection line is dimensioned like in a non-uniform distributed power amplifier (NDPA) with regard to signal timing and the load impedance which is seen by each transistor 105 in row 3005.

In the illustrated implementation, matrix driver 125 includes not only the differential amplifiers 3055 between active cells 3005, but also a resistive voltage divider chain 168 which is connected to FETs acting as source followers or voltage sources, respectively, which set the correct DC biasing voltages for the differential amplifiers 3055.

FIG. 30b is a schematic representation of an impedance-matching differential amplifier 3055 that can be used in row-matched matrix power amplifiers. Differential amplifier 3055 includes an inverting input terminal 3180, a non-inverting input terminal 3182, a high output terminal 3184, and a low output terminal 3186. Differential amplifier 3055 also includes a high supply terminal 3190 and a low supply terminal 3192.

Differential amplifier 3055 includes a pair of matched transistors 3194 that each are coupled between a high drain-side potential and a low source-side potential. The control terminal of the first of transistors 3194 is coupled to non-inverting input terminal 3182. The control terminal of the second of transistors 3194 is coupled to inverting input terminal 3180. Differences in the potential at input terminals 3180, 3182 result in differences in the conductivity of transistors 3194. Those differences in the conductivity of transistors 3194 result in different potential drops across impedances 3196, 3197 that couple the drains of transistors 3194 to high supply terminal 3190. Output terminals 3184, 3186 output the resulting difference.

As shown, the sources of transistors 3194 are coupled together and share a common path to low supply terminal 3192. The impedance between both output terminals 3184, 3186 and low supply terminal 3192 is thus nearly identical except for the relatively small differences in the impedance of transistors 3194. Differential amplifier 3055 can thus act as a balun and convert an unbalanced input on inputs 3180, 3182 into a balanced output on output terminals 3184, 3186.

Figure 31:
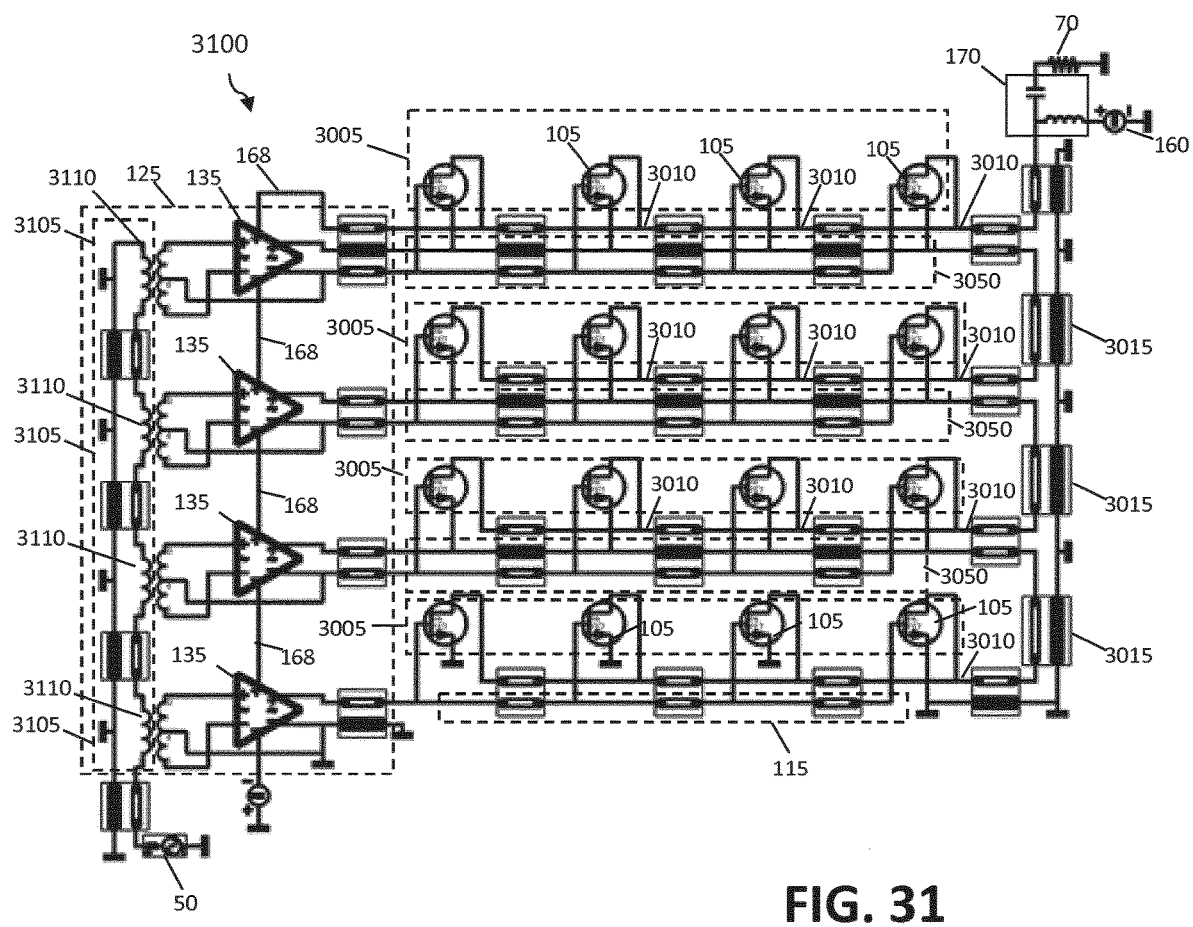
FIG. 31 is a schematic representation of a matrix power amplifier.

FIG. 31 is a schematic representation of a matrix power amplifier 3100. Like matrix power amplifier 3000 (FIG. 30a), matrix power amplifier 3100 also includes a collection of active cells 3005 formed by multiple transistors 105 and a collection line 3010 that conveys currents collected from the drain/collector main terminals of those transistors 105 to the source/emitter main terminals of the transistors 105 in the next active cell 3005.

In matrix power amplifier 3100, matrix driver 125 receives the RF signal output by signal source 50 on an unbalanced distribution line 3105. Via a series of transformers 3110, unbalanced distribution line 3105 couples the RF signal into the input terminals of differential amplifiers that act as active impedance matching elements 135 to match the impedance of the active cell distribution lines 3050 and transistors 105.

Figure 32:
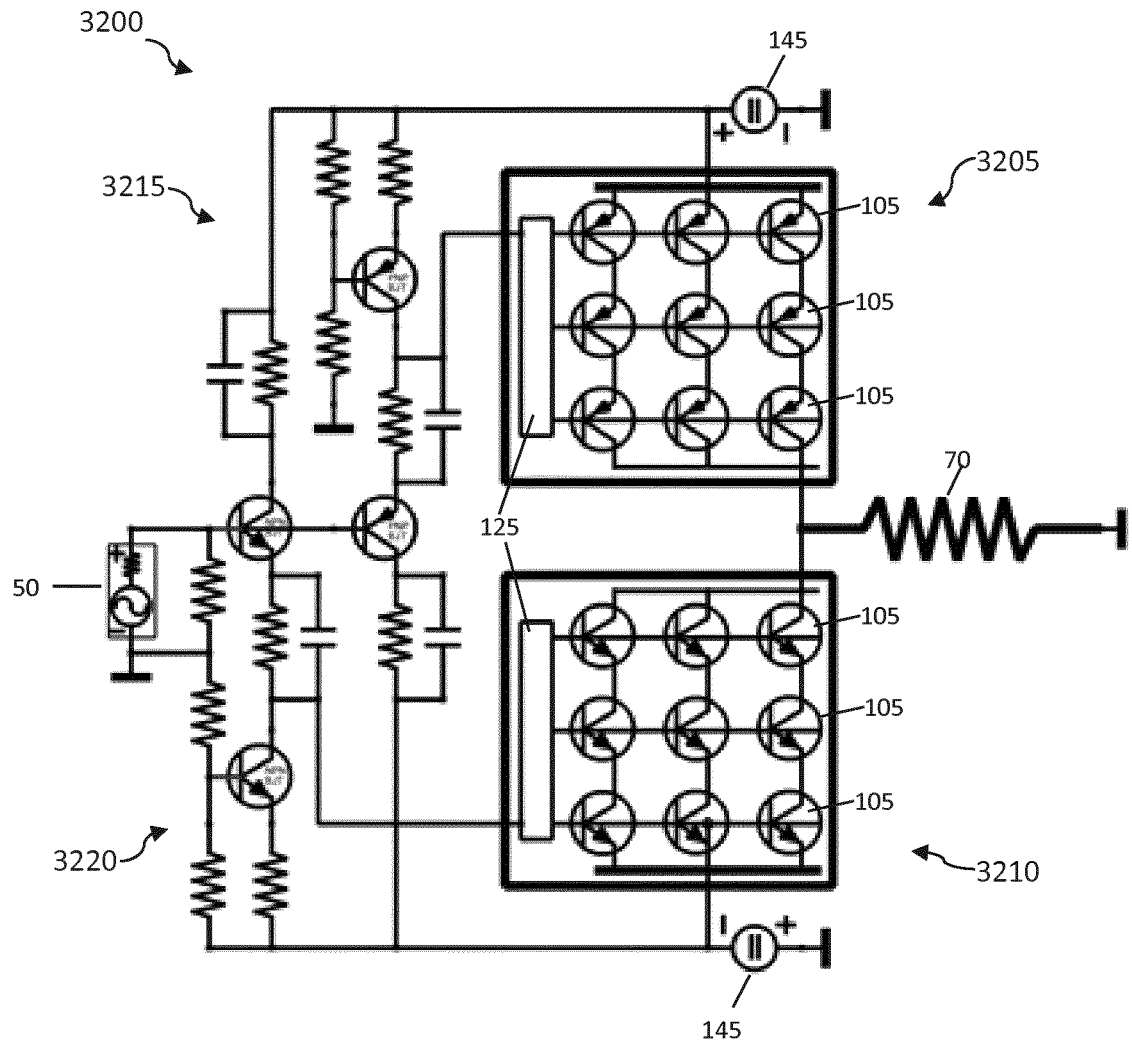
FIG. 32 is a schematic representation of a two-dimensional matrix power amplifier.

FIG. 32 is a schematic representation of a two-dimensional matrix power amplifier 3200. Two-dimensional matrix power amplifier 3200 includes a p-type two-dimensional matrix 3205 and an n-type two-dimensional matrix 3210. P-type two-dimensional matrix 3205 includes a collection of p-type transistors 105 that act as active elements. N-type two-dimensional matrix 3210 includes a collection of n-type transistors 105 that act as active elements. A DC source 145 that outputs a DC signal which is negative with respect to ground controls the current flow through N-type two-dimensional matrix 3210. A DC source 145 that outputs a DC signal which is positive with respect to ground controls the current flow through P-type two-dimensional matrix 3205. The RF signal that is output by RF source 50 is level shifted by respective level shifting circuitry 3215, 3220 that includes source followers and current sources (e.g., formed of npn and pnp bipolar junction transistors, respectively) and DC level shifting resistors therebetween for coupling to respective of matrices 3205, 3210.

Two-dimensional matrix power amplifier 3200 thus provides load 70 with a "DC-free" RF output referenced to ground or zero potential.

Figure 33:
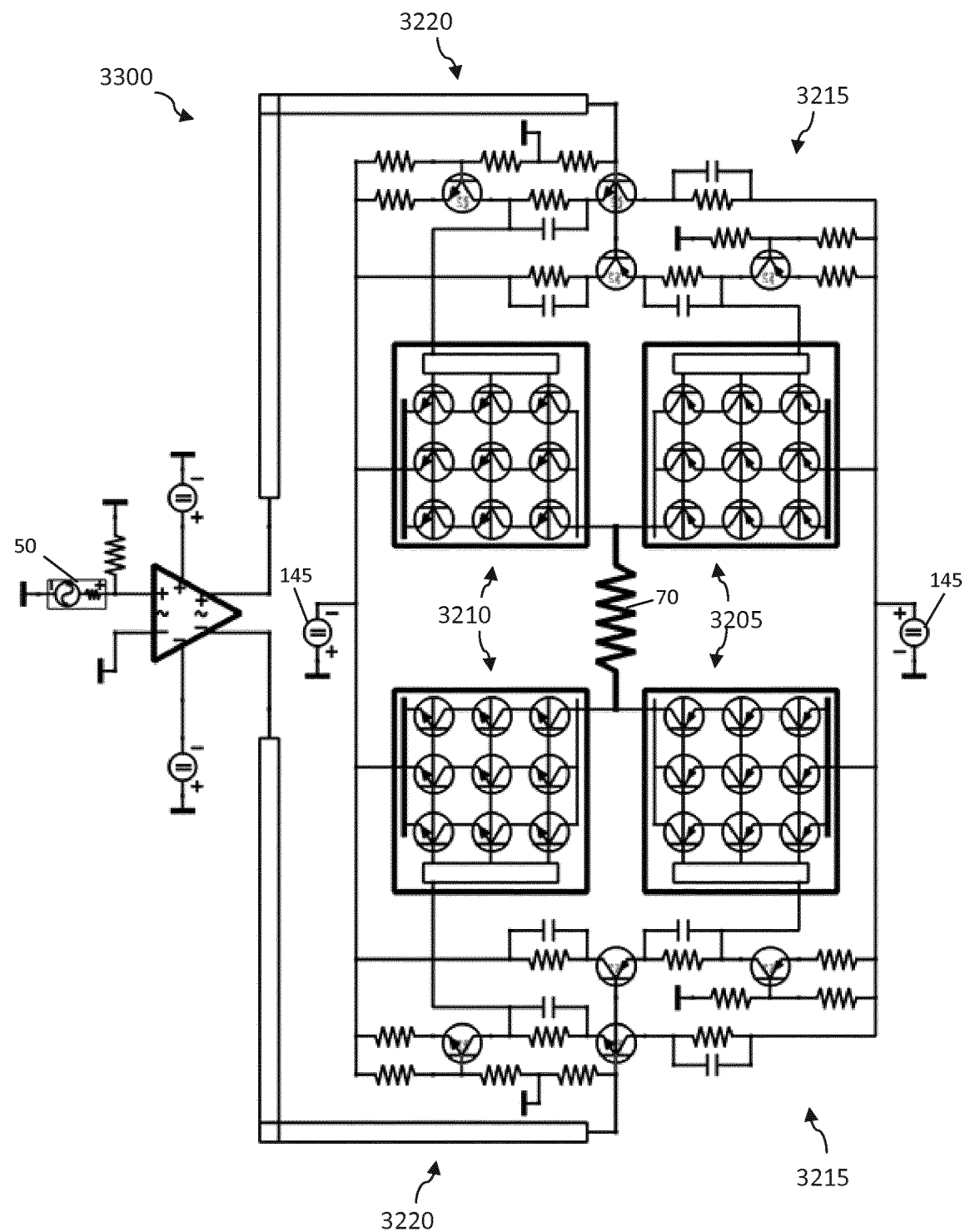
FIG. 33 is a schematic representation of a two-dimensional matrix power amplifier.

FIG. 33 is a schematic representation of a two-dimensional matrix power amplifier 3200 that includes a pair of p-type two-dimensional matrices 3205 and n-type two-dimensional matrices 3210 assembled into a "full-H" configuration. Two-dimensional matrix power amplifier 3200 provides a symmetric RF output which is required (e.g. for output to a Lecher-type antenna feeder).

Figure 34:
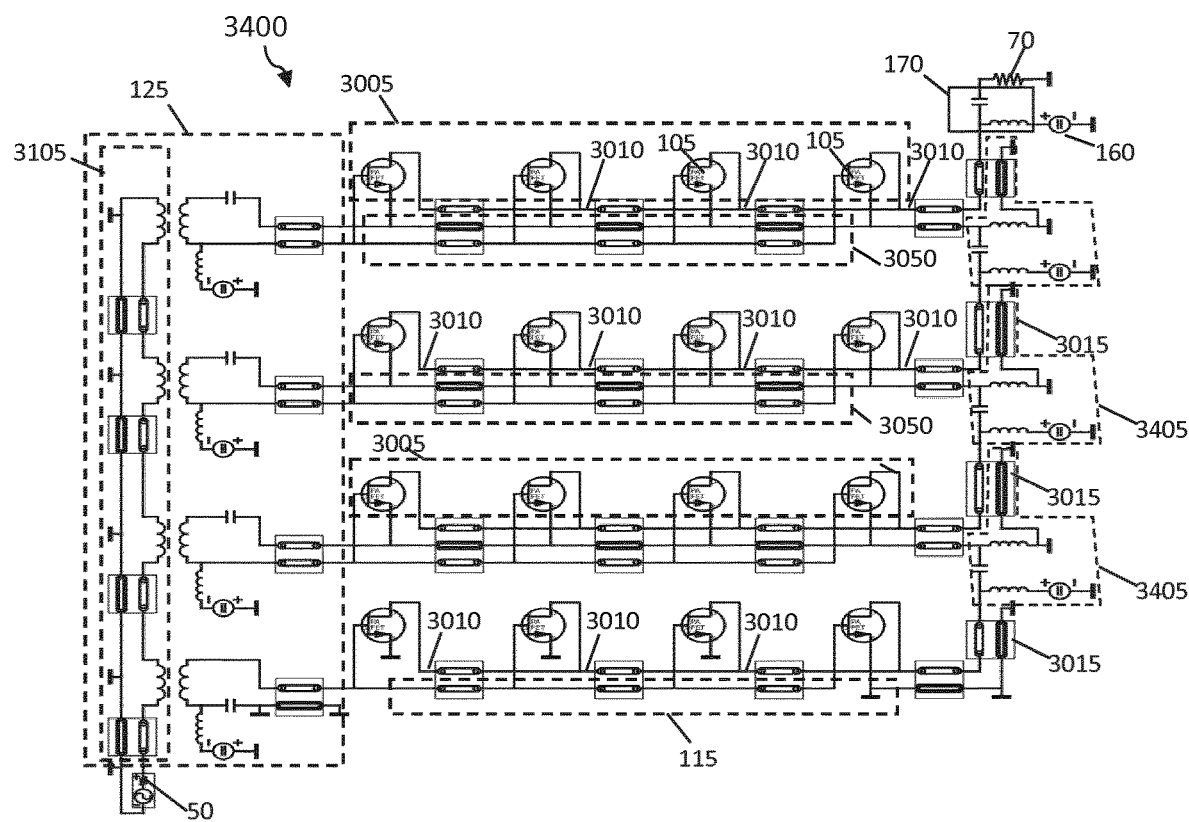
FIG. 34 is a schematic representation of a matrix power amplifier.

FIG. 34 is a schematic representation of a matrix power amplifier 3400. Matrix power amplifier 3400 includes a parallel-connected plurality of active cells 3005 each of which includes four transistors 105.

In contrast with matrix power amplifiers 3000, 3100 (FIGS. 30, 31), matrix power amplifier 3400 includes biasing circuitry 3405 that is coupled between active cells 3005. Biasing circuitry 3405 biases the collection line 3010 of one active cell 3005 via unbalanced line 3015 and the line of the active cell distribution line 3050 that is coupled to the source/emitter main terminals of the transistors 105 in the adjacent active cell 3005. In other words, biasing circuitry 3405 biases both the output from the main terminals 105 of the transistors one active cell 3005 and the input of the main terminals of the transistors 105 in the adjacent active cell 3005.

As a result, any DC current conducted between the control terminals and the source/emitter main terminals of the transistors 105 is not re-used. This lowers the output DC supply voltage by a factor N equal to the number of rows, but increases the total required DC supply current by the same factor N relative to the other topology variants presented herein. Nevertheless, the total RF output voltage and current swing in matrix amplifier 3400 are substantially the same as in these other variants.

Figure 35:
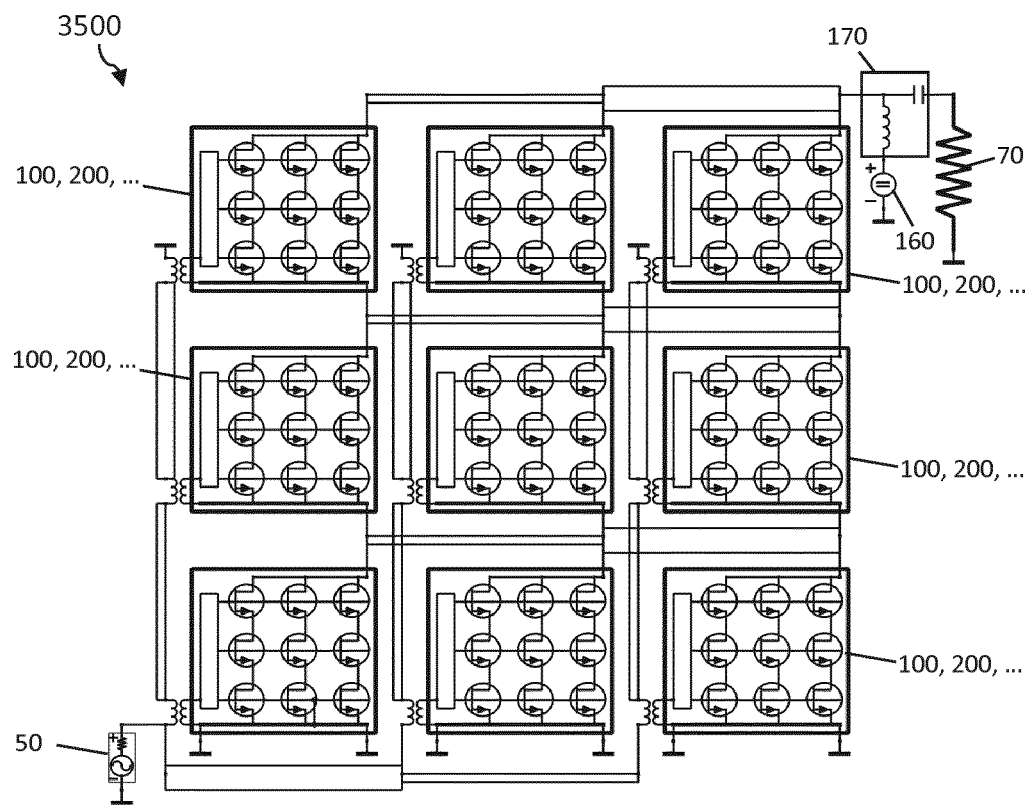
FIG. 35 is a schematic representation of a matrix power amplifier.

FIG. 35 is a schematic representation of a matrix power amplifier 3400. Matrix power amplifier 3500 that includes a two-dimensional matrix of two-dimensional matrix of matrix power amplifiers. The matrix power amplifiers in matrix power amplifier 3500 can be any of the matrix power amplifiers 100, 200, . . . described herein. In some implementations, the matrix power amplifiers in matrix power amplifier 3500 can be interconnected using transmission line interconnects that have relatively large cross-sections using hybrid integration or multi-chip-module assembly technologies instead of monolithic microwave integrated circuits. Further, the combining losses can be maintained low enough for effective power combining. With such a matrix of matrix power amplifiers, the total output power can be further increased while maintaining a desired impedance matching.

Figure 36:
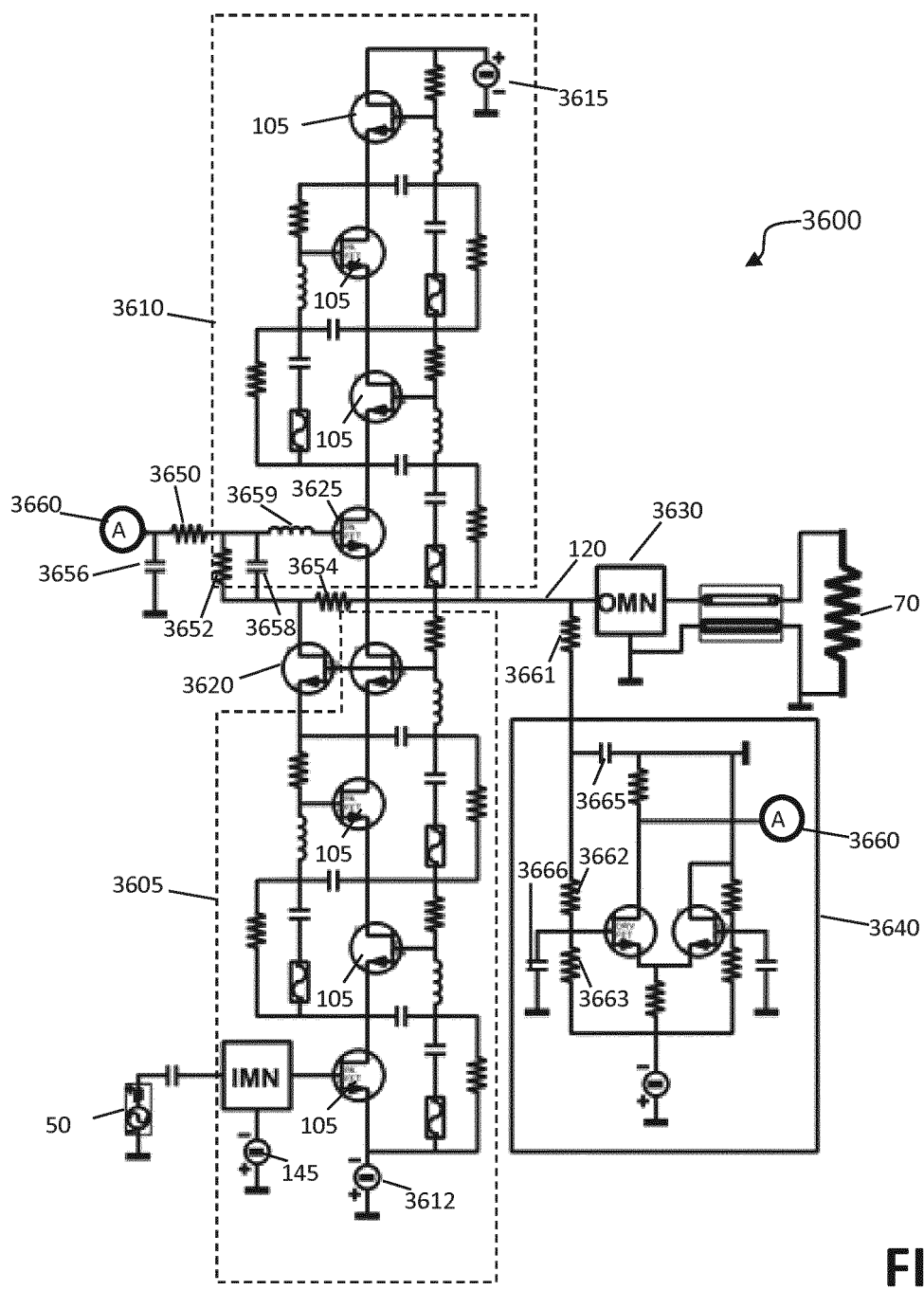
FIG. 36 is a schematic representation of a push-pull stage 3600 that includes a pair of matrix amplifiers.

FIG. 36 is a schematic representation of a push-pull stage 3600 that includes a pair of matrix amplifiers 3605, 3610. In the illustrated implementation, each of matrix amplifiers 3605, 3610 includes a single stack of transistors 105 that are bootstrapped together so that the signal output on a main terminal of one transistor 105 drives the control terminal of the subsequent transistor 105. In other implementations, matrix amplifiers 3605, 3610 can include multiple such stacks and/or distribute the drive signal using any of the circuits described herein.

Matrix amplifiers 3605, 3610 are coupled together to form push-pull stage 3600. In push-pull stage 3600, current flow though matrix amplifier 3610 acts to "pull up" collection rail 120 to a positive potential relative to ground defined by DC source 3615. Current flow though matrix amplifier 3605 acts to "push down" collection rail 120 to a negative potential relative to ground defined by DC source 3612.

The illustrated implementation of push-pull stage 3600 also includes a cross-amplifier bootstrapping transistor 3620, resistances 3652, 3654, capacitance 3658, and inductance 3659. In particular, transistor 3620 and these components together bootstrap the signal output on collection rail 120 so that the control terminal(s) of the transistor(s) 3625 in the bottom row of matrix amplifier 3610 switch those transistor(s) 3625 into conduction. The signals output on the main terminal of transistor(s) 3625 drives the control terminal of the transistor(s) in the next row, and the drive signal propagates through the matrix of matrix amplifier 3610 until current flow though matrix amplifier 3610 acts to "pull up" collection rail 120.

Collection rail 120 is coupled to collect the signals passing through both matrix amplifiers 3605, 3610 and couple them to load 70. In the illustrated implementation, an output impedance matching network 3630 is coupled between collection rail 120 and load 70 to improve the power transfer. Since there is no bias tee disposed between collection rail 120 and load 70, the current limits and (especially, low) frequency performance limits of bias tees can be avoided.

Further, push-pull stage 3600 includes a low-frequency control loop that regulates the DC potential on collection rail 120. As a result of this regulation, the output of push-pull stage 3600 is DC-free, i.e., symmetrical to the positive and negative DC supply voltages supplied by DC supplies 3612, 3615. The control loop includes an error amplifier 3640 and employs matrix amplifier 3610 as a controller to regulate the output of push-pull stage 3600. Error amplifier 3640 is a low-frequency or quasi-DC differential amplifier that is coupled to determine the low frequency differences between the potential on output rail 120 and ground and output the difference as an error signal on conductor 3660. The frequency response of error amplifier 3640, including the upper cut-off frequency, is determined by a collection of resistive and capacitive elements 3661, 3662, 3663, 3665, 3666. The error signal is coupled by a conductor 3660 to the control terminal(s) of the transistor(s) 3625 in the bottom row of matrix amplifier 3610. Transistor(s) 3625 responds to the error signal as a source follower and adjusts the DC potential on output rail 120 to zero.

The illustrated push-pull stage 3600 can be designated as an "active source follower return." In particular, matrix amplifier 3605 can be considered to be a "common source amplifier" with a source terminal coupled to the negative potential relative to ground, the control terminal coupled to RF source 50, and the drain coupled to the output collection rail 120 and to ground via a collection of real impedances 3650, 3652, 3654 and capacitances 3656, 3658. Also, matrix amplifier 3610 can be considered an "active return" for the source follower of matrix amplifier 3605. In particular, matrix amplifier 3610 actively returns output collection rail 120 to a higher potential by conducting current from DC source 3615 in response to the drive signal bootstrapped via cross-amplifier bootstrapping transistor 3620.

Figure 37:
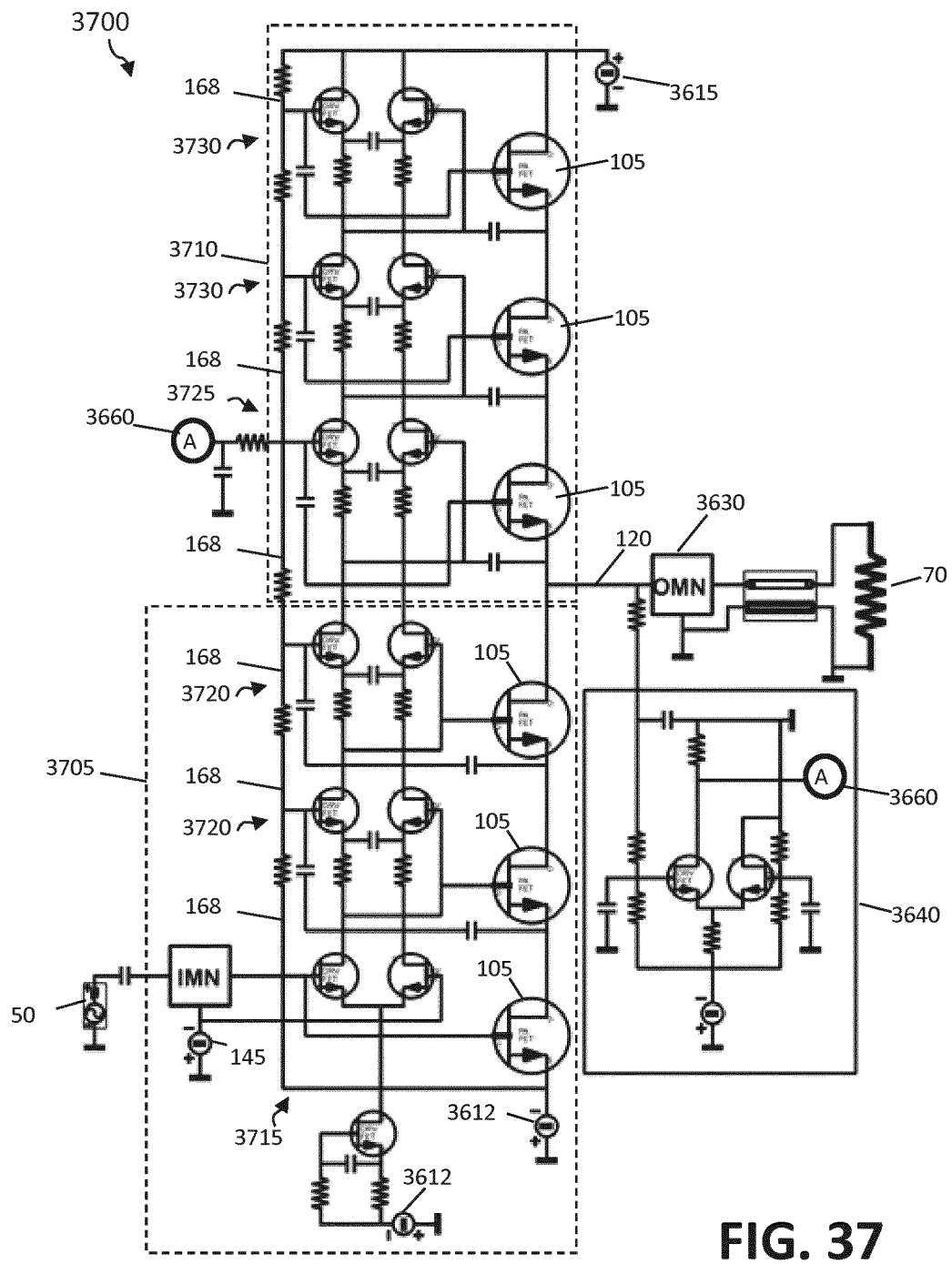
FIG. 37 is a schematic representation of a push-pull stage that includes a pair of matrix amplifiers.

FIG. 37 is a schematic representation of a push-pull stage 3700 that includes a pair of matrix amplifiers 3705, 3710. In the illustrated implementation, each of matrix amplifiers 3705, 3710 includes a single stack of transistors 105 that are driven by a respective chain of active baluns or differential amplifiers 3715 and 3720 or 3725 and 3730. Each differential amplifier 3715, 3720, 3725, 3730 includes a pair of transistors and amplifies the difference between the potentials on their respective control terminals to drive a transistor 105 of an active cell of the matrix amplifier.

For example, in matrix amplifier 3705, bottommost differential amplifier 3715 amplifies a portion of the signal from signal source 50 that is coupled not only to the control terminals of the transistors in bottommost differential amplifier 3715 but also to the control terminal of the transistor 105 in the bottom row of matrix amplifier 3705. The upper main terminal (e.g., drain/collector) of one of the transistors in bottommost differential amplifier 3715 (the left transistor in the illustrated representation) is coupled not only to the control terminal of one the transistors in the subsequent differential amplifier 3720 (the right transistor in the illustrated representation) but also to the control terminal of the transistor 105 in the subsequent row or active elements The control terminal of the other transistor in this same differential amplifier 3720 is coupled to the upper main terminal (e.g., drain/collector) of the transistor 105 in the bottom row. The differences in the biases applied to the control terminals of the transistors forming each differential amplifier 3720 likewise propagate to a subsequent differential amplifier 3720 and the conductivity of the transistors 105 in matrix amplifier 3705 is controlled in concert.

Please note that the control terminals of the transistors in differential amplifier 3720 are always coupled to the same of the main and control terminal of the associated transistor 105. In other words, the inverting input of each differential amplifier 3720 is always coupled to one of the main and control terminal of the associated transistor 105, and the non-inverting input of each differential amplifier 3720 is always coupled to the other.

In matrix amplifier 3710, bottommost differential amplifier 3725 in effect amplifies the signal from signal source 50 with an opposite polarity so that current conduction through matrix amplifier 3710 is increased and decreased in anti-phase with the increases and decreases in current conduction through matrix amplifier 3705. This is achieved by reversing the couplings between the inverting and non-inverting inputs of differential amplifiers 3725, 3730 and the main and control terminal of the associated transistors 105. As a result, the differences in the biases applied to the control terminals of the transistors forming matrix amplifier 3710 are in anti-phase with the differences in matrix amplifier 3705.

Matrix amplifiers 3705, 3710 are thus coupled together to form push-pull stage 3700. In push-pull stage 3600, current flow though matrix amplifier 3710 acts to "pull up" collection rail 120 to a positive potential relative to ground defined by DC source 3615. Current flow though matrix amplifier 3705 acts to "push down" collection rail 120 to a negative potential relative to ground.

The illustrated push-pull stage 3700 can also be designated as a "common source amplifier." In other implementations, each of matrix amplifiers 3705, 3710 can include multiple stacks of transistors 105.

Further, push-pull stage 3700 includes low-frequency control loops that each regulates the DC potential on a respective collection rail 120. As a result of this regulation, the output of push-pull stage 3700 is DC-free, i.e., symmetrical to the positive and negative DC supply voltages supplied by DC supplies 3612, 3615. The control loop includes an error amplifier 3640 and employs matrix amplifier 3710 as a controller to regulate the output of push-pull stage 3700. Error amplifier 3640 is a low-frequency or quasi-DC differential amplifier that is coupled to determine the low frequency differences between the potential on output rail 120 and ground. This error signal is coupled by conductor 3660 to the bottommost differential amplifier 3725. Bottommost differential amplifier 3725 and the associated transistor 105 adjust the DC potential on output rail 120 to zero.

Figure 38:
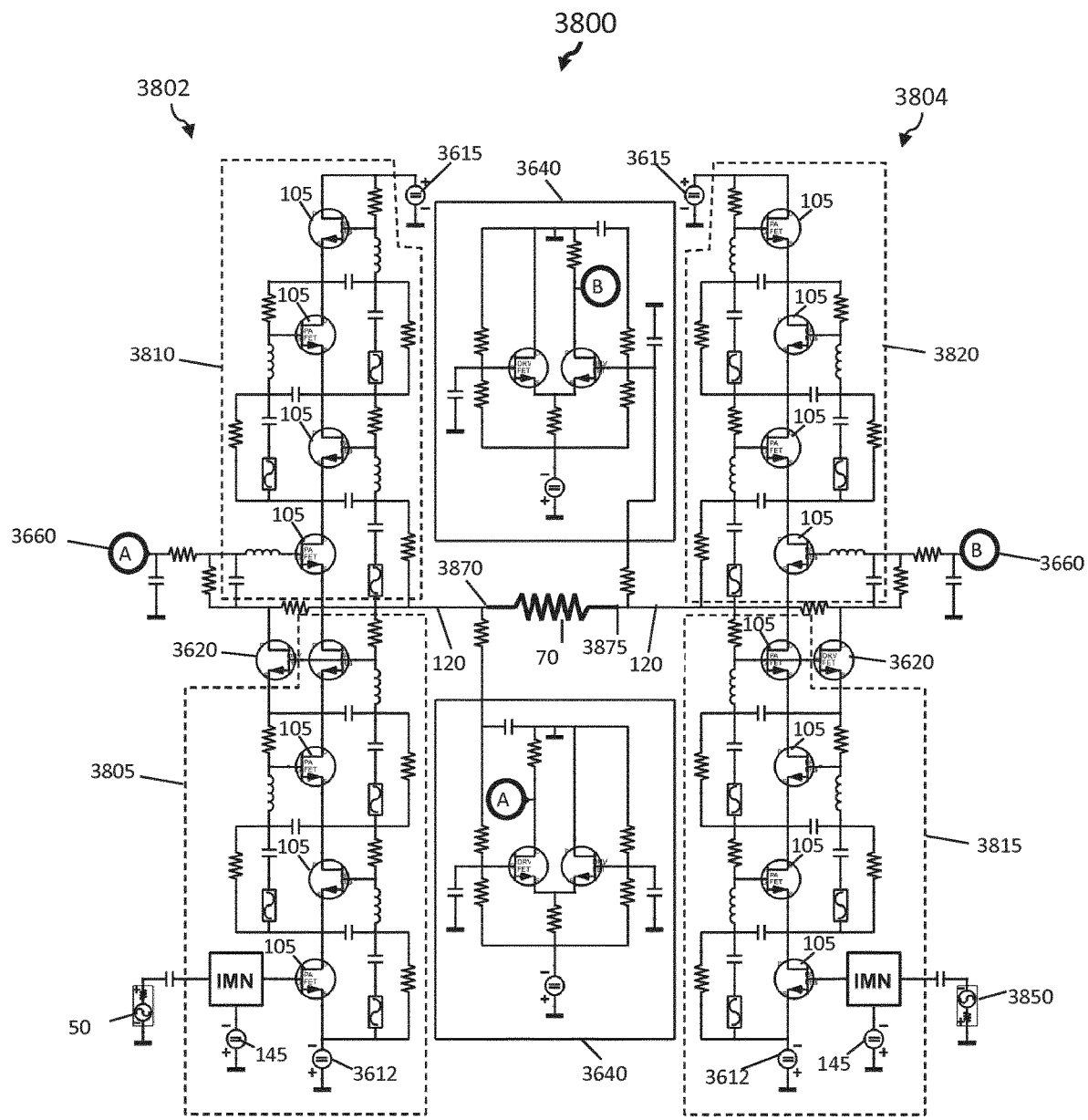
FIG. 38 is a schematic representation of a two-dimensional matrix power amplifier that includes a pair of push-pull stages coupled in an "H-type" configuration.

FIG. 38 is a schematic representation of a two-dimensional matrix power amplifier 3800 that includes a pair of push-pull stages 3802, 3804 coupled in an "H-type" configuration to provide a symmetric RF output (e.g. for output to a Lecher-type antenna feeder).

In particular, push-pull stage 3802 includes a pair of matrix amplifiers 3805, 3810. Push-pull stage 3804 includes a pair of matrix amplifiers 3815, 3820. In the illustrated implementation, each of matrix amplifiers 3805, 3810, 3815, 3820 includes a single stack of transistors 105 that are bootstrapped together so that the signal output on a main terminal of one transistor 105 drives the control terminal of the subsequent transistor 105. In other implementations, matrix amplifiers 3805, 3810, 3815, 3820 can include multiple such stacks and/or distribute the drive signal using any of the circuits described herein.

Each push-pull stage 3802, 3804 also includes a cross-amplifier bootstrapping transistor 3620 and one or more associated resistances, capacitances, and or inductances. Each transistor 3620 and the associated components together bootstrap the signal output on a respective collection rail 120 so that the control terminal(s) of the transistor(s) in the bottom row of the respective of matrix amplifiers 3810, 3820 switch those transistor(s) into conduction. The signals output on the main terminal of transistor(s) is in turn bootstrapped the respective of matrix amplifiers 3810, 3820.

The push signals passing through matrix amplifier 3805 and the pull signals passing through matrix amplifier 3810 are collected by a collection rail 120 and directed to a first terminal 3870 of load 70. Also, the push signals passing through matrix amplifier 3815 and the pull signals passing through matrix amplifier 3820 are collected by a collection rail 120 and directed to a second terminal 3875 of load 70. These signals are 180 degrees out of phase so that load 70 is drive with a symmetric RF output.

Further, matrix power amplifier 3800 includes a pair of low-frequency control loops that each regulates the DC potential on a respective collection rail 120. As a result of this regulation, the output of push-pull stages 3802 and 3804 is DC-free, i.e., symmetrical to the positive and negative DC supply voltages supplied by DC supplies 3612, 3615. The control loops each include an error amplifier 3640 and employs a respective of matrix amplifiers 3810, 3820 as a controller to regulate the output of matrix power amplifier 3800. Error amplifiers 3640 are low-frequency or quasi-DC differential amplifiers that are each coupled to determine the low frequency differences between the potential on a respective output rail 120 and ground. This error signal is coupled by a respective conductor 3660 (denoted "A" for push-pull stage 3802 and "B" for push-pull stage 3804) to the control terminal(s) of the bottommost transistor(s) 105 in the respective of matrix amplifiers 3810, 3820. These bottommost transistor(s) 105 adjust the DC potential on the respective output rail 120 to zero.

Figure 39:
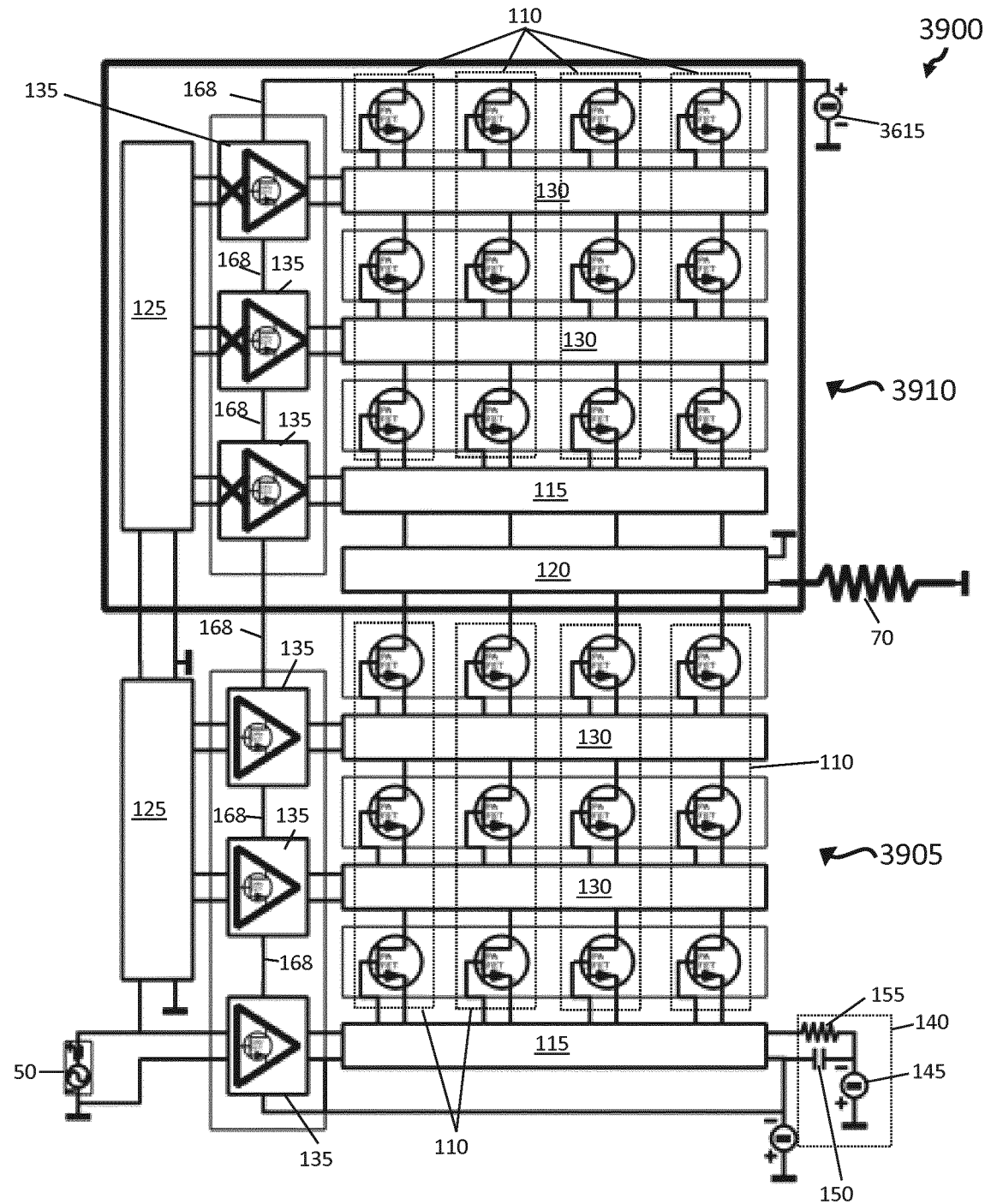
FIG. 39 is a schematic representation of a push-pull stage 3900 that includes a pair of matrix amplifiers.

FIG. 39 is a schematic representation of a push-pull stage 3900 that includes a pair of matrix amplifiers 3905, 3910. In the illustrated implementation, each of matrix amplifiers 3905, 3910 includes four stacks 110 of transistors. The transistors in each row in both matrix amplifiers 3905, 3910 are driven by distribution line 130 and a respective impedance matching element 135. In the illustrated implementation, impedance matching elements 135 are shown as active driver amplifiers.

As shown, the input polarity of the active driver amplifiers in the matching elements 135 of matrix amplifier 3905 is the reverse of the input polarity of the active driver amplifiers in the matching elements 135 of matrix amplifier 3910. As a result, the active cells in matrix amplifier 3905 are driven in anti-phase with the active cells in the two-dimensional matrix 3910.

A number of implementations have been described. Nevertheless, it will be understood that various modifications may be made. For example, the parallel bootstrap driver topology used in the columns of a matrix amplifier (e.g., in FIGS. 4, 5 and in the push-pull matrix amplifiers of FIGS. 36, 38) can be used in conjunction with an active column driver stage. In such cases, the voltage divider of the parallel bootstrap driver is connected to a transistor in the active driver rather than to transistors 105 in the active cells.

Accordingly, other implementations are within the scope of the following claims.

What is claimed is:

1. A power amplifier comprising:
   an amplifier input and an amplifier output;
   a plurality of N times M active cells, wherein N and M are both ≥2 and the active cells are wired as a M×N matrix; and
   at least one driver structure to drive the active cells;
   wherein one of a) or b) applies, wherein:
   when a) applies, matrix rows of the M×N matrix each include M active cells coupled to be driven in parallel, wherein at least two matrix rows are coupled in series, and
   when b) applies, matrix columns of the M×N matrix each include N active cells coupled in series and driven as a stack, wherein the stacks are coupled in parallel and the matrix rows each include M active cells coupled to be driven in parallel, wherein at least two matrix rows are coupled in series;
   wherein a control terminal of each active cell is coupled to the amplifier input via a signal path that includes a driver input structure, wherein the active cells are all controllable by an electrical signal input to the amplifier input.

2. The power amplifier of claim 1, wherein the driver structure comprises a plurality of active driving elements and the signal path that couples the control terminal of each active cell to the amplifier input includes the driving elements.

3. The power amplifier of claim 1, wherein the signal path that couples a control terminal of at least some of the active cells to the amplifier input includes others of the active cells.

4. The power amplifier of claim 1, wherein the control terminal of each active cell is coupled to the amplifier input to receive a substantially equal input power.

5. The power amplifier of claim 1, wherein outputs of the active cells are coupled such that
   output voltages of the active cells along a column are added and
   output currents of the columns are added at the amplifier output.

6. The power amplifier of claim 1, wherein outputs of the active cells are coupled such that
   output currents of the active cells along a row are added, and
   output voltages of the rows are added at the amplifier output.

7. The power amplifier of claim 1, wherein
   input signals to control terminals of transistors in the active cells in the bottommost row of active cells are unbalanced, and
   input signals to the control terminals of the transistors in the active cells in upper rows of active cells are balanced.

8. The power amplifier of claim 7, wherein the power amplifier includes an active balun coupled to convert unbalanced signals into balanced input signals for the active cells in the upper rows.

9. The power amplifier of claim 8, wherein the balanced input signals of the active cells in the upper rows have a current and voltage so that output currents and voltages of the active cells in the upper rows match output currents and voltages of the active cells in the bottommost row.

10. The power amplifier of claim 1, wherein a difference between an output current of a first of the active cells and an output current of a second, immediately subsequent active cell in a same column is less than 10% of the output current of the first of the active cells.

11. The power amplifier of claim 1, wherein a difference between an output current of a bottommost of the active cells in a column and an output current of an uppermost active cell in the column is less than 10% of the output current of the bottommost of the active cells.

12. The power amplifier of claim 1, wherein:
   output power of each of the active cells is substantially equal; and
   an output power of the power amplifier is substantially equal to N×M the output power of each of the active cells.

13. The power amplifier of claim 1, wherein the at least one driver structure comprises bootstrap coupling circuitry to distribute a drive signal from a main terminal of one active cell to a control terminal of another active cell, wherein the bootstrap coupling circuitry comprises a voltage divider or a current divider to apply a part of an output voltage or current of a first active cell to a control terminal of a second active cell.

14. The power amplifier of claim 13, wherein the bootstrap coupling circuitry distributes the drive signal from the main terminal of the first active cell in a column to the control terminal of the second active cell in same column.

15. The power amplifier of any one of claim 1, wherein the at least one driver structure comprises an active differential driver amplifier or one or more passive baluns.

16. The power amplifier of claim 1, wherein at least some of the active cells comprise:
   a) an input impedance matching network,
   b) an output impedance matching network, or
   c) both an input impedance matching network and an output impedance matching network.

17. The power amplifier of claim 1, further comprising one or more distribution elements to distribute a signal from the amplifier input to control terminals of M bottommost transistors with a substantially same delay.

18. The power amplifier of claim 1, further comprising one or more distribution elements to distribute drive signals to control terminals of the active cells in each row, in each column, or in both each row and each column with substantially equal delays.

19. The power amplifier of claim 1, further comprising one or more collection elements to collect output signals from the active cells in each row, in each column, or in both each row and each column with the output signals are in phase.

20. The power amplifier of claim 1, further comprising:
   distribution elements to distribute drive signals to control terminals of the active cells in each row, in each column, or in both each row and each column with different delays; and
   one or more collection elements to collect output signals from the active cells in each row, in each column, or in both each row and each column with the output signals out of phase, wherein the collection elements include delays to counter the delays of the distribution elements so that power provided to the amplifier output from the active cells is in phase.

21. The power amplifier of claim 1, wherein a first plurality of active cells are part of a push-pull stage, and
   wherein the push-pull stage is a complementary or a quasi-complementary push-pull stage that comprises a second plurality of active cells.

22. The power amplifier of claim 21, further comprising:
   a coupling between the amplifier output and a main terminal of a first transistor in an active cell in one of the plurality of active cells; and
   a coupling between the amplifier output and a control terminal of the first transistor,
   the couplings together to bias the first transistor into conduction in anti-phase with a signal on the amplifier input and thereby enforce an anti-phase operation of the second plurality of active cells relative to the first plurality of active cells.

23. The power amplifier of claim 22, wherein the coupling between the amplifier output and the control terminal of the first transistor includes a conduction path between a main terminal of a transistor in a driver element and the amplifier output and a conduction path between a control terminal of the transistor in the driver element and the control terminal of the first transistor.

24. The power amplifier of claim 22, wherein the coupling between the amplifier output and the control terminal of the first transistor consists of passive components.

25. The power amplifier of claim 1, wherein each active cell includes a plurality of transistors that are paralleled.

26. The power amplifier of claim 1, wherein each active cell includes a matrix of transistors.

27. The power amplifier of claim 1, wherein each active cell includes a matrix of transistors, and power amplifier further comprises:
   first interconnections between the transistors forming the matrix of transistors of each active cell, and
   second interconnections between the active cells themselves,
   wherein the first interconnections are integrated in a semiconductor device on a level different from the second interconnections.

28. The power amplifier of claim 1, further comprising a bias tee that has a high frequency port coupled to a load on the amplifier output, a combined port coupled to stacks of the M×N matrix of active cells, and a low frequency port coupled to a DC source.

* * * * *

UNITED STATES PATENT AND TRADEMARK OFFICE
CERTIFICATE OF CORRECTION

PATENT NO. : 10,530,316 B2
APPLICATION NO. : 16/428918
DATED : January 7, 2020
INVENTOR(S) : Friedbert van Raay It is certified that error appears in the above-identified patent and that said Letters Patent is hereby corrected as shown below:

In the Claims

In Claim 15, Column 37, Line 26, after "amplifier" delete "of any one".

Signed and Sealed this
Seventeenth Day of March, 2020

Andrei Iancu
*Director of the United States Patent and Trademark Office*